United States Patent
Takamori et al.

(10) Patent No.: US 6,954,068 B1
(45) Date of Patent: Oct. 11, 2005

(54) MAGNETIC RESONANCE IMAGING APPARATUS

(75) Inventors: Hiromitsu Takamori, Otawara (JP); Kazuhiro Iinuma, Nasu-gun (JP); Yasuhiro Uosaki, Nasu-gun (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 662 days.

(21) Appl. No.: 09/764,214

(22) Filed: Jan. 19, 2001

(30) Foreign Application Priority Data

| Jan. 21, 2000 | (JP) | 2000-013235 |
| Jan. 24, 2000 | (JP) | 2000-014826 |
| Mar. 17, 2000 | (JP) | 2000-076019 |
| Sep. 13, 2000 | (JP) | 2000-278699 |
| Sep. 13, 2000 | (JP) | 2000-278838 |
| Sep. 20, 2000 | (JP) | 2000-286023 |
| Dec. 28, 2000 | (JP) | 2000-400361 |

(51) Int. Cl.⁷ .............................................. G01V 3/00
(52) U.S. Cl. ..................................... 324/318; 324/322
(58) Field of Search .............................. 324/318, 322, 324/300, 306, 307, 309, 312, 314

(56) References Cited

U.S. PATENT DOCUMENTS

| 4,652,824 A | | 3/1987 | Oppelt |
| 5,053,711 A | | 10/1991 | Hayes et al. |
| 5,278,502 A | * | 1/1994 | Laskaris et al. ............ 324/318 |
| 5,361,763 A | | 11/1994 | Kao et al. |
| 5,404,882 A | | 4/1995 | Santyr |
| 5,489,848 A | | 2/1996 | Furukawa |
| 5,764,059 A | | 6/1998 | Mansfield et al. |
| 5,793,210 A | * | 8/1998 | Pla et al. ..................... 324/318 |
| 6,022,195 A | | 2/2000 | Gaudet et al. |
| 6,043,653 A | * | 3/2000 | Takamori et al. ........... 324/309 |
| 6,157,276 A | | 12/2000 | Hedeen et al. |
| 6,208,141 B1 | * | 3/2001 | Amor, Sr. et al. .......... 324/318 |
| 6,353,319 B1 | | 3/2002 | Dietz et al. |
| 6,406,427 B1 | | 6/2002 | Williams et al. |
| 6,437,568 B1 | | 8/2002 | Edelstein et al. |
| 6,441,614 B1 | | 8/2002 | Edelstein et al. |

FOREIGN PATENT DOCUMENTS

| JP | 59-174746 | 10/1984 |
| JP | 60-177249 | 9/1985 |
| JP | 61-197321 | 12/1986 |
| JP | 62-334 | 1/1987 |
| JP | 62-79889 | 4/1987 |
| JP | 62-194842 | 8/1987 |
| JP | 63-246146 | 10/1988 |
| JP | 1-166508 | 6/1989 |
| JP | 2-198539 | 8/1990 |
| JP | 5-269104 | 10/1993 |
| JP | 7-299048 | 11/1995 |
| JP | 6-189932 | 7/1996 |
| JP | 2642348 | 5/1997 |
| JP | 9-149893 | 6/1997 |
| JP | 10-118043 | 5/1998 |
| JP | 10-179547 | 7/1998 |
| SU | 968738 | 10/1982 |

OTHER PUBLICATIONS

Katsunuma et al, "Silent MRI System by Interrupting the Vibrational Transmission Through the Air and Solid Structures", ISMRM, 1372, 2000.

* cited by examiner

Primary Examiner—Louis Arana
(74) Attorney, Agent, or Firm—Nixon & Vanderhye P.C.

(57) ABSTRACT

The gantry of a magnetic resonance imaging apparatus includes a static magnetic field magnet, a gradient coil, a high-frequency coil, and a sealed vessel housing the gradient coil. The sealed vessel is made of a nonconductive material. Even if a gradient magnetic field is switched at high speed, no eddy current flows in the sealed vessel. Therefore, the sealed vessel does not vibrate.

12 Claims, 31 Drawing Sheets

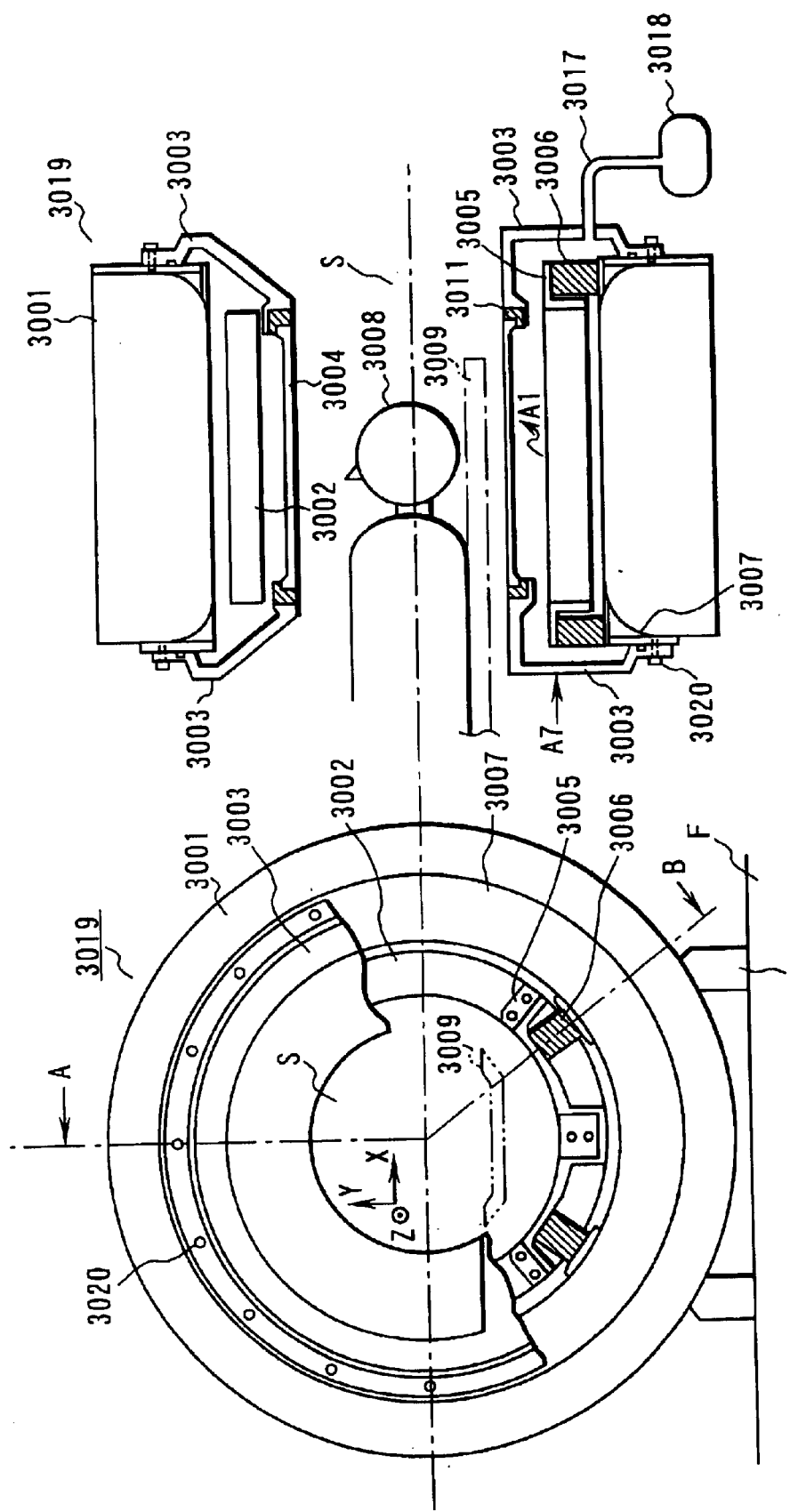

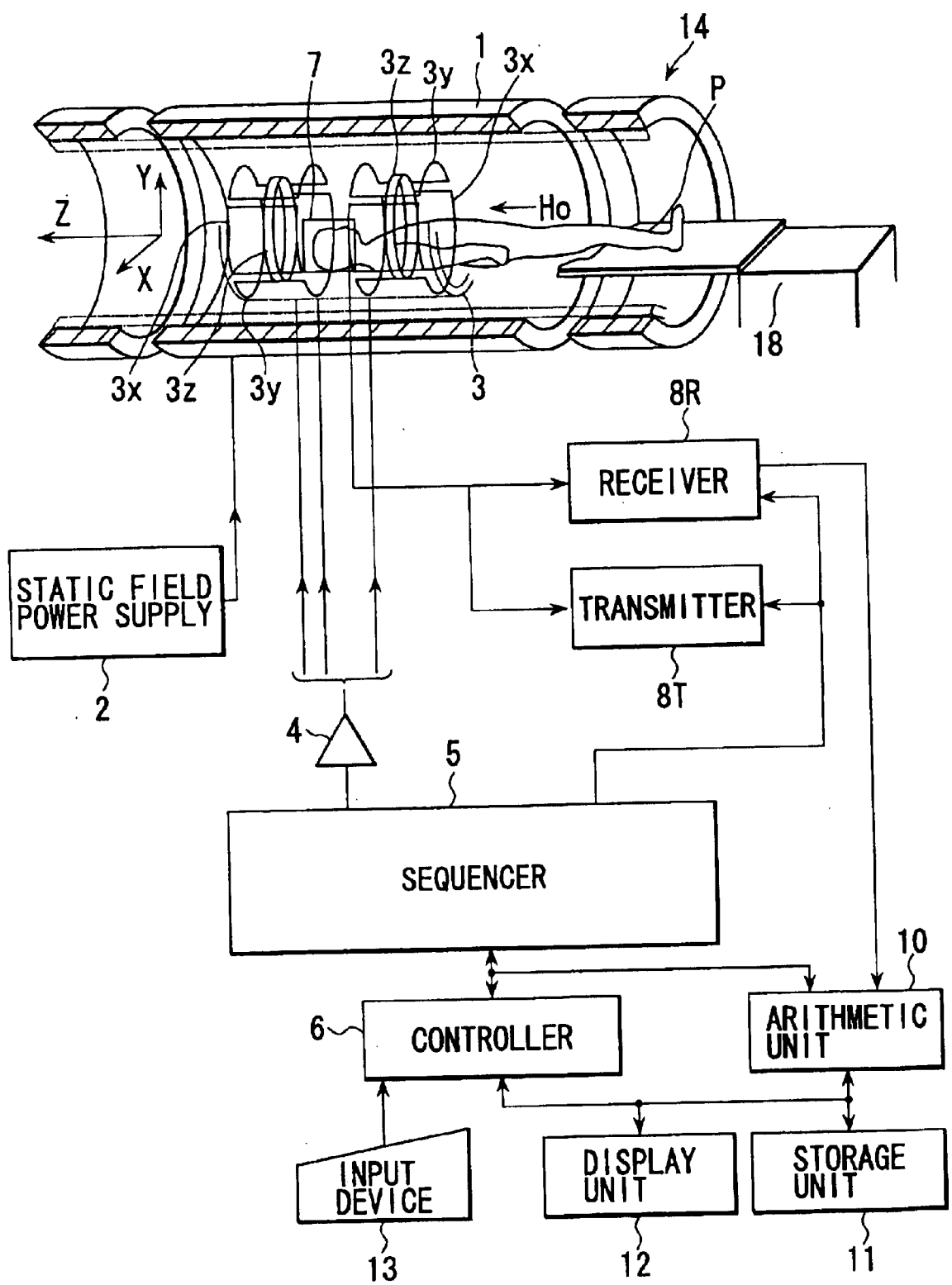
F I G. 37

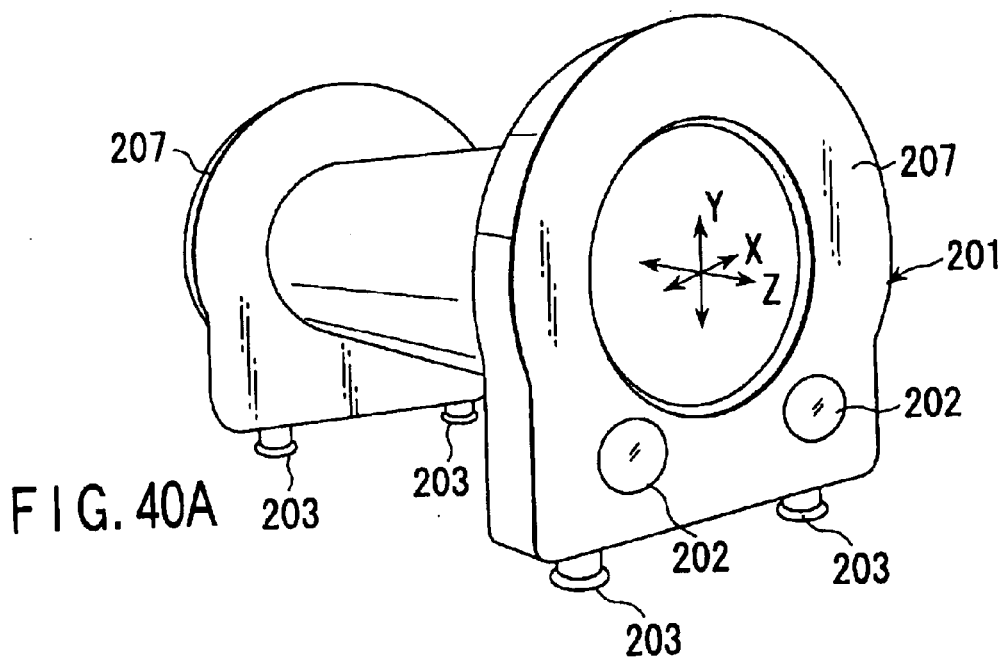
FIG. 40A
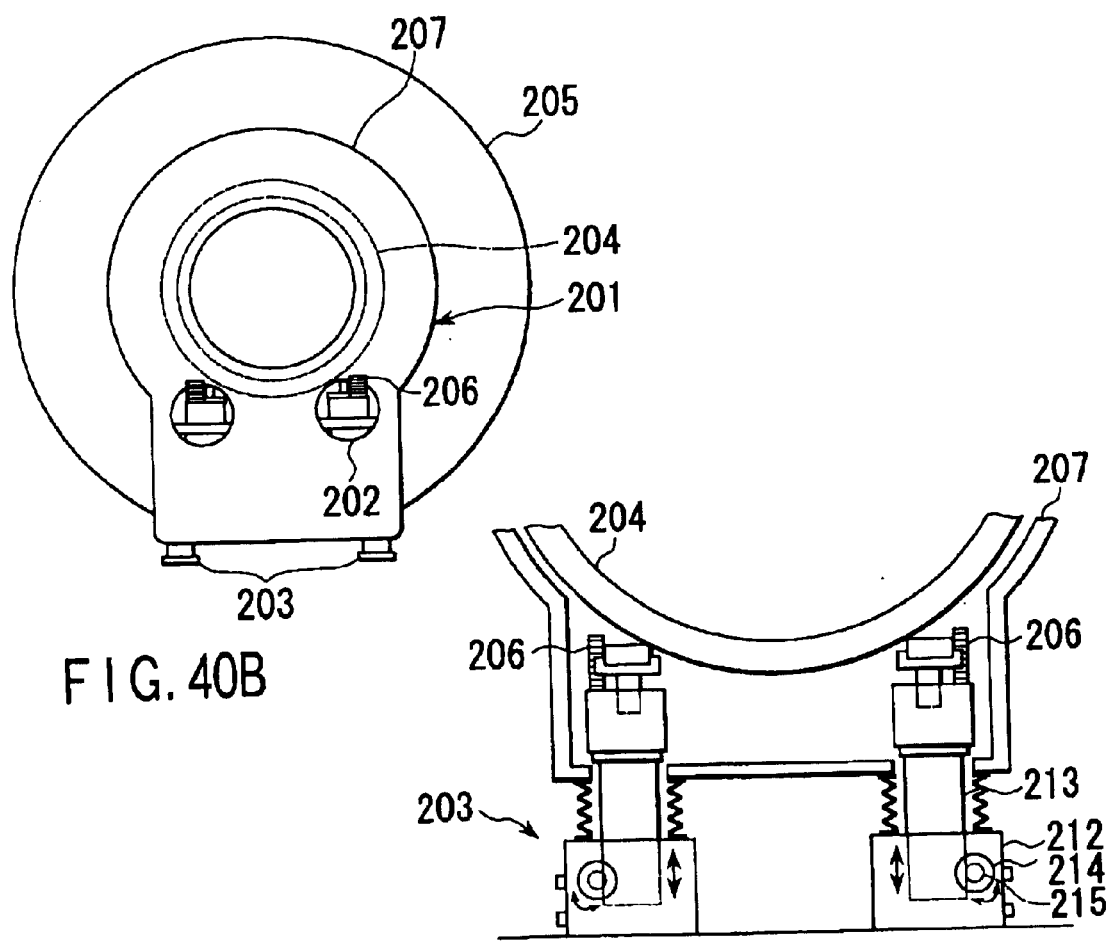
FIG. 40B
FIG. 40C

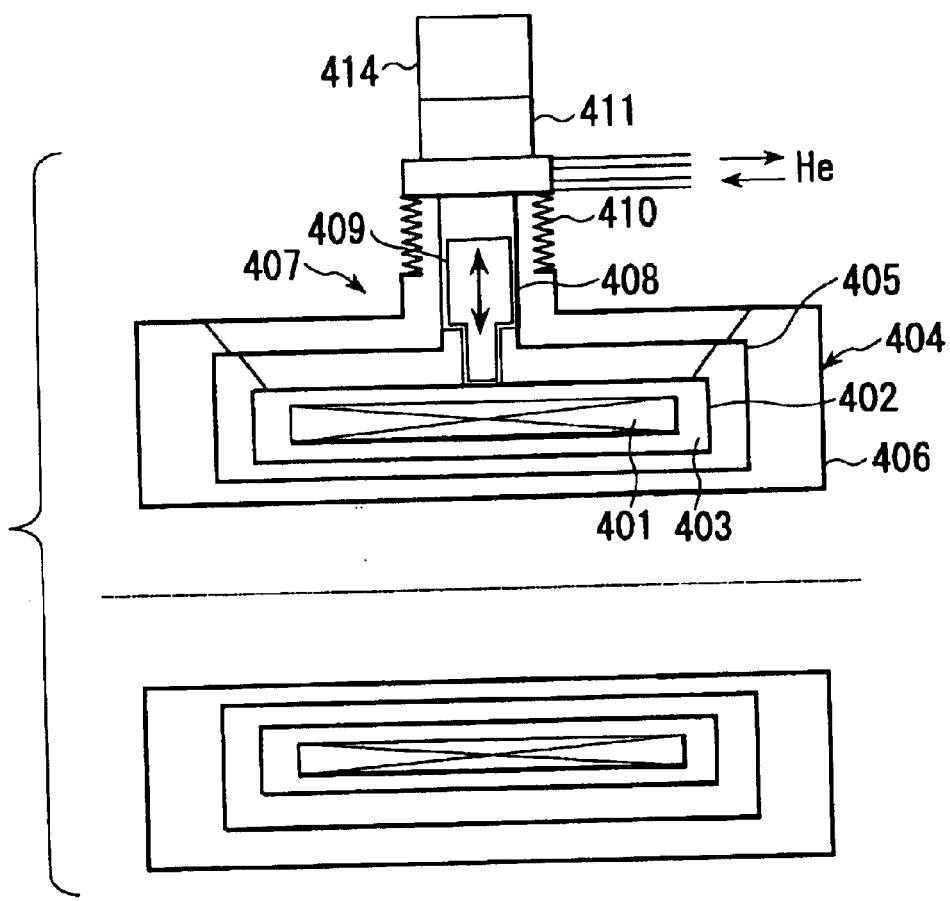
FIG. 43
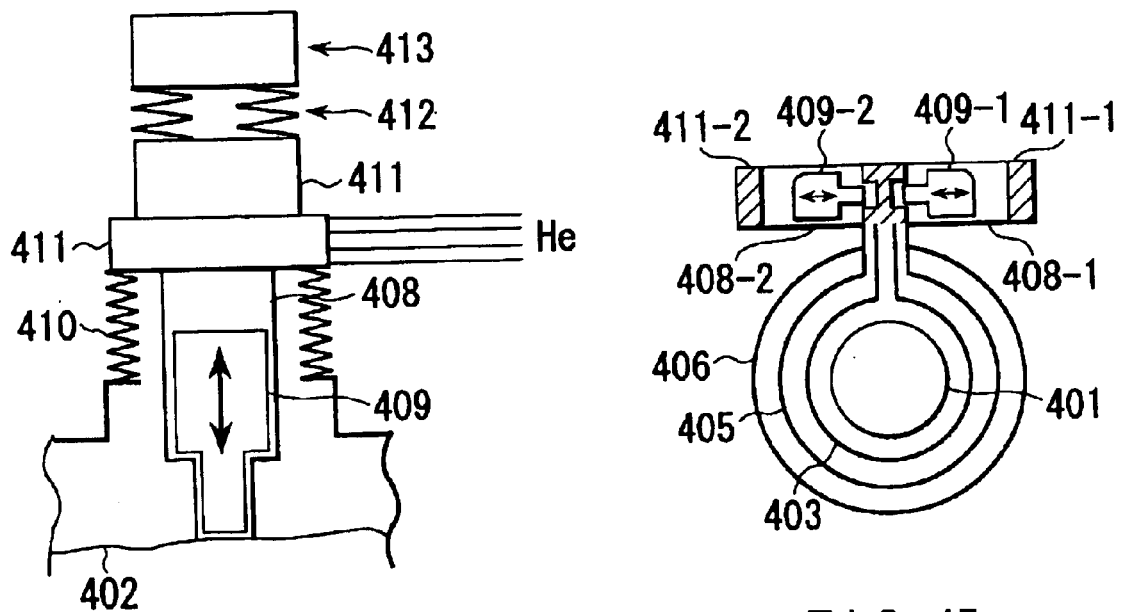
FIG. 44
FIG. 45

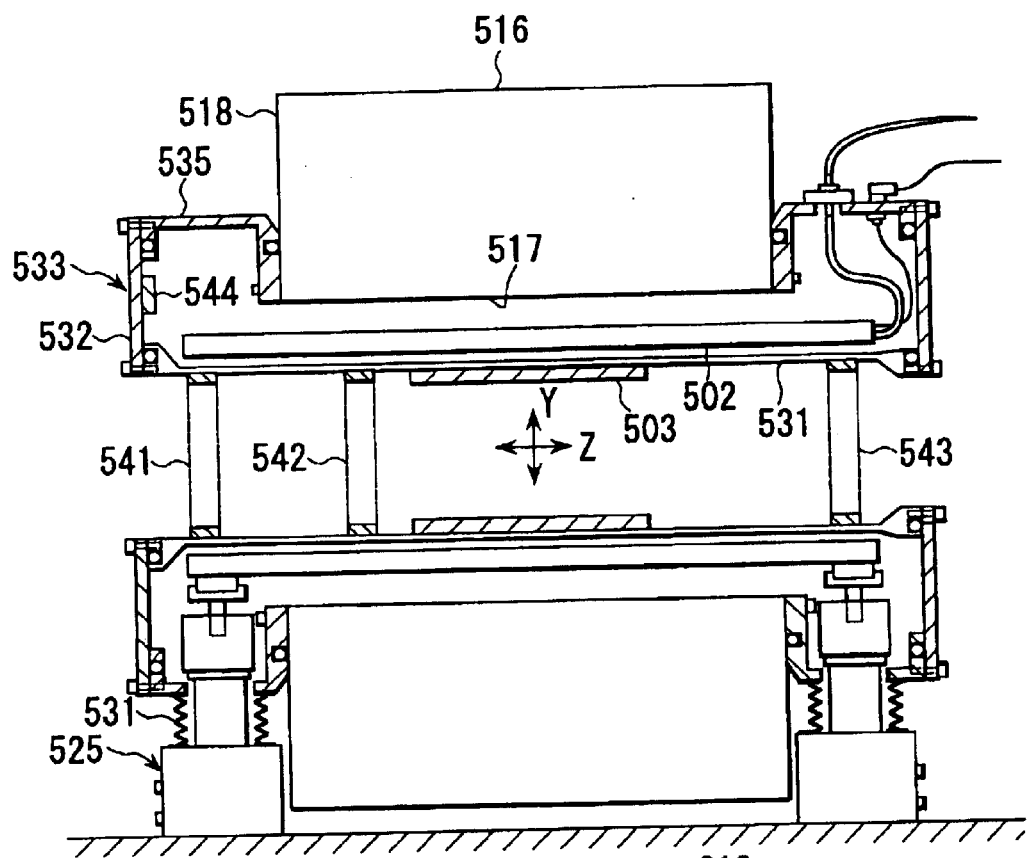
FIG. 46
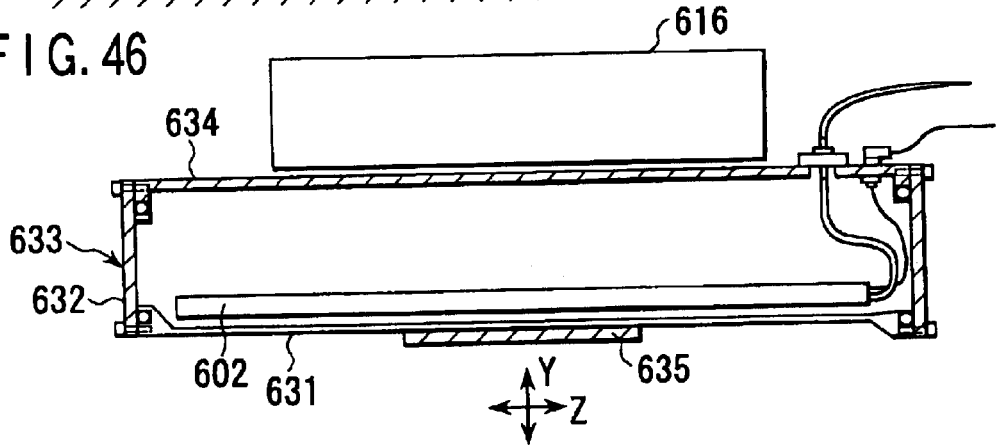
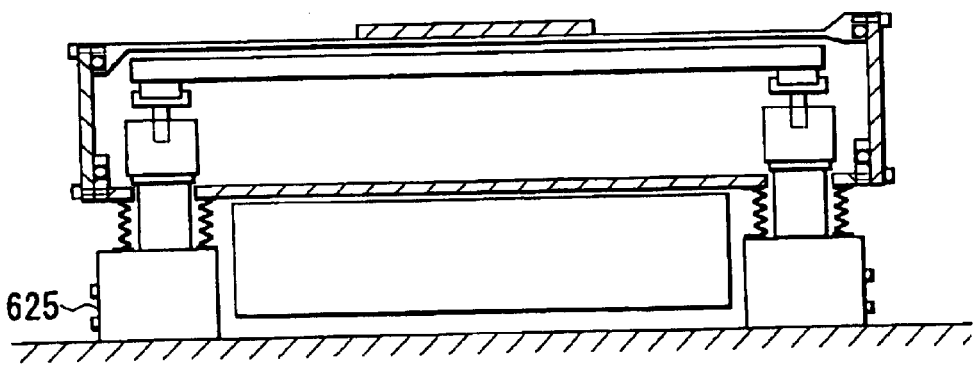
FIG. 47

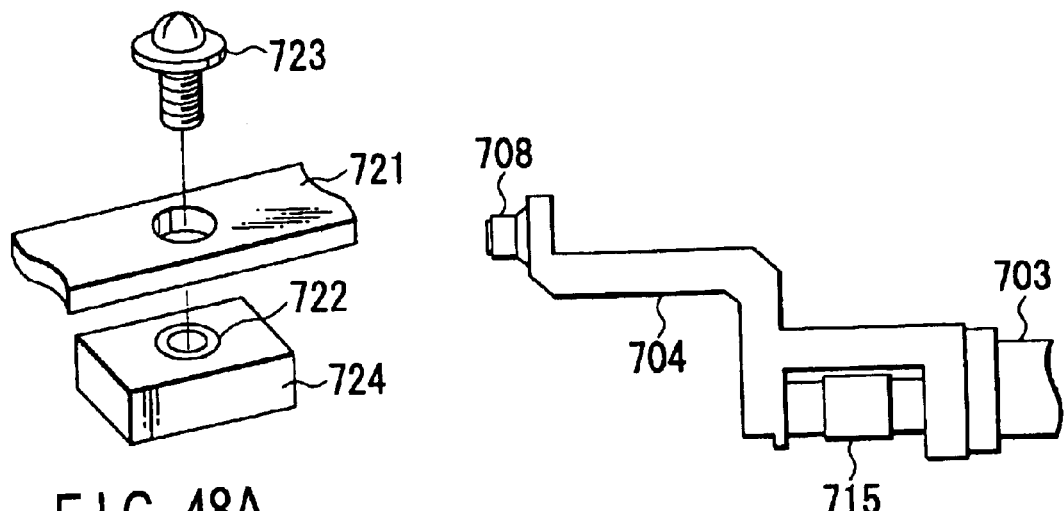
FIG. 48A
FIG. 49
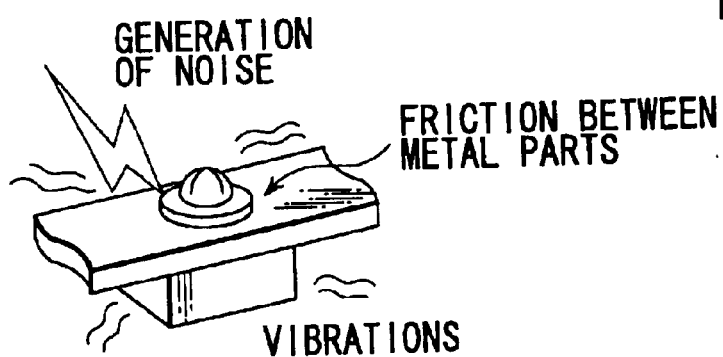
FIG. 48B
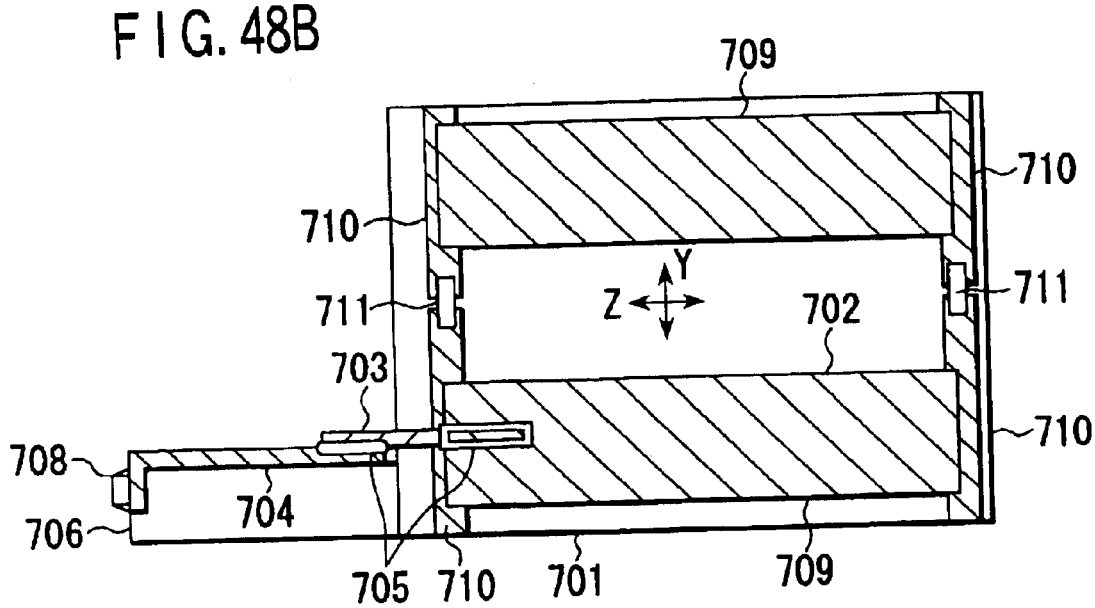
FIG. 50

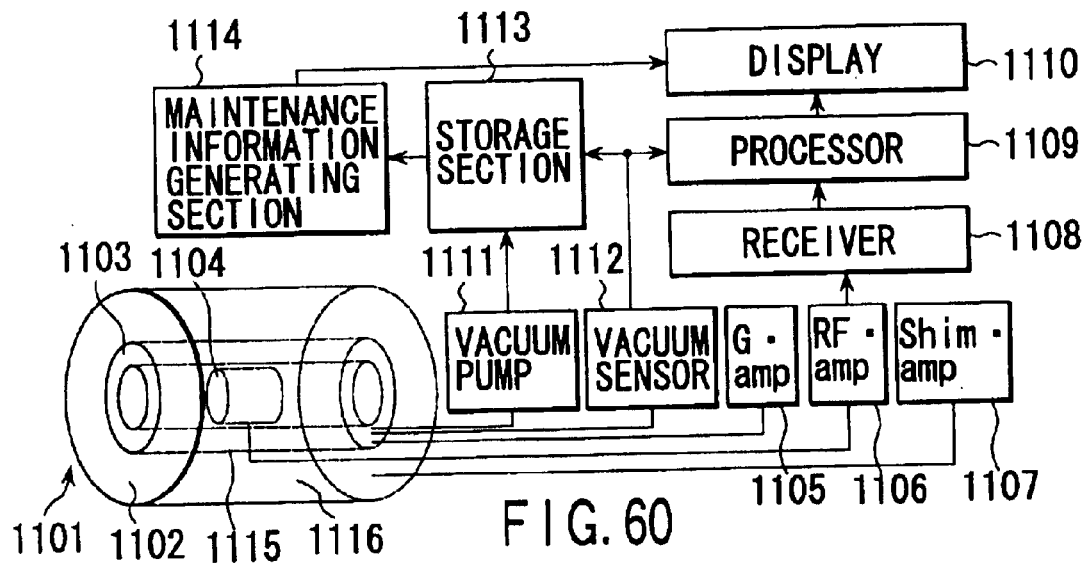
FIG. 60
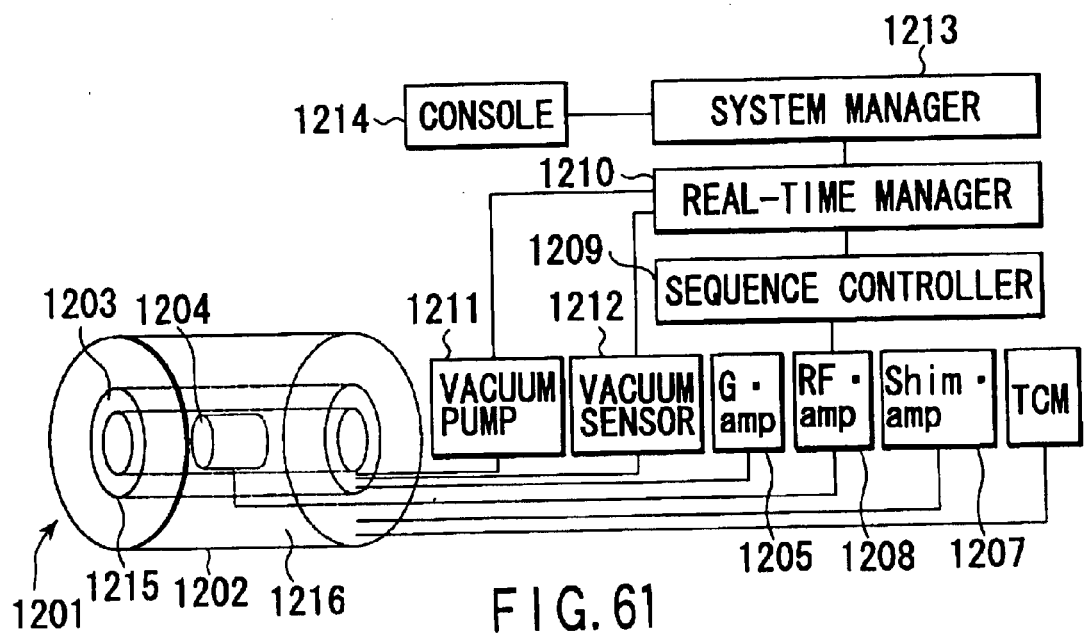
FIG. 61
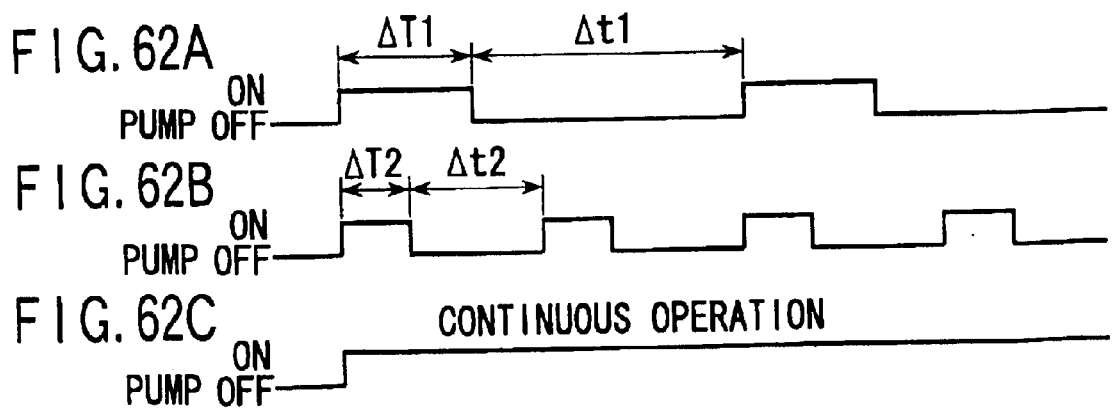
FIG. 62A
FIG. 62B
FIG. 62C

MAGNETIC RESONANCE IMAGING APPARATUS

BACKGROUND OF THE INVENTION

The present invention relates to a magnetic resonance imaging apparatus for generating a magnetic resonance signal (MR signal) by applying a gradient magnetic field pulse and high-frequency magnetic field pulse to an object to be examined which is placed in a homogeneous static magnetic field, and generating a magnetic resonance image (MR image) on the basis of this MR signal.

As is known well, the magnetic resonance phenomenon is a phenomenon in which when nuclei having unique magnetic moments are placed in a homogeneous static magnetic field, they resonantly absorb the energy of high-frequency magnetic fields that rotate at specific frequencies. A magnetic resonance diagnosis apparatus is designed to visualize the chemical, structural, microscopic information of a substance in a living body by using this magnetic resonance phenomenon.

Various types of visualizing techniques are available. The two-dimensional Fourier transform method (2DFT) is in the mainstream. In this 2DFT, a gradient magnetic field is used to give a magnetic resonance signal spatial positional information with a phase or frequency. This gradient magnetic field is superimposed on a static magnetic field having a very high strength of several kilogauss to 10 kilogauss (1 tesla). For this reason, the gradient coil spool considerably deforms at the leading and trailing edges of the gradient magnetic field, accompanying large noise. In a current fast imaging method represented by the echo planar method, a gradient magnetic field is alternated at high speed, the noise sometimes reaches 100 dB(A). This makes it obligatory for an object to wear earplugs or headphones.

To reduce such large noise, a proposal for suppressing the leakage of noise to the outside by housing a gradient coil spool in a sealed vessel has been disclosed in, for example, in Jpn. Pat. Appln. KOKAI Publication No. 63-246146, Jpn. Pat. Appln. KOKAI Publication No. 6-189932, U.S. Pat. No. 5,793,210, and Jpn. Pat. Appln. KOKAI Publication No. 10-118043 (Jpn. Pat. Appln. No. 8-274609). This sealed vessel is firmly formed by nonmagnetic aluminum or stainless steel to ensure sufficient pressure resistance.

Since these materials are conductive, they cause magnetic coupling with respect to leakage magnetic fields from the gradient coil. Obviously, if a so-called active shield gradient coil having a main coil surrounded by a shield coil is used, a leakage magnetic field can be sufficiently suppressed. However, it is inevitable that magnetic fields leak from the two ends of the main coil at which the shield coil ends. Owing to the above magnetic coupling, an eddy current flows in the sealed vessel. The sealed vessel itself then deforms because of this eddy current, which in turn causes noise.

According to these conventional sound insulating methods, although the air-born propagation of noise can be prevented by a vacuum state, the solid-born propagation of noise due to contact for fixing operation cannot be prevented. This solid-born propagation generates a large sound. That is, these methods have not provided satisfactory measures against noise. Although a method of suppressing solid-born propagation by supporting a gradient coil that produces large vibrations at a distance from the floor singly is available, if the position of the lower portion of a column supporting the gradient coil on the floor slightly shifts, the position of the gradient coil mounted on the upper portion of the column greatly shifts because the gradient coil is considerably spaced apart from the floor. This makes it difficult to adjust the position of the gradient coil, and a long period of time is required for installation/adjustment, resulting in a high cost. In addition, the means for supporting the gradient coil and the means for forming a sealed space around the gradient coil have complicated arrangements and require large numbers of parts. As a consequence, the overall apparatus has a complicated arrangement and the cost increases.

A technique is also known, which is designed to suppress the solid-born propagation of vibrations of the gradient coil itself by supporting the gradient coil through a vibration absorbing unit (damper).

At present, however, the noise reducing effects in these conventional magnetic resonance imaging apparatuses are concerned with only measures against noise originating from a gradient coil, and almost no measures are taken against noise caused by other portions, e.g., the vibrations of a cable connecting the gradient coil to an external power supply.

In a space (to be referred to as a bore) in which an object to be examined (patient) is inserted, the sound generated by the RF coil instead of the gradient coil is perceived as noise by the object. This sound makes the object feel unpleasant like noise from the gradient coil. According to the structure of a conventional RF coil, however, a conductive pattern is bonded to a spool and surrounded by a cover made of a hard resin or the like. No measures against the sound generated by the RF coil itself have been taken.

As described above, various silencing measures have recently taken. However, secondary problems have arisen owing to these silencing measures. As is known well, as one of RF coils, a whole body RF coil (to be referred to as a WB coil hereinafter) used for whole body imaging is available. This WB coil is generally placed closer to a patient than the remaining coils in the gantry. The WB coil includes a so-called transmitting/receiving coil for generating a spin excitation RF magnetic field and receiving an MR signal generated in the object and a so-called transmitting coil for only generating a spin excitation RF magnetic field, with reception being performed by another surface coil. In most magnetic resonance imaging apparatuses, a gradient coil for generating a gradient magnetic field is placed on the outer circumferential side of the WB coil. This gradient coil is used to apply, to an object to be examined, a magnetic field whose strength linearly changes depending on the position. For this purpose, the conductor of the gradient coil has a larger number of turns than that of the WB coil described above. In addition, the gradient coil must be switched with high efficiency in a frequency band much lower than the resonance frequency used in the MRI. That is, an energy loss that cannot be neglected tends to occur in the resonance frequency band.

For the WB coil (resonating at the resonance frequency in terms of a circuit), the electric loss caused by that gradient coil becomes a load that cannot be neglected, resulting in a deterioration in the generation efficiency of an excitation RF magnetic field or reception sensitivity.

Under the circumstances, to suppress the magnetic interference between the WB coil and the gradient coil, a technique of using a shield (a shield member such as copper foil) exhibiting a sufficiently low loss with respect to the resonance frequency is used (see U.S. Pat. No. 5,367,261). This shield is generally grounded.

On the other hand, it is known that when a shield is placed in this manner, the reception sensitivity of the WB coil is degraded by the shield (see, for example, "A Technique of Double Resonant Operation of F and H Quadrature Birdcage Coils" Magnetic Resonance in Medicine 19, 180–185 (1991)). However, the loss caused by the mutual interference between the WB coil and the gradient coil without any shield is higher than the loss caused by the WB coil with the shield. For this reason, in most MRI apparatuses, a shield is inevitably placed in the above manner. As is obvious from the above reference, as the distance between the shield and the WB coil increases, a deterioration in the efficiency of the WB coil can be suppressed.

As described above, a shield itself is used as the second best means. However, this shield can be easily fixed to a potential substantially different from that of the WB coil. So-called "detune" is known, which is a scheme of providing an electrical switch between a WB coil and a shield by using the above potential setting, and shifting the resonance frequency of the WB coil by ON/OFF-controlling the switch (see, for example, U.S. Pat. No. 5,053,711). By fixing the shield to, for example, zero potential, the shield can also be used as a zero potential surface for the WB coil and a circuit up to the WB coil.

The gradient coil mechanically vibrates due to an electromagnetic force acting when the coil is driven, and hence becomes a sound (noise) source. An apparatus designed to reduce this sound is also known, which has a structure in which a gradient coil is sealed in a cylindrical vessel whose internal pressure is controlled to a level substantially lower than the atmospheric pressure to suppress air-born sound propagation (see, for example, U.S. Pat. No. 5,793,210).

No suitable, specific proposal has not been made with regard to a case wherein the above shield is placed in such a silent type MRI apparatus.

If the conventional shield placement method is directly applied to a silent type MRI apparatus, the following arrangement can be expected. First of all, a WB coil is placed outside the inner circumferential wall member of the vessel, i.e., on the inner circumferential surface side of the vessel to place the coil as close to an object as possible so as to increase the S/N ratio. A shield is fixed to a given potential with respect to the WB coil, and is also used as zero potential for a switch and transmission system. The shield must therefore be placed outside the inner circumferential wall member of the vessel, i.e., on the inner circumferential side of the vessel. This is because, when the shield is to be used for these purposes, electric connection to the shield is preferably made near the WB coil. As a consequence, the WB coil, shield, vessel (in which the gradient coil is sealed), and static magnetic field magnet are arranged in the order named when viewed from the object in the radial direction of the magnet.

If, however, the shield is placed outside the inner circumferential wall member of the vessel, i.e., on the inner circumferential side of the vessel, in this manner, the distance between the WB coil and the shield in the radial direction of the magnet becomes smaller than that in the conventional structure without any vessel by the thickness of the vessel (the total thickness of the inner circumferential wall member and outer circumferential wall member) under the condition that the size of the overall gantry in the radial direction remains the same. As described above, this may increase the loss caused by the WB coil and cause a serious deterioration in function.

Furthermore, if the gradient coil is housed in the vacuum vessel in the above manner, since the discharge starting voltage in the vacuum vessel decreases, electric discharge tends to occur. At present, however, no measures have been taken against such electric discharge.

BRIEF SUMMARY OF THE INVENTION

It is an object of the present invention to improve the silencing ability of the gantry of a magnetic resonance imaging apparatus.

It is another object of the present invention to properly place a shield for preventing electric and magnetic interference between a WB coil and a gradient coil in a silent type MRI apparatus.

It is still another object of the present invention to improve the insulating performance of electric connecting portions, e.g., the connection portion between a cable and a gradient coil in a sealed vessel.

The gantry of a magnetic resonance imaging apparatus includes a static magnetic field magnet, a gradient coil, a high-frequency coil, and a sealed vessel housing the gradient coil. The sealed vessel is made of a nonconductive material. Even if a gradient magnetic field is switched at high speed, no eddy current flows in the sealed vessel. Therefore, the sealed vessel does not vibrate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 7A is a cross-sectional view of a gantry in Embodiment 3;

FIG. 7B is a longitudinal sectional view of the gantry in Embodiment 3;

FIG. 37 is a view showing the basic arrangement of a magnetic resonance imaging apparatus according to the seventh embodiment;

FIG. 40A is a perspective view of a sealed vessel according to the seventh embodiment;

FIG. 40B is a front view of a sealed vessel according to the eighth embodiment;

FIG. 40C is a partial sectional view of the closed vessel according to the eighth embodiment;

FIG. 43 is a longitudinal sectional view of the cryostat of a static field magnet according to the 10th embodiment;

FIG. 44 is a view showing the internal structure of a dynamic vibration absorber in FIG. 43;

FIG. 45 is a view showing the internal structure of a cold head portion in another example of the 11th embodiment;

FIG. 46 is a longitudinal sectional view of a gantry according to the 11th embodiment;

FIG. 47 is a longitudinal sectional view of a gradient field coil unit according to the 12th embodiment;

FIG. 48A is a perspective view showing the principle of the occurrence of noise radio waves in the 13th embodiment;

FIG. 48B is a perspective view showing the principle of the occurrence of noise radio waves in the 13th embodiment;

FIG. 49 is a view showing a tuner copper plate and its connection parts in the 13th embodiment;

FIG. 50 is a view showing an example of how metal parts are connected to each other in the 13th embodiment;

FIG. 60 is a view showing the arrangement of the main part of a magnetic resonance imaging apparatus according to the 17th embodiment;

FIG. 61 is a view showing the arrangement of the main part of the magnetic resonance imaging apparatus according to the 18th embodiment;

FIG. 62A is a timing chart showing the first driving pattern of a vacuum pump in the 18th embodiment;

FIG. 62B is a timing chart showing the second driving pattern of the vacuum pump in the 18th embodiment; and FIG. 62C is a timing chart showing the third driving pattern of the vacuum pump in the 18th embodiment.

DETAILED DESCRIPTION OF THE INVENTION (Embodiment 1)

Figure 1:
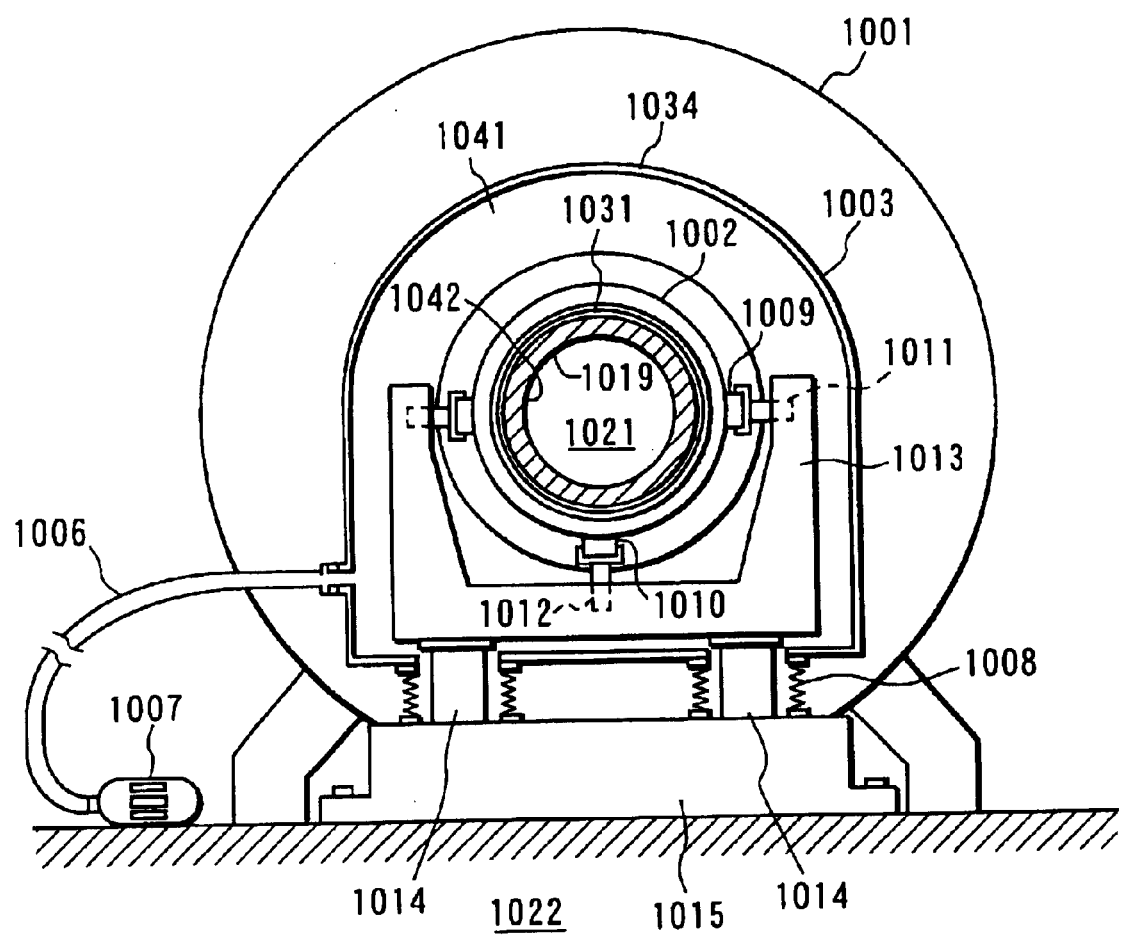
FIG. 1 is a cross-sectional view of a gantry in Embodiment 1 of the present invention.
Figure 2:
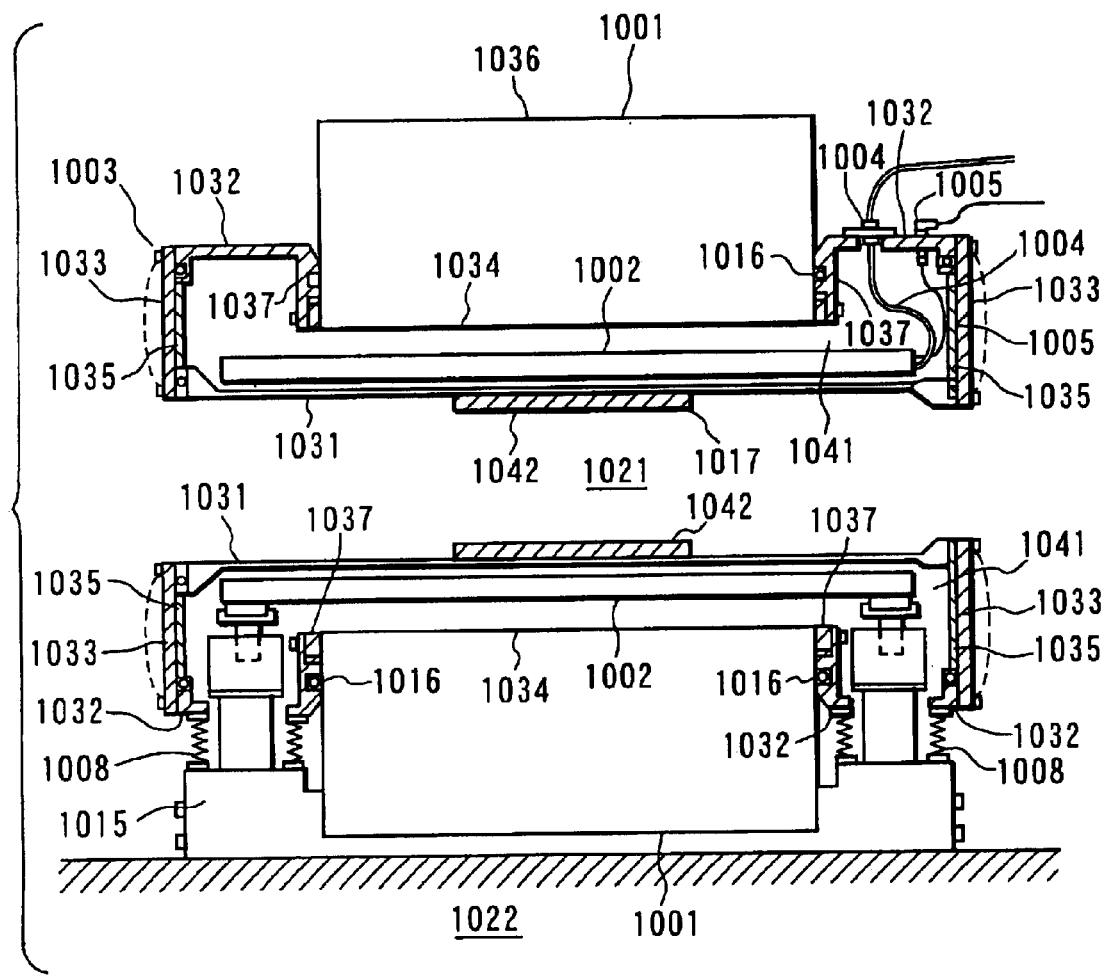
FIG. 2 is a longitudinal sectional view of the gantry in Embodiment 1.

FIGS. 1 and 2 are respectively a cross-sectional view and longitudinal sectional view of the gantry of a magnetic resonance imaging apparatus according to Embodiment 1. The gantry includes a static magnetic field magnetic unit 1001, gradient coil unit 1041, and RF coil unit 1042. An imaging area 1022 having a substantially cylindrical shape is formed in substantially the central portion of the gantry. The gantry is fixed on a floor 1021 through a base 1015.

The static magnetic field magnetic unit 1001 generates a static magnetic field in the imaging area 1022, and is comprised of, if it is of a superconductive type, a superconductive coil, a liquid helium vessel housing the superconductive coil, and a sealed vessel 1036 housing the liquid helium vessel. The RF coil unit 1042 has an RF coil spool 1017 on which an RF coil pattern is formed. The RF coil spool 1017 is held by a cylindrical fiber-reinforced plastic liner 1031.

The gradient coil unit 1041 has a resin coil spool 1002. A main coil and a shield coil that shields the outside of the main coil are formed on the coil spool 1002. The gradient coil spool 1002 is housed in a sealed vessel 1003 so as not to propagate noise caused by the vibrations of the gradient coil spool 1002. The sealed vessel 1003 is forcibly evacuated by a vacuum pump 1007 coupled to the sealed vessel 1003 via a vacuum pipe 1006 to maintain a vacuum in the sealed vessel 1003. Note that the vacuum in the sealed vessel 1003 need not be a perfect vacuum; the degree of vacuum at which air-born sound insulation can be provided, e.g., several hundred pascals (several Torr), is sufficient. Letting P1 be the degree of vacuum of the sealed vessel 1003, a sound insulating effect S can be given by $$S = 20\log_{10}(P1/760) \text{ [dB]}$$

If the degree P1 of vacuum is 931 pascals (about 7 Torr), a sound insulating effect of about 40 dB can be obtained.

This gradient coil is connected to an external gradient magnetic field power supply via a cable 1004. A cooling water path formed in the gradient coil spool 1002 is connected to an external cooling unit via a hose 1005. The gradient coil spool 1002 is supported on the base 1015 via antivibration rubber members 1009 and 1010, bolts 1011 and 1012, arm 1013, and shaft 1014 to minimize the mechanical propagation of vibrations of the spool. In addition, the shaft 1014 is wound by a bellows 1008.

The inner wall of the sealed vessel 1003 of the gradient coil unit 1041 also serves as the liner 1031. A portion 1034 of the outer wall of the sealed vessel 1003 also serves as the inner wall of a cryostat 1036 of the static magnetic field magnetic unit 1001. All these shared portions are made of a nonmagnetic, nonconductive material such as a glass-fiber-reinforced plastic material by a filament winding method. The inner wall portion 1034 of the cryostat 1036 is joined to an outer wall portion 1032 of the sealed vessel 1003. This joint portion is sealed by an O-ring 1016. The gap between the outer wall portion 1032 and the inner wall 1031 is closed with a cover 1033. Likewise, these outer wall portion 1032 and cover 1033 are made of a nonmagnetic, nonconductive material such as a glass-fiber-reinforced plastic material by a filament winding method.

The cover 1033 of this sealed vessel 1003 is formed to protrude outward in the form of a bowl so as to improve the resistance to the atmospheric pressure, as emphasized by the dashed lines in FIG. 2. The inside of the cover 1033 is also reinforced by a plurality of ribs 1035 in the form of a grating.

As described above, since the sealed vessel 1003 is made of a nonconductive material, even if a leakage magnetic field is produced from the gradient coil, no eddy current flows in the sealed vessel 1003. This makes it possible to eliminate the noise caused by the deformation of the sealed vessel 1003 due to the eddy current.

(Embodiment 2)

Figure 3:
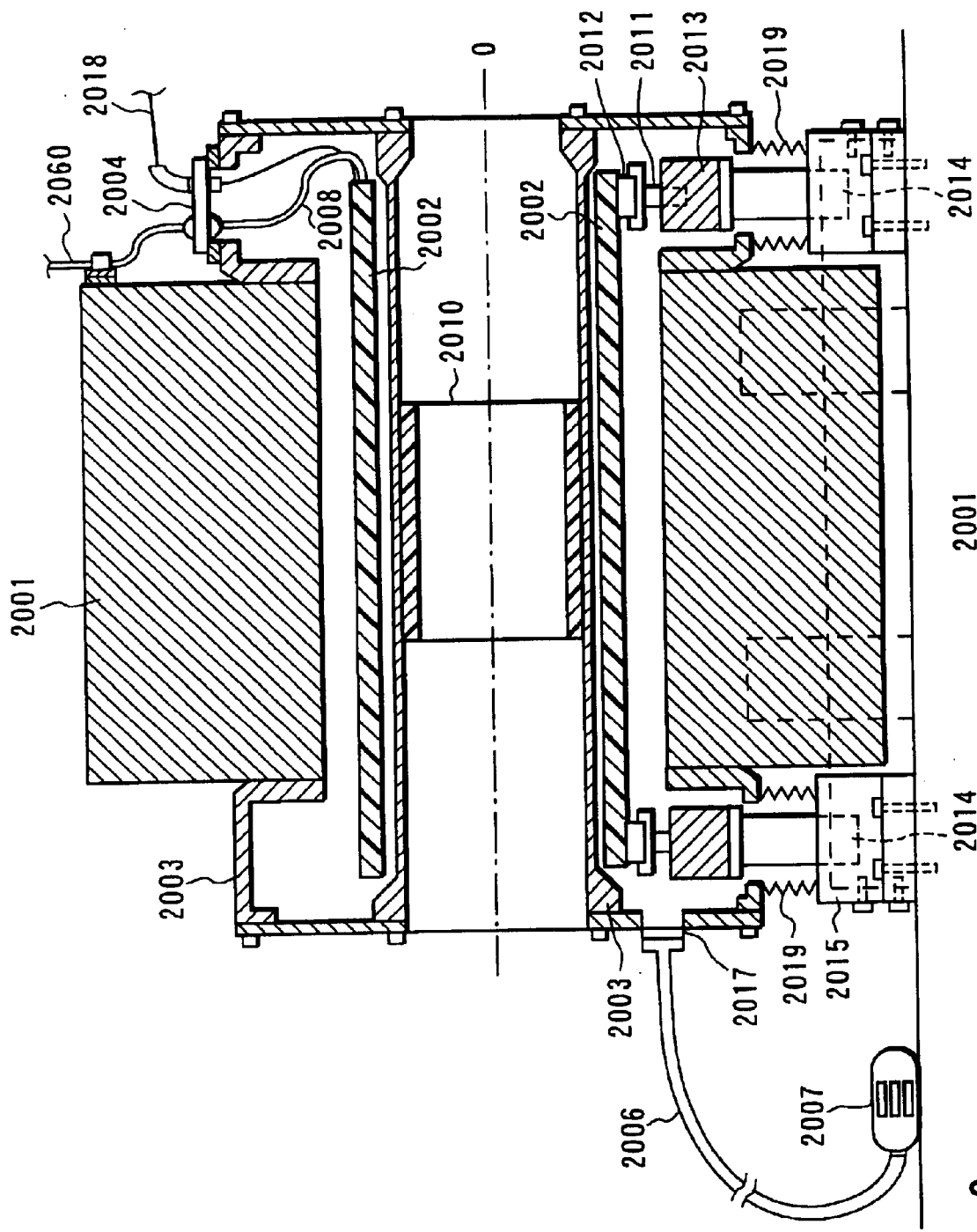
FIG. 3 is a longitudinal sectional view of the gantry in Embodiment 2.

FIG. 3 is a longitudinal sectional view of the gantry of a magnetic resonance imaging apparatus according to Embodiment 2. A superconductive coil is housed in a cryostat 2001. This superconductive coil serves to give an imaging area a homogeneous static magnetic field. The static magnetic field strength required for general MR imaging operation is about 0.1 to 1 tesla. A static magnetic field is required to have a spatial homogeneity of several 10 ppm or less, and the imaging area has a spherical shape with a diameter of about 50 cm.

A gradient coil 2002 is placed in a sealed vessel 1003. The gradient coil 2002 serves to give a main magnetic field a linear gradient to determine an arbitrary imaging slice or add positional information to an RF signal from an object to be examined. In general, the gradient coil 2002 is constituted by three independent coil sets Gx, Gy, and Gz for generating gradient magnetic fields in orthogonal x-, y-, and z-axes. For example, the gradient coil 2002 in this embodiment is an ASGC (Actively Shield Gradient Coil). The actively shield gradient coil is comprised of a main coil for generating gradient magnetic field and an active shield coil which is placed outside the main coil to generate a magnetic field in the opposite direction to the gradient magnetic field generated by the main coil so as to prevent it from leaking out of the gradient coil.

An outer cable 2060 placed outside a sealed vessel 2003 and an inner cable 2008 placed inside the sealed vessel 2003 connect the gradient coil 2002 housed in the sealed vessel 2003 to an external power supply. The outer cable 2060 is coupled to the inner cable 2008 through a coupling plate 2004 attached to the sealed vessel 2003.

The gradient coil 2002 is supported by four columns 2013. An antivibration member 2012 and position adjustment bolt 2011 are placed between the gradient coil 2002 and each of the four columns 2013. The antivibration member 2012 damps the solid vibrations of the gradient coil 2002. The solid vibrations of the gradient coil 2002 therefore hardly propagate to the support arms 1013. The antivibration member 2012 is made of rubber. However, the antivibration member 2012 may be formed by an air damper or oil damper. The position adjustment bolt 2011 is used to finely adjust the height of the gradient coil 2002. The support arms 2013 are mounted on shafts 2014 extending upright on the base 1015. The circumferential portion of each shaft 1014 is sealed by a metal bellows 2019.

A hold is formed in a side surface of the sealed vessel 2003. A pipe 1006 is connected to this hole. This connecting portion is sealed by an O-ring 2017. The pipe 1006 is connected to a vacuum pump 2007. The vacuum pump 2007 evacuates the sealed vessel 2003. This sets a vacuum state in the sealed vessel 2003. The degree of vacuum can be a degree at which the air-born propagation of vibration sounds generated by the gradient coil 2002 can be prevented. Specifically, the degree of vacuum is about several hundred pascals. A sound insulating effect is expressed as follows:

$$S = 20\log_{10}(P1/1.01325 \times 10^5) \text{ (decibel:dB)}$$

where P1 is the degree of vacuum in the sealed vessel 3.

If, for example, the degree of vacuum in the sealed vessel 2003 is 1,000 pascals, a sound insulating effect of about 40 dB can be obtained.

When the gradient coil 2002 is driven, heat is generated. To cool the gradient coil 2002, a bellows 2108 for circulating cooling water between the sealed vessel 2003 and an external heat exchange extends through the sealed vessel 2003.

An RF coil 2010 is disposed in the gradient coil 2002 having a cylindrical shape. This RF coil 2010 is a whole body RF coil, which transmits a high-frequency (RF) magnetic field to the object and receives a magnetic resonance (MR) signal from the object.

As described above, in the magnetic resonance imaging apparatus according to this embodiment, the gradient coil 2002 is housed in the sealed vessel 2003. The solid vibrations of the gradient coil 2002 are damped by the antivibration member 2012. The apparatus of this embodiment further includes the following antivibration means.

Figure 4:
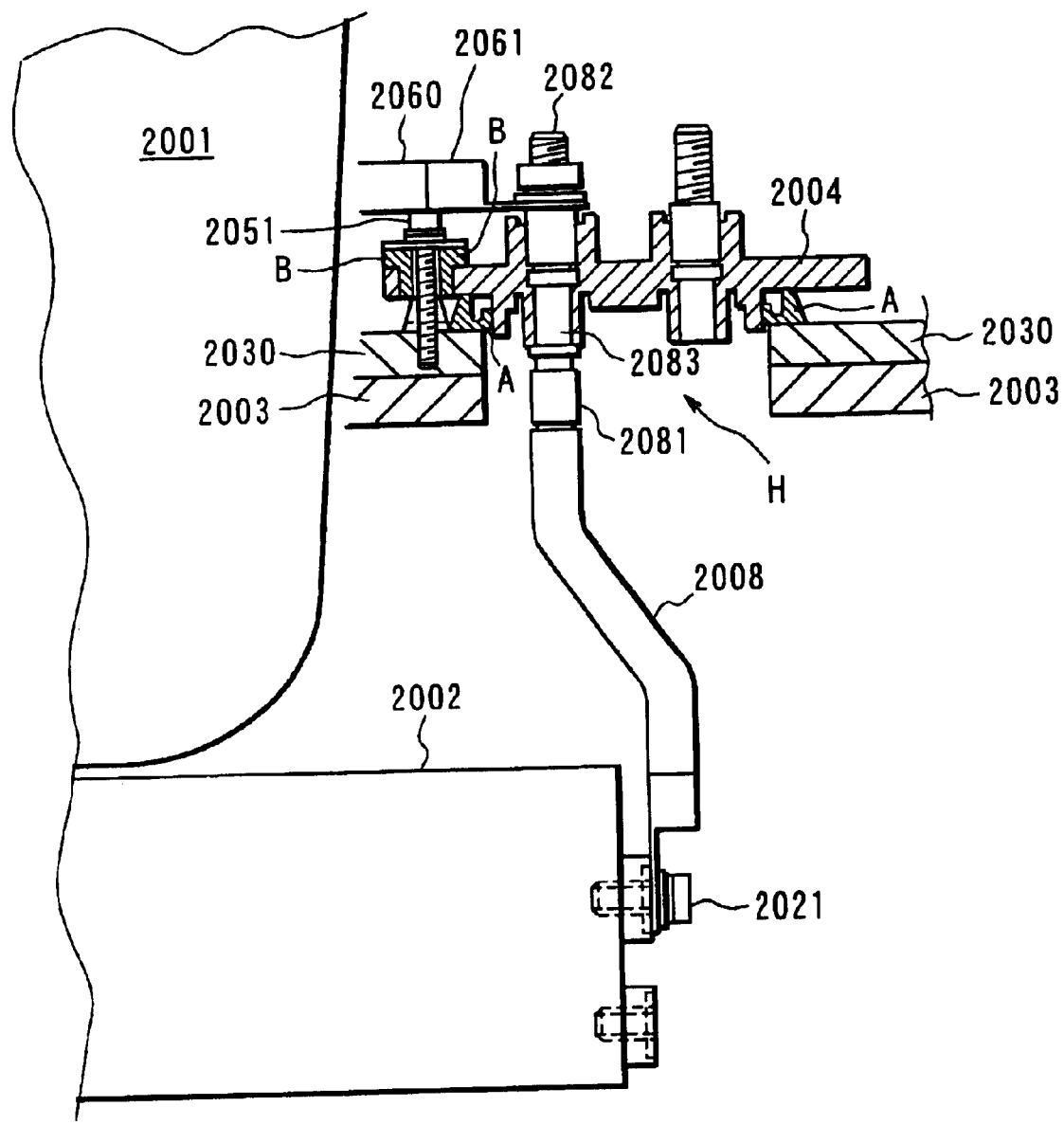
FIG. 4 is a sectional view of a coupling plate for an inner cable in a sealed vessel and an outer cable in Embodiment 2.

FIG. 4 shows a cross-section of the coupling plate 2004 for coupling the inner cable 2008 inside the sealed vessel 2003, the outer cable 2060 outside the sealed vessel 2003, and the sealed vessel 2003 to each other by clamping them. A terminal 2061 of the outer cable 2060 extending from the external power supply is fastened to an outer connector 2082 of the coupling plate 2004 with a screw. The outer connector 2082 is electrically connected to an inner connector 2083 protruding inward from the sealed vessel 2003. A terminal 2081 of the inner cable 2008 extending from a connector 2021 of the gradient coil 2002 is connected to the inner connector 2083.

Figure 5:
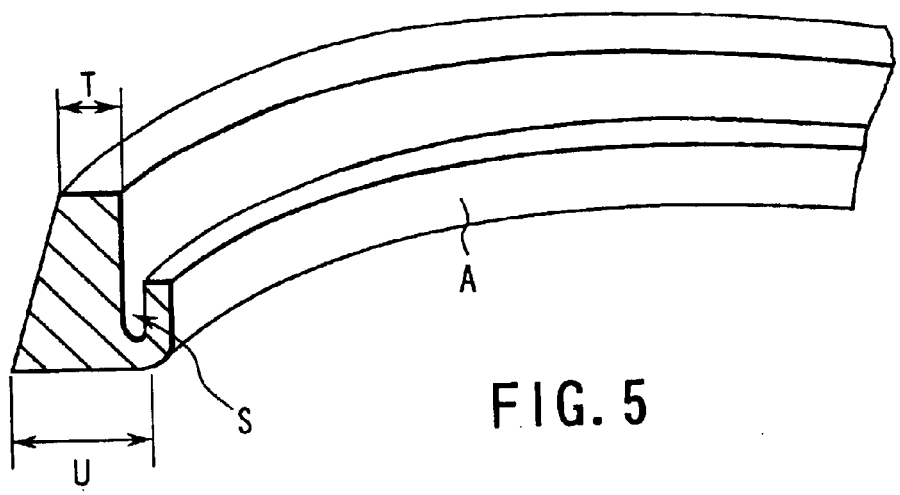
FIG. 5 is a sectional view of a ring-like antivibration member A in FIG. 4.

A hole H is formed in the sealed vessel 2003. A mount plate 2030 having a hole with the same diameter as that of the hole H is bonded to the surface of the sealed vessel 2003. The coupling plate 2004 is fastened to the mount plate 2030 with a plurality of screws 2051. A ring-like rubber member A is fitted in the gap between the mount plate 2030 and the coupling plate 2004. As shown in FIG. 5, the rubber member A has a substantially trapezoidal shape with a tong-like projection. An upper portion T of the member A is pressed against the mount plate 2030. A lower portion U is pressed against the mount plate 2030 on the sealed vessel 2003 side. This rubber member A is formed by a member having, for example, a hardness of about 40 and a very small spring constant, with the upper portion T being narrower than the lower portion U. This rubber member A damps the vibrations of the cable 2008, thus preventing the vibrations of the cable 2008 from propagating to the sealed vessel 2003. Note that the vibrations of the inner 2008 are generated by the solid-born propagation of the vibrations of the gradient coil 2002 and the Lorents force of the capable 2008 itself.

The rubber member A also serves as an O-ring as a seal member. The relatively soft rubber member A having the above shape appropriately deforms due to the atmospheric pressure. This deformation brings the rubber member A into tight contact with the coupling plate 2004 and mount plate 2030, thus obtaining a high sealing effect.

As described above, the rubber member A can prevent the vibrations of the coupling plate 2004 from propagating to the sealed vessel 2003 at the portion where the coupling plate 2004 is attached to the sealed vessel 1003, which portion is formed to introduce a cable. In addition, the rubber member A is shaped to seal the hole H of the sealed vessel 2003 together with the coupling plate 2004 without any gap, and hence also serves to seal a vacuum in the sealed vessel 2003 without adding any new special structure. Note that the shape of the rubber member A is not limited to the ring-like shape in FIG. 5, and may take any shape as long as it can seal the hole H without any gap.

Figure 6:
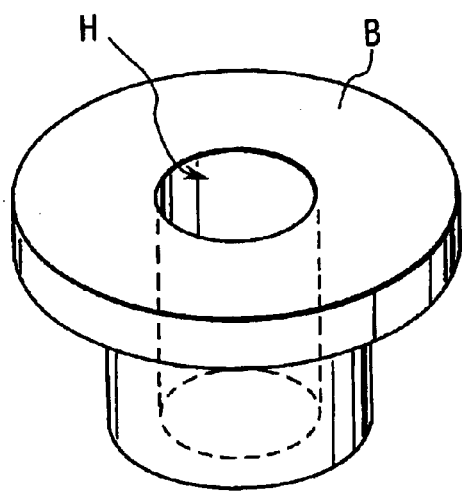
FIG. 6 is a perspective view of an antivibration member B in FIG. 4.

In this embodiment, an antivibration means is also provided for a portion where the coupling plate 2004 is fastened to the mount plate 2030 with a screw. More specifically, a hole for the insertion of the screw 2051 is formed in the coupling plate 2004. A rubber spacer B having a substantially cylindrical shape in FIG. 6 is inserted into this hole, and the screw 2051 is inserted into a hole in the spacer B. This spacer B is formed by a member having a very small spring constant like the rubber member A described above.

This spacer B can prevent the vibrations of the gradient coil 2002 from propagating to the coupling plate 2004 via the cable 2008 and can also prevent the vibrations generated by the Lorents force of the capable 2008 itself from propagating to the sealed vessel 2003 via the screw 2051 of the coupling plate 2004. This makes it possible to reduce the noise caused by the vibrations of the sealed vessel 2003.

The above embodiment has the members A and B provided for the coupling plate 2004. However, the effect of the present invention can be obtained by using either of the members. In addition, the present invention can be applied to a magnetic resonance imaging apparatus having an arrangement in which a gradient coil is not housed in a sealed vessel or no vibration absorbing unit is provided for a gradient coil. Obviously, a static magnetic field generating scheme is not limited to the one using the superconductive coil, and a gradient coil is not limited to the actively shield gradient coil.

(Embodiment 3)

FIG. 7A is a cross-sectional view of the gantry of a magnetic resonance imaging apparatus according to Embodiment 3. FIG. 7B is a longitudinal sectional view of the gantry. A gantry 3019 has an imaging space S having a substantially cylindrical shape, in which a patient is to be inserted/placed. An object 3008 to be examined is placed on a top 3009 and inserted into the imaging space S of the gantry 3019. The operations of the gantry 3019 and top 3009 are controlled by a control processing section. Assume that the axial direction of the imaging space S is the Z direction, and directions perpendicular to the Z direction are the X and Y directions. The gantry 3019 has a static magnetic field magnet formed by, for example, a superconductive magnet, which generates a static magnetic field in the imaging space S, and a cryostat 3001 housing the magnet. The cryostat 3001 is mounted on four leg members 3027 extending upright from a floor F. The floor F is made of, for example, a concrete material having high rigidity. A gradient coil 3002 and a liner 3004 for ensuring the imaging space S are placed in the cryostat 3001.

The gradient coil 3002 includes $x$, $y$ and $z$ coils as windings stacked/impregnated on a spool, and has a substantially cylindrical shape as a whole. The gradient coil 3002 is mounted on the inside of the cryostat 3001 via a connecting portion constituted by a support bracket 3005, antivibration rubber member 3006, and magnet interface 3007. This portion will be described in detail later.

The liner 3004 is mounted on the cryostat 3001 via a connection portion constituted by an antivibration rubber member 3011, a vacuum cover 3003, an O-ring 3010, the magnet interface 3007, a bolt 3020, and a washer 3021. The inner circumferential side of the cryostat 3001, liner 3004, and vacuum cover 3003 serve to maintain a vacuum around the gradient coil 3002, which will be described in detail later.

A vacuum hose 3017 is attached to a portion of the vacuum cover 3003, and a vacuum pump 3018 is attached to an end portion of the hose.

The connection between the gradient coil 3002 and the cryostat 3001 will be described in detail next.

The support brackets 3005, each having a substantially arcuated shape, are connected to the two ends of the gradient coil 3002 in the Z direction with connecting parts such as bolts. The support bracket 3005 has a substantially arcuated shape conforming to a portion of the gradient coil 3002 when viewed from the Z direction, and has a substantially L-shaped cross-section when viewed from the X direction. Note that one side of substantially the L-shaped cross-section has a length almost equal to the thickness of a portion between the inner and outer circumferential portions of the gradient coil 3002, and a hole for a bolt for connection to the gradient coil 3002 is formed in this portion.

The other side of the L-shaped cross-section is located on the inner circumferential side, and two antivibration rubber members 3006 are mounted on the outer circumferential side.

The total of four antivibration rubber members 3006 respectively mounted on the support brackets 3005 on the two sides in the Z direction are mounted on the magnet interface 3007 having a substantially annular shape and joined to the two sides of the cryostat 3001 having a superconductive coil cylindrical shape in the z direction by welding or the like. The shape of the magnet interface 3007 may be vertically asymmetrical.

In this case, the support brackets 3005 and antivibration rubber members 3006 are placed in a space below the top 3009. This allows the sealed space above the top 3009 to have a smaller volume than the sealed space below the top. Therefore, the upper portion of the vacuum cover 3003 can be cut into the imaging space S side. This makes it possible to reduce a sense of oppression when the object 3008 is inserted into the gantry 3019 while he/she is facing upward.

Note that the antivibration rubber members 3006 also serve to support the weight of the gradient coil 3002 from below.

The support brackets 3005 are provided for the gradient coil 3002, and the antivibration rubber members 3006 are attached to the support brackets 3005. The magnet interface 3007 is mounted on the antivibration rubber members 3006, and the cryostat 3001 is jointed to the magnet interface 3007. Note that the sequence of connection is not specifically limited.

The connection between the cryostat 3001 and the liner 3004 will be described in detail next by separately describing the connection between the cryostat 3001 and the vacuum cover 3003 and the connection between the vacuum cover 3003 and the liner 3004.

Figure 8:
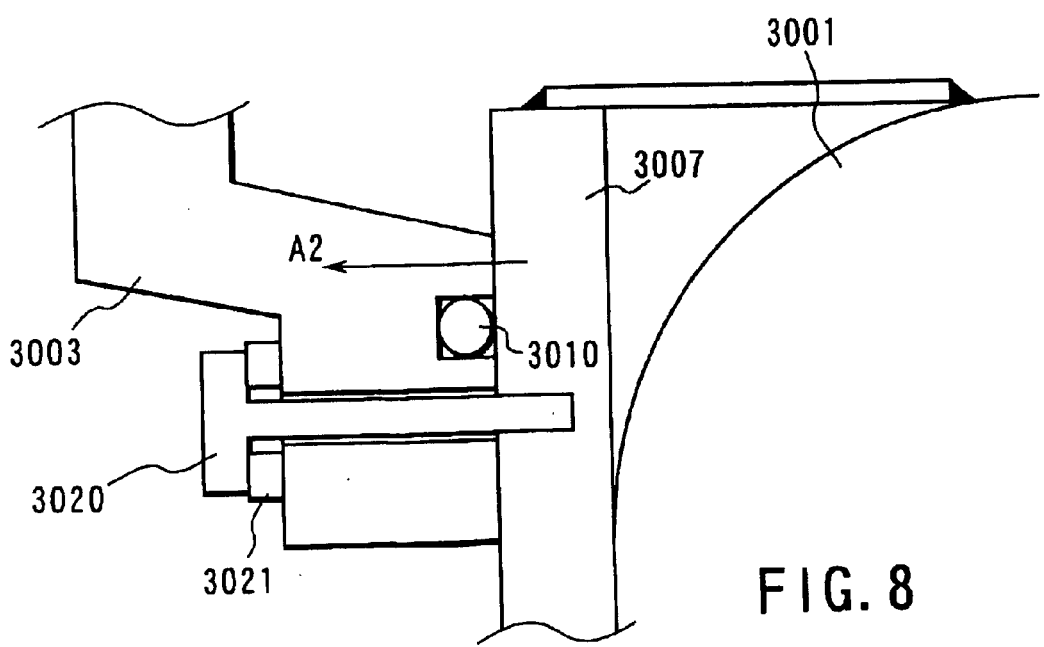
FIG. 8 is a sectional view of a joint portion between a side surface of a static magnetic field magnet and the cover of a sealed vessel in Embodiment 3.

FIG. 8 is an enlarged view of the connection portion between the magnet interface 3007 mounted on the cryostat 3001 and the vacuum cover 3003. The cryostat 3001 is connected to the vacuum cover 3003 by fixing the vacuum cover 3003 to the magnet interface 3007 mounted on the cryostat 3001 with the bolt 3020 and washer 3021.

The vacuum cover 3003 is used to seal the gap based on the difference in diameter between the liner 3004 and the cryostat 3001 from both sides in the Z direction. The vacuum cover 3003 has a substantially annular shape with the outer diameter almost equal to the diameter of the cryostat 3001, and the inner diameter almost equal to the diameter of the liner 3004.

A substantially annular groove is formed in the vacuum cover 3003 on the magnet interface 3007 side to extend along the circumference of the vacuum cover 3003. The O-ring 3010 is fitted in this substantially annular groove. The O-ring 3010 is used to improve the airtightness between the vacuum cover 3003 and the magnet interface 3007. A hole through which the bolt 3020 is turned in is formed in the circumference of the vacuum cover 3003.

Figure 9:
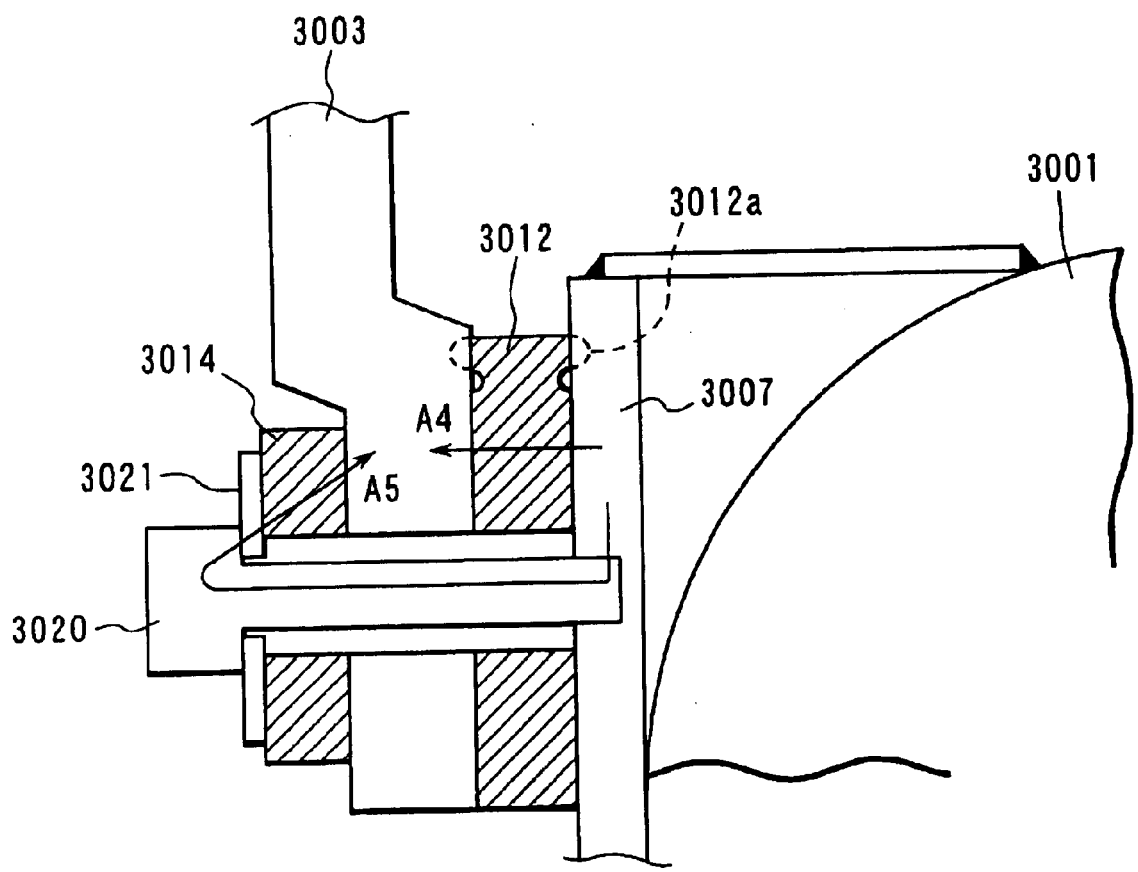
FIG. 9 is a sectional view of a join portion between the cover and an inner cylinder (line) in Embodiment 3.

The connection between the vacuum cover 3003 and the liner 3004 will be described next. FIG. 9 is an enlarged view of the connection portion between the vacuum cover 3003 and the liner 3004. The antivibration rubber member 3011 is placed between the vacuum cover 3003 and the liner 3004. The antivibration rubber member 3011 has a substantially annular shape with the inner diameter almost equal to the inner diameter of the vacuum cover 3003 and liner 3004, and a substantially L-shaped cross-section when viewed from the X direction.

The vacuum cover 3003 and liner 3004 are shaped to clamp the sealed vessel 301 from both the Y direction and the z direction.

By clamping the antivibration rubber member 3011 from the Z direction, the vacuum cover 3003 and liner 3004 can be sealed and connected to each other with the force generated by the pressure difference between the atmospheric pressure indicted by an arrow A7 in FIGS. 7B and 9 and the vacuum pressure.

In addition, by clamping the antivibration rubber member 3011 from the Y direction, the liner 3004 can be held with a force in the Y direction, e.g., the force originating from the weight of the liner 3004 or object 3008.

Each portion of the L-shaped cross-section is set to a length that prevents deformation upon application of a certain force, e.g., the weight of the liner 3004 or an object to be examined, on the liner 3004, and prevents detachment of the liner 3004 and vacuum cover 3003.

A projection portion 3011a is formed on the antivibration rubber member 3011 at a position to oppose the vacuum cover 3003 and liner 3004. FIG. 9 illustrates the projection portion 3011a in an arcuated shape with the dashed lines to show the shape of the projection portion before it is used. When the antivibration rubber member 3011 is actually used, it is inserted between the vacuum cover 3003 and the liner 3004 with the projection portion being flattened.

The projection portion 3011a has a substantially annular shape extending along the circumference of the antivibration rubber member 3011, can seal the vacuum cover 3003 and liner 3004, and is used to increase the degree of vacuum.

A flange 3011b having high rigidity and a crank-like cross-section in the X direction, which extends along the L-shaped antivibration rubber member 3011, and a substantially annular cross-section in the Z direction, which surrounds the imaging space S, is provided on the surface of the antivibration rubber member 30011 which is in contact with the liner 3004 except for the projection portion 3011a. The flange 3011b is provided to prevent the deformation of the antivibration rubber member 3011 when the liner 3004 moves due to an external force. whether to use the flange 3011b may determined, as needed.

The function and effect of this embodiment will be described next.

First of all, the vacuum pump 3018 is activated to evacuate the sealed space between the liner 3004 surrounding the gradient coil 3002, the cryostat 3001, and the vacuum cover 3003, thereby creating a vacuum of a predetermined value in the sealed space. The above sealed space in a vacuum state is provided to prevent the air-born propagation of vibrations (i.e., noise). The degree of vacuum in this space may be lower than that in the cryostat 3001 described above, and may be several Torr. The sound insulating effect for air-born propagation is given below, when compared with air of 1 atmospheric pressure:

$$I = 20 \times \log_{10}(P/760) \text{ [dB]}$$

where I is the sound insulating ratio and P is the degree of vacuum. If, for example, the degree of vacuum in the sealed space is about 0.7 Torr, a sound insulating effect of about 60 dB can be obtained as compared with sound insulation by air of 1 atmospheric pressure.

A static magnetic field is generated in the imaging space S by a current flowing in the static magnetic field coil placed in the cryostat 3001. The object 3008 lying on the top 3009 is inserted into the imaging space S. At this time, the top 3009 may be guided/supported by top rails (not shown) provided on the liner 3004. Alternatively, another support structure that prevents the weight of the object 3008 from being applied to the liner 3004 may be used.

After necessary preparations, e.g., installation of the RF coil and positioning of a slice surface, are made, a diagnosis is started. That is, a control command is output from the control processing section to each element in the gantry in accordance with a desired pulse sequence, and an MR signal is received from the object 3008. Image data is then reconstructed on the basis of this MR signal.

In the driving state based on this pulse sequence, a pulse current that steeply rises and falls is supplied to the gradient coil 3002. When the pulse sequence is a fast imaging sequence, in particular, the polarities of such a pulse current are inverted at high speed. Since the gradient coil 3002 is placed in a strong static magnetic field, the coil generates an electromagnetic force every time a pulse current that changes at high speed flows in the coil. Vibrations are then produced by this electromagnetic force. Since the magnitude of the electromagnetic force varies in a complicated manner in accordance with the positions of the x, y, and z coils and the like, the gradient coil 3002 generally vibrates in a complicated mode.

In this embodiment, even if the gradient coil 3002 vibrates, since the gradient coil 3002 is placed in the vacuum space, there is no possibility that air around the coil vibrates. That is, the air-born propagation of vibrations indicated by an arrow A1 in FIG. 7B is reliably eliminated and suppressed, resulting in a great reduction in vibrations propagating to the outside.

In contrast to this, the vibrations of the gradient coil 3002 try to leak to the outside via the support bracket 3005 by solid-born propagation. However, since various vibration absorbing means are also provided for this solid-born propagation as described above, leakage vibrations are greatly reduced.

First of all, vibrations are absorbed by the antivibration rubber members 3006 mounted on the support brackets 3005 at the two ends in the Z-axis direction which support the gradient coil 3002 from the lower end side, and hence the propagation of vibrations to the magnet interface 3007 mounted on the cryostat 3001 is suppressed. Only the vibrations that could not be removed by the antivibration rubber members 3006 propagate to the magnet interface 3007.

The vibrations propagating to the magnet interface 3007 are guided to the vacuum cover 3003 attached to the magnet interface 3007 with the bolt 3020, as indicated by an arrow A2 in FIG. 8. The vibrations guided to the vacuum cover 3003 try to propagate to the liner 3004, as indicted by an arrow A3 in FIG. 9. However, since the antivibration rubber member 3011 is placed between the vacuum cover 3003 and the liner 3004, the solid-born propagation of vibrations is suppressed, thus greatly reducing vibrations propagating from the vacuum cover 3003 to the liner 3004.

In addition, as described above, the vacuum space is sealed by the pressure difference between the atmospheric pressure and the vacuum pressure, and the antivibration rubber member 3011 is clamped between the vacuum cover 3003 and the liner 3004 in the Y direction. With this structure, the liner 3004 can be held without using any connecting parts such as bolts.

In general, when a connecting part is used, solid vibrations propagate through the connecting part. In this case, since no connecting parts except for an antivibration rubber member are used for the connection between the vacuum cover 3003 and the liner 3004, solid-born propagation can be greatly suppressed.

In this embodiment, (1) the air-born propagation of vibrations (i.e., noise) generated by the gradient coil 3002, which greatly vibrates in particular, is considerably suppressed by generating a vacuum space;

(2) such vibrations are minimized by the antivibration rubber members 3006 placed between the magnet interface 3007 and the support brackets 3005 provided for the gradient coil 3002; and (3) the remaining vibrations are also reliably eliminated by the antivibration rubber member 3011 between the vacuum cover 3003 and the liner 3004.

This makes it possible to suppress not only overall noise in the gantry 3019 but also noise caused by the vibrations of the liner 3004 near the object 308, in particular. Even if a fast pulse sequence is used, vibrations and noise originating from the vibrations of the gradient coil 3002 can be greatly reduced. This can properly remove the anxiety or unpleasant feeling of the object 3008 located inside the liner 3004.

In addition, the support brackets 3005 and antivibration rubber members 3006 for supporting the gradient coil 3002 exist only below the top 3009, and the upper portion of the vacuum cover 3003 is cut into the imaging space S side to produce a large space outside the cover. This makes the object feel relaxed.

The first modification of this embodiment will be described next with reference to the views of the accompanying drawing. Note that the same reference numerals as in Embodiment 1 denote the same parts in this modification, and a detailed description thereof will be omitted.

Figure 10:
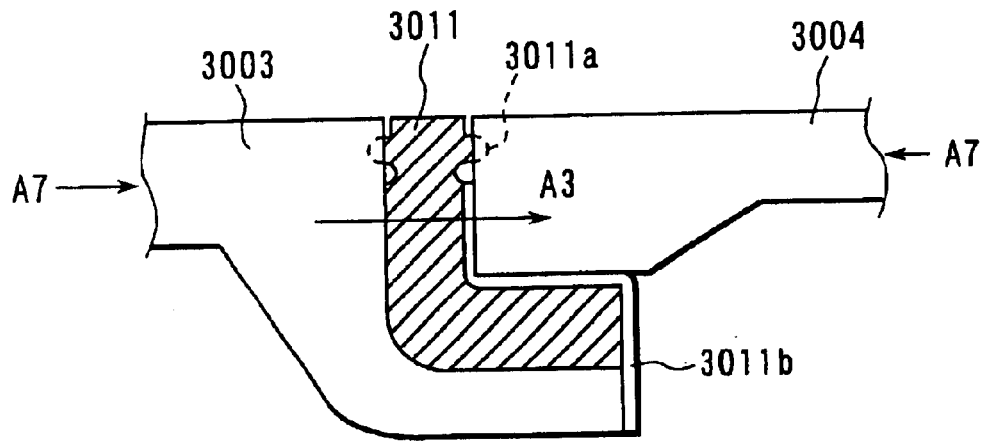
FIG. 10 is a sectional view of a joint portion between a side surface of the static magnetic field magnetic and the cover of the sealed vessel in Embodiment 3.

This modification is a modification of the connecting portion between the magnet interface 3007 and the vacuum cover 3003. FIG. 10 is an enlarged view of this portion.

In Embodiment 3, the magnet interface 3007 is in contact with the vacuum cover 3003, as shown in FIG. 8. In this modification, a sealing antivibration rubber member 3012 is placed between the magnet interface 3007 and the vacuum cover 3003. The sealing antivibration rubber member 3012 serves to seal the gap between the magnet interface 3007 and the vacuum cover 3003. The sealing antivibration rubber member 3012 is firmly clamped and fixed between the magnet interface 3007 and the vacuum cover 3003 with the pressure difference between the atmospheric pressure and the vacuum pressure.

The sealing antivibration rubber member 3012 has a projection portion 3012a.

The projection portion 3012a is formed at a position to oppose the vacuum cover 3003 and magnet interface 3007. The projection portion 3012a has a substantially annular shape extending along the circumference of the sealing antivibration rubber member 3012, can seal the vacuum cover 3003 and magnet interface 3007, and is used to increase the degree of vacuum. The sealing antivibration rubber member 3012 has a substantially annular shape surrounding the imaging space S.

When the sealing antivibration rubber member 3012 is used, as indicated by an arrow A4 in FIG. 10, vibrations try to propagate from the magnet interface 3007 to the vacuum cover 3003, but the solid-born propagation of vibrations is suppressed by the sealing antivibration rubber member 3012.

In addition, a washer-type antivibration rubber member 3014 may be placed between the washer 3021 and the vacuum cover 3003. If the antivibration rubber member 3014 is used, as indicated by an arrow A5 in FIG. 8, vibrations try to propagate from the magnet interface 3007 to the vacuum cover 3003 via the bolt 3020 and washer 3021, but the solid-born propagation of vibrations is suppressed by the antivibration rubber member 3014.

Although the use of the antivibration rubber member 3014 increases the antivibration effect, whether to use this component may be determined, as needed.

In this modification, by using the sealing antivibration rubber member 3012 between the vacuum cover 3003 and the magnet interface 3007, in addition to the effect of Embodiment 3, the vacuum cover 3003 and magnet interface 3007 can be sealed without using any O-ring, and at the same time, solid vibrations from the magnet interface 3007 to the vacuum cover 3003 can be suppressed, thereby further suppressing the noise caused by vibrations.

The second modification of Embodiment 3 will be described next with reference to the views of the accompanying drawing. Note that the same reference numerals as in Embodiment 3 and the first modification denote the same parts in this modification, and a detailed description thereof will be omitted.

Figure 11:
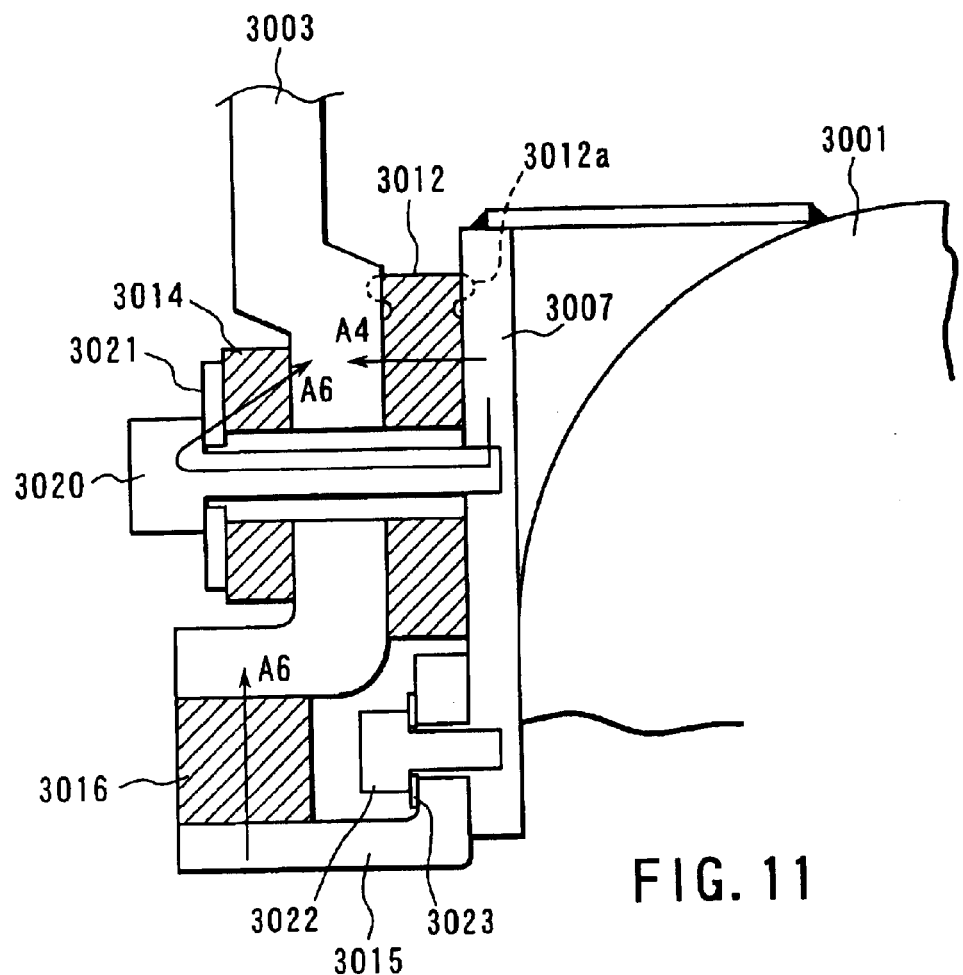
FIG. 11 is a sectional view of a joint portion between a side surface of the static magnetic field magnetic and the cover of the sealed vessel in Embodiment 3.

This modification is a modification of the connecting portion between the magnet interface 3007 and the vacuum cover 3003. FIG. 11 is an enlarged view of this portion. In this modification, by using bolts 3022 and washers 3023, brackets 3015 each having a substantially L-shaped cross-section when viewed from the X direction, are placed closer to the outer circumferential side than the portion where the bolt 3020 of the magnet interface 3007 is attached in the first modification. When viewed from the Z direction, each bracket 3015 is located below the vacuum cover 3003 and supports the weight of the vacuum cover 3003. A support antivibration rubber member 3016 is placed between the bracket 3015 and the vacuum cover 3003.

The weight of the vacuum cover 3003 can be sufficiently supported by the brackets 3015 via the support antivibration rubber members 3016 placed below the vacuum cover 3003. The brackets 3015 and support antivibration rubber members 3016 need not be arranged along the entire circumference of the vacuum cover 3003. For example, like the antivibration rubber members 3006 used to support the weight of the gradient coil 3002 in FIGS. 7A and 7B, these components may be placed at two portions below the vacuum cover 3003 (two portions in the Z direction; a total of four portions).

As indicated by an arrow A6 in FIG. 8, vibrations try to propagate from the brackets 3015 to the vacuum cover 3003, but the propagation of vibrations is suppressed by the support antivibration rubber members 3016.

A height adjustment function (not shown) for each support antivibration rubber member 3016 exists between the support antivibration rubber member 3016 and the bracket 3015. In assembling the apparatus, the vacuum cover 3003 is mounted on each support antivibration rubber member 3016, and the height is adjusted by the height adjustment function to center the vacuum cover 3003. The vacuum cover 3003 is then lightly fastened with the bolt 3020, and a vacuum is produced. As a consequence, the sealing antivibration rubber member 3012 is firmly pressed from two sides by the vacuum cover 3003 and magnet interface 3007 and sealed.

As each support antivibration rubber member 3016, a rubber member having relatively high rigidity is required to support the weight of the gradient coil 3002 weighing several 100 kg or more. By partly supporting the gradient coil 3002, the contact area can be reduced to effectively reduce the propagation of vibrations. Since the force applied to the sealing antivibration rubber member 3012, which is placed around the entire circumference of the vacuum cover 3003 and has a large contact area, per unit area is not so large as that applied to the support antivibration rubber member 3016, a rubber member having relatively low rigidity is used as the sealing antivibration rubber member 3012 to effectively suppress the propagation of vibrations.

In this modification, in addition of the effects of Embodiment 3 and the first modification, even if a heavy weight is applied to the vacuum cover 3003, vibrations can be suppressed as in Embodiment 3 and the first modification while the vacuum cover 3003 is reliably supported.

The third modification of Embodiment 3 will be described next with reference to the views of the accompanying drawing. Note that the same reference numerals as in Embodiment 3 denote the same parts in this modification, and a detailed description thereof will be omitted.

Figure 12:
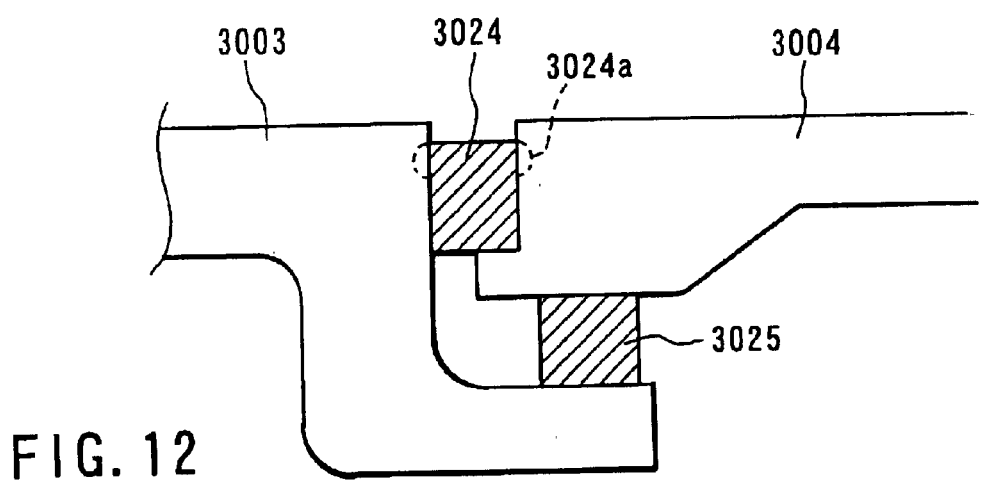
FIG. 12 is a sectional view of a joint portion between the cover and the inner cylinder (liner) in Embodiment 3.

This modification is a modification of the connecting portion between the vacuum cover 3003 and the liner 3004. FIG. 12 is an enlarged view of this portion. Embodiment 3 uses the antivibration rubber member 3011 having both the sealing function and the support function. In contrast to this, this modification separately uses a support antivibration rubber member 3025 for supporting the weight of the liner 3004, and a sealing antivibration rubber member 3024 for sealing the liner 3004. The support antivibration rubber members 3025 need not be arranged on the entire circumference of the liner 3004. For example, like the antivibration rubber members 3006 used to support the weight of the gradient coil 3002 in FIGS. 7A and 7B, support antivibration rubber members 3025 may be placed at two portions below the liner 3004 (two portions in the Z direction; a total of four portions).

The sealing antivibration rubber member 3024 surrounds the imaging space S in a substantially annular form, and is firmly clamped and fixed between the vacuum cover 3003 and the liner 3004 with the pressure difference between the atmospheric pressure and the vacuum pressure. In addition, to ensure the sealing between the vacuum cover 3003 and the liner 3004 and increase the degree of vacuum, a projection portion 3024a may be formed on the sealing antivibration rubber member 3024 at a position to oppose the vacuum cover 3003 and liner 3004.

In addition to the effect of Embodiment 3, the deformation of the antivibration rubber member 3011 can be prevented without providing any flange having high rigidity by using a rubber member having relatively high rigidity as the support antivibration rubber member 3025 having a small contact area and a rubber member having relatively low rigidity as the sealing antivibration rubber member 3024 having a large annular contact area. In addition, the propagation of vibrations can be effectively suppressed by adjusting the rigidity of the support antivibration rubber member 3025 and sealing antivibration rubber member 3024.

The fourth modification of Embodiment 3 will be described next with reference to the views of the accompanying drawing. Note that the same reference numerals as in Embodiment 3 denote the same parts in this modification, and a detailed description thereof will be omitted.

This modification is a modification of the connection portion between the gradient coil 3002 and the cryostat

Figure 13:
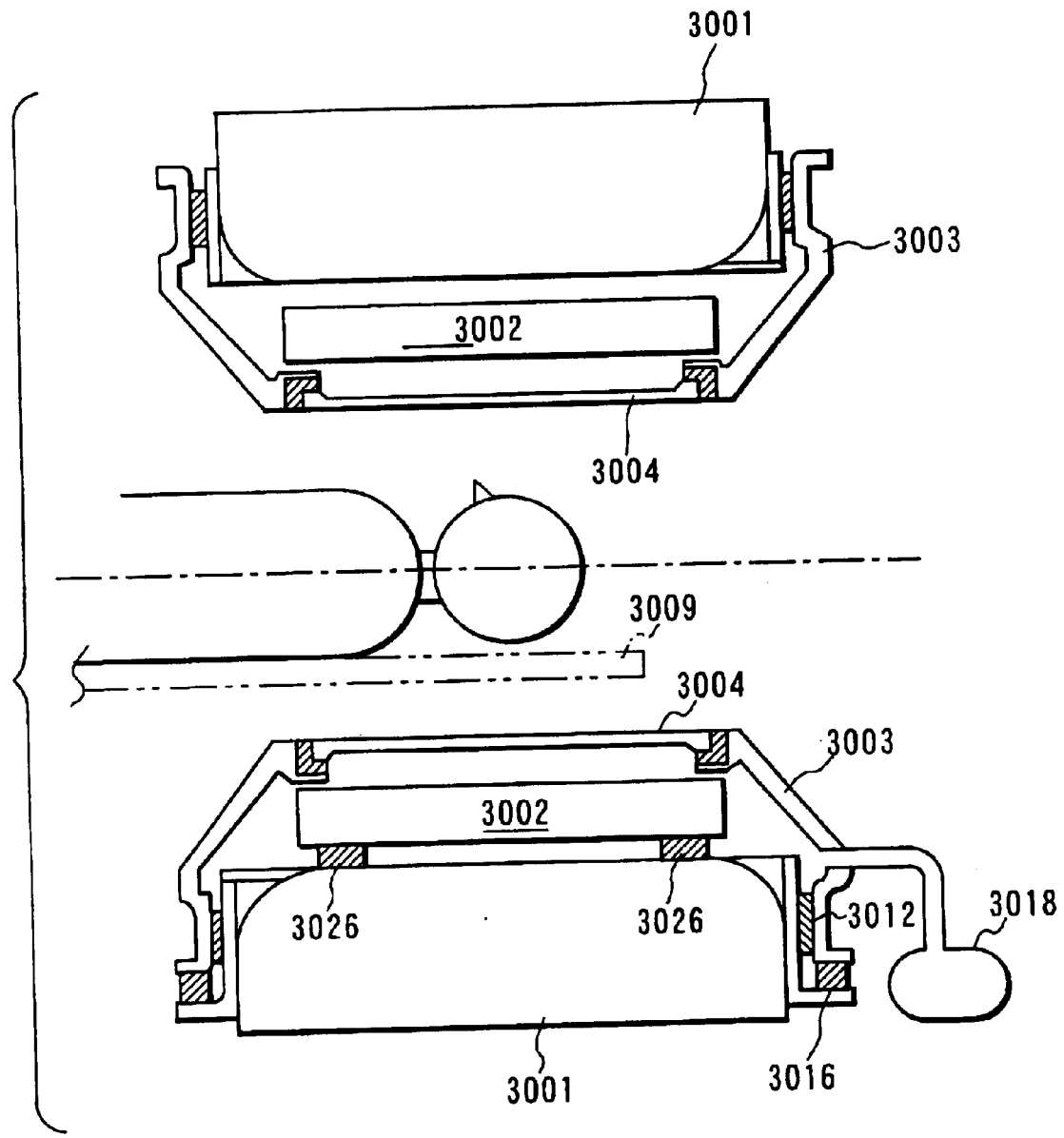
FIG. 13 is a longitudinal sectional view of a gantry in Embodiment 3.

3001. FIG. 13 is an enlarged view of this portion. Referring to FIG. 13, the connection portion between the magnet interface 3007 and the vacuum cover 3003 is identical to that in the second modification.

In this modification, one, two, or more antivibration rubber members 3026 are arranged below the gradient coil 3002 at each of the two ends in the Z direction. Each antivibration rubber members 3026 is pressed by the weight of the gradient coil 3002 and connected to the cryostat 3001. A portion and its neighboring portion of the cryostat 3001 with which each antivibration rubber members 3026 comes into contact are formed into a structure having rigidity high enough to support the weight of the gradient coil and suppress vibrations propagating to the antivibration rubber members 3026.

In this modification, in addition to the effect of Embodiment 3, the present invention can be practiced without using the support brackets 3005 used in Embodiment 3, and hence a reduction in cost can be attained with a very simple arrangement.

In the above embodiment and its modifications, since a rubber material is suited for each antivibration member having the sealing function in addition to the antivibration function, the antivibration rubber member has been exemplified as an antivibration member. However, the present invention is not limited to rubber materials, and any member can be used as long as it suppresses vibrations.

In addition, an apparatus including the gradient coil 3002, vacuum cover 3003, and liner 3004 can be attached as a gradient magnetic field unit to an existing magnetic resonance imaging apparatus having a static magnetic field coil left in a gantry. In this case, the static magnetic field coil in the existing magnetic resonance imaging apparatus can be used.

In Embodiment 3 and the four modifications described above, the annular vacuum cover 3003 is used for the sealed vessel for holding a vacuum state set around the above gradient magnetic field generating means. However, the shape of the vacuum cover is not specifically limited as long as it can set a vacuum state.

(Embodiment 4-1)

Figure 14:
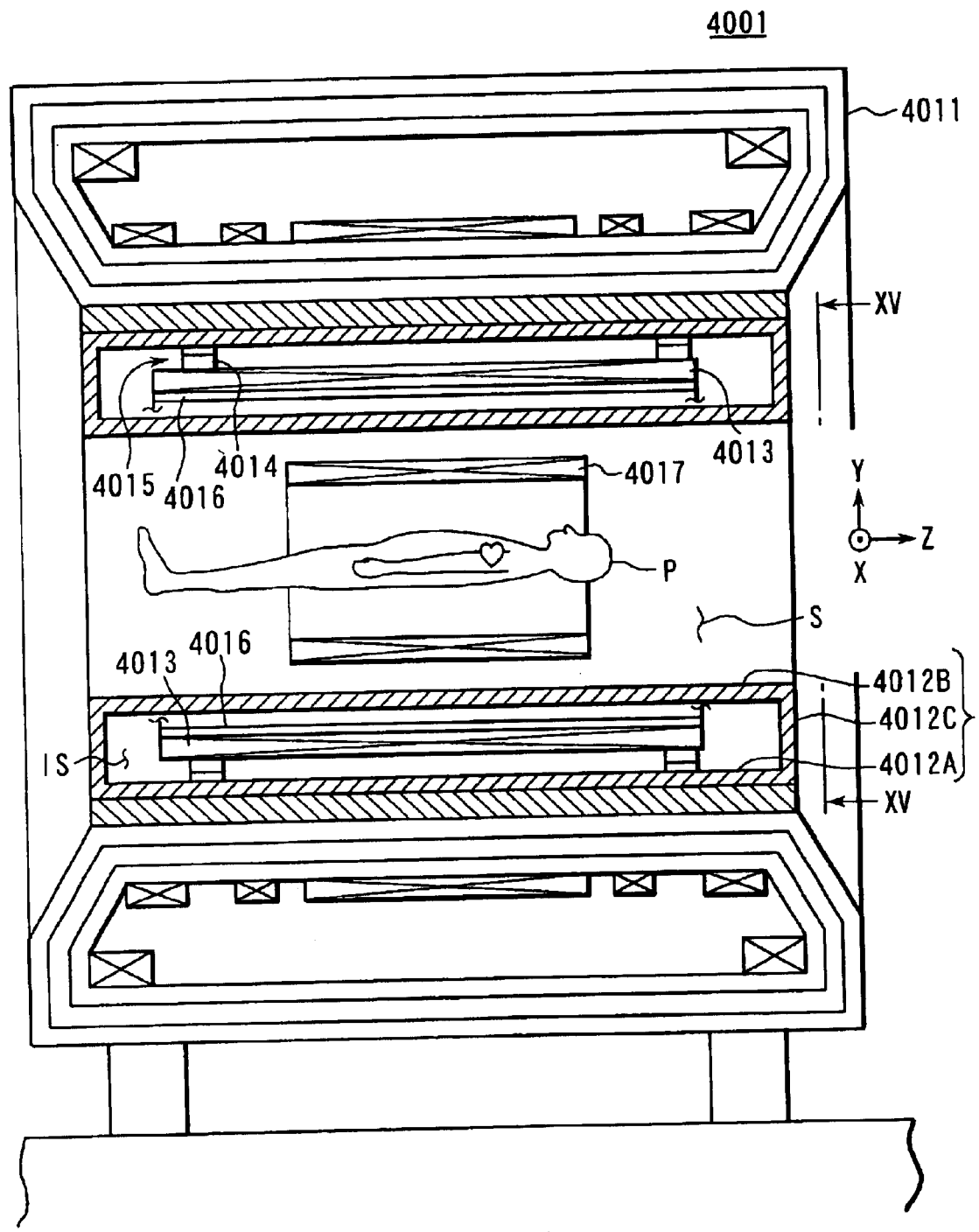
FIG. 14 is a longitudinal sectional view of a gantry in Embodiment 4-1.

Embodiment 4-1 will be described with reference to FIGS. 14 to 17. FIG. 14 shows a gantry 4001 of an MRI apparatus. This gantry 4001 is of a so-called silent type having a gradient coil sealed in a sealed vessel.

The gantry 4001 has a substantially cylindrical shape as a whole and a bore serving as a diagnosis space S. In a diagnosis, an object P to be examined is placed on the bed top (not shown) and inserted into the space of the gantry. Assume that the major axis direction of the gantry is the Z-axis of a rectangular coordinate system.

A cylindrical superconductive magnet 4011 is placed on the floor at the outermost side of the gantry 4001 in the radial direction (X-Y plane direction). This magnet 4011 is connected to a static magnetic field power supply (not shown) and serves to generate a static magnetic field in the diagnosis space S. At least the size of the demultiplxer 401 in the radial direction is equal to that in an apparatus having no silencing mechanism by a sealed vessel (to be described later).

A sealed vessel 4012 is placed on the inner circumferential side of the superconductive magnet 4011 while the vessel is supported on the magnet. This vessel 4012 is formed into a cylindrical shape having an internal space IS surrounded by an outer circumferential wall member 4012A, inner circumferential wall member 4012B, and side surface member 4012C as a whole. The sealed vessel 4012 is disposed such that its axial direction coincides with the Z-axis direction. The thickness of the internal space IS in the radial direction is set to a proper value that allows a gradient coil assembly (to be described later) to be sealed without any contact with the wall members (excluding the support portions). The vessel 4012 is coupled to a vacuum pump (not shown), and the air pressure (vacuum) in the vessel is adjusted to be substantially lower than the atmospheric pressure in a diagnosis.

Figure 16:
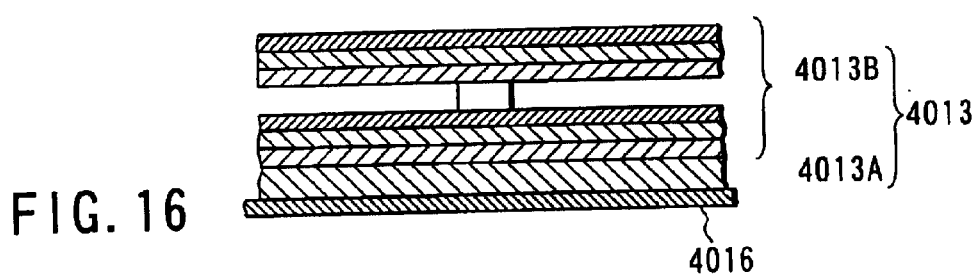
FIG. 16 is a partial sectional view of FIG. 15.
Figure 17:
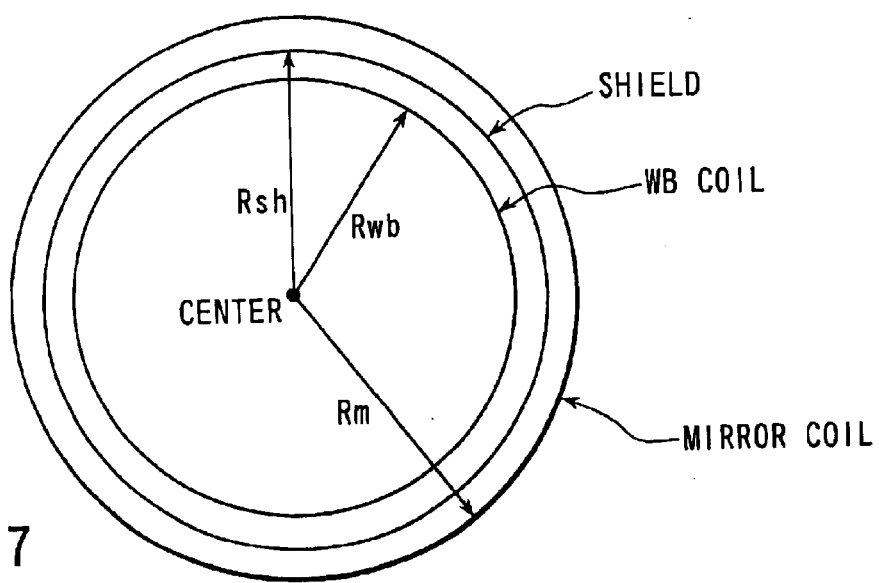
FIG. 17 is a cross-sectional view showing the positional relationship between a WB coil, a shield, and a mirror-image coil in Embodiment 4-1.

As shown in FIG. 14, an assembly of a gradient coil 4013 is placed in the internal space IS of the sealed vessel 4012. In this case, this gradient coil 4013 is an actively shield gradient coil (ASGC). More specifically, as shown in FIG. 16, this coil assembly is designed such that primary and secondary coils corresponding to X, Y, and Z channels are laminated around a cylindrical resin spool 4013A in an insulated state (these laminated winding coils are representatively denoted by reference numeral 4013B). The overall structure is also formed into a substantially cylindrical assembly. The primary and secondary coils corresponding to the respective channels are connected to gradient magnetic field power supplies (not shown) in units of channels. With this actively shield gradient coil, the magnetic fields generated by driving the coil hardly leak out to the outside in the radial direction.

Figure 15:
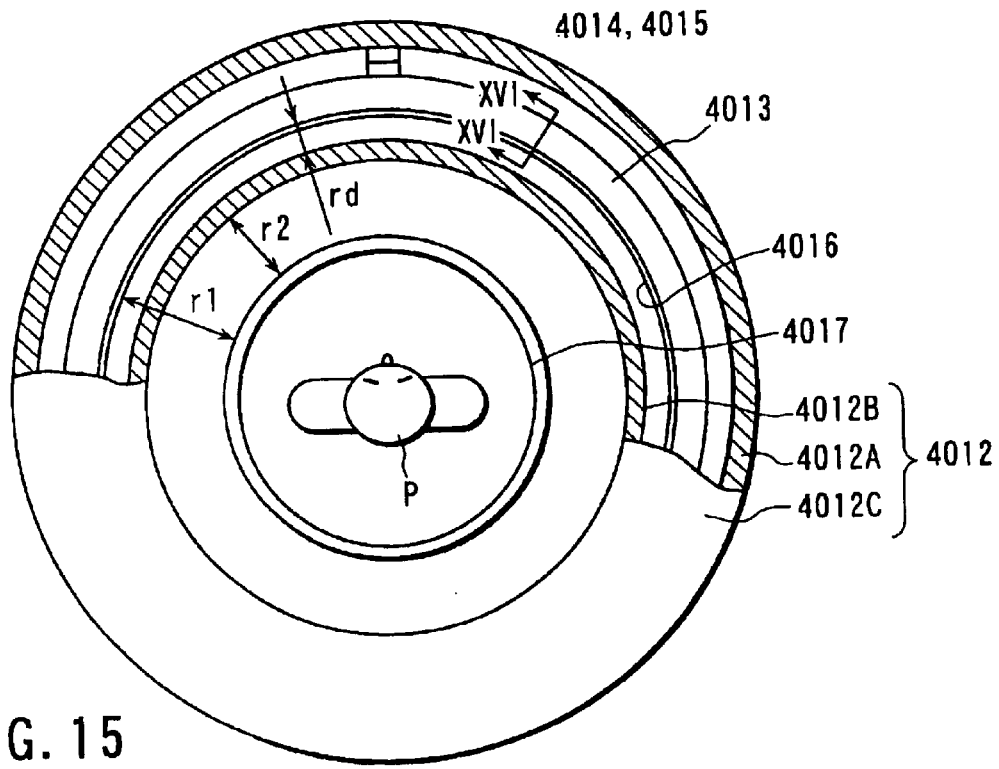
FIG. 15 is a cross-sectional view of the gantry in Embodiment 4-1.

AS shown in FIGS. 14 and 15, in this internal space IS, the assembly of the gradient coil 4013 is supported on the outer circumferential wall member 4012A by a plurality of support portions 4015 through an elastic member 4014. A feeder (not shown) to this gradient coil 4013 hermetically extends through a portion of the sealed vessel 4012.

In the internal space IS of the vessel 4012, a shield 4016 is bonded to the assembly inner circumferential surface of the gradient coil 4013. For example, this shield is made of copper foil having a thickness of about 35 $\mu$m. In this embodiment, the shield 4016 is connected to a ground lead (not shown) hermetically extending through the vessel 4012 to be grounded outside the vessel. Note that the shield 4016 may take a non-grounded form to have an equipotential structure in which the lines connected to the shield 4016 and a WB coil 4017 are hermetically extracted from the vessel and are connected to each other at the remotest position.

The shield 4016 has the function of suppressing electric and magnetic mutual interference between the gradient coil 4013 and the WB coil to be described later. The position of this shield 4016 is one of the characteristic features of this embodiment.

The WB coil (whole body RF coil) 4017 serving as an RF coil is placed outside the inner circumferential wall member 4012B of the sealed vessel 4012, i.e., in the diagnosis space S, so as to surround the object P. This WB coil 4017 is a transmitting/receiving RF coil.

The gantry 4001 of this embodiment has the above arrangement. With the arrangement, the shield 4016 properly eliminates or suppresses the magnetic and electric mutual interference between the WB coil 4017 and the gradient coil 4013 as in the prior art.

In addition, since the assembly of the gradient coil 4013 is sealed in the vessel 4012 in a substantially vacuum state, the amount of air-born propagation from the gradient coil 4013 to structures outside the coil, especially the magnet 4011, is considerably suppressed during a diagnosis. This greatly suppresses the generation of sound (noise) caused when the magnet 4011 vibrates together with the gradient coil 4013 as a vibration source.

The shield 4016 is mounted at the remotest position in a physically allowable range when viewed from the WB coil 4017, i.e., on the inner circumferential surface of the gradient coil 4013 (the distance in this case is equal to a radius r1 in FIG. 8). This mounting position of the shield 4016 is remoter than the optimal mounting position estimated from the prior art when viewed from the WB coil 4017, i.e., a position outside the inner circumferential wall member 4012B of the vessel 4012 (this distance is equal to a radius r2 in FIG. 8) by a distance "r1–r2". As a consequence, the efficiency of the WB coil is properly maintained or improved.

This reason will be described in detail below. As is also obvious from the above reference "Magnetic Resonance in Medicine 19, 180–185 (1991)", positioning the shield 4016 outside the WB coil 4017 amounts to placing a virtual mirror-image coil at the position defined by Rm=Rsh2/Rwb (where Rwb is the inner diameter of the WB coil and Rsh is the inner diameter of the shield) in the opposite direction to the magnetic field generated by the WB coil. A magnetic field that reaches the object P corresponds to this difference "the magnetic field generated by the WB coil–the harmonic magnetic field generated by the mirror-image coil". The strength of the magnetic field generated at a central point by each coil is proportional to about "1/inner diameter of coil".

If, therefore, the shield is placed at the remotest position from the WB coil, the magnetic field generated at the central position by the virtual mirror-image coil can be reduced. As a consequence, the difference "the magnetic field generated by the WB coil–the harmonic magnetic field generated by the mirror-image coil" is increased. Therefore, the magnetic field substantially generated for the object by the WB coil (="the magnetic field generated by the WB coil–the harmonic magnetic field generated by the mirror-image coil") increases. This makes it possible to maintain the RF magnetic field transmission efficiency and MR signal reception efficiency of the WB coil 4017 at levels equal to or higher than those in a conventional apparatus having no silencing mechanism.

Figure 25:
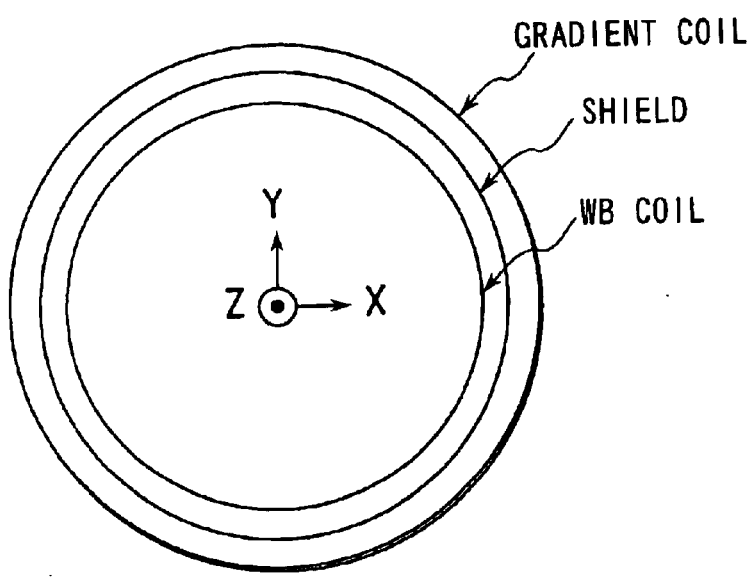
FIG. 25 is a sectional view showing the positional relationship between a WB coil, a coil, and a gradient coil in the prior art.

For information, note that the prior art uses a technique of placing a shield (shield member such as copper foil) exhibiting a sufficiently low loss with respect to resonance frequencies (see, e.g., U.S. Pat. No. 5,367,261), as shown in FIG. 25. This shield is generally grounded. A comparison of this conventional structure will further clarify this embodiment.

The mounting position of the shield 4016 in this embodiment is not limited to the assembly inner circumferential surface of the gradient coil 4012 in the sealed vessel 4012. For example, the shield 4016 may be mounted at an arbitrary position within the space between the inner surface of the inner circumferential wall member 4012B of the vessel 4012 and the assembly inner circumferential surface of the gradient coil 4012 (see a radius difference rd in FIG. 15). Even if, for example, the shield 4016 is bonded to the inner surface of the inner circumferential wall member 4012B, the efficiency of the WB coil 4017 can be improved by at least a degree corresponding to the thickness of the wall member 4012B.

(Embodiment 4-2)

Embodiment 4-2 will be described with reference to FIG. 19. The coil structure of an MRI apparatus according to this embodiment is associated with a so-called "detune" mechanism of putting a WB coil out of a resonance system when an RF coil other than the WB coil is to be used. Assume that in this embodiment, a shield is grounded via a ground lead hermetically extending through a sealed vessel.

Figure 18:
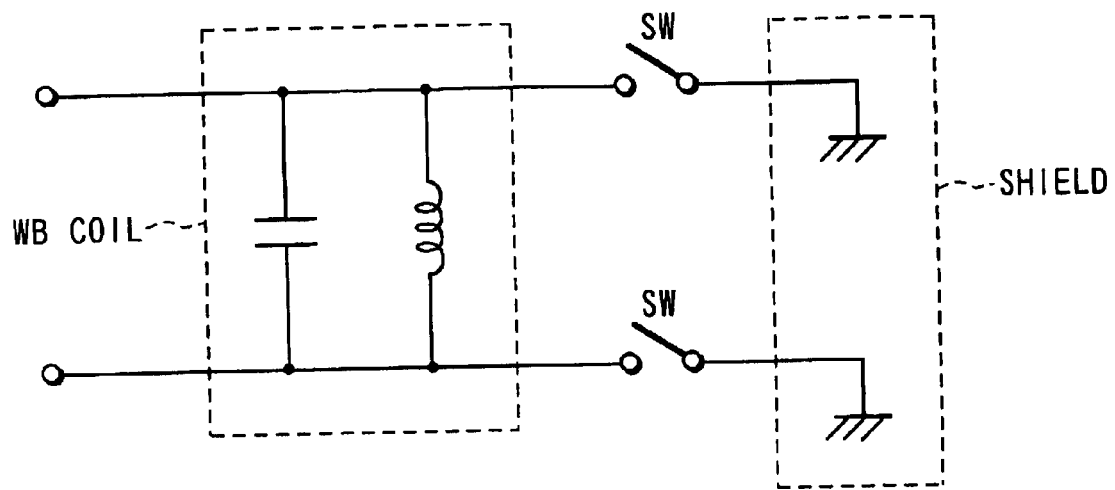
FIG. 18 is a circuit diagram showing a conventional detune circuit.

For a comparison, FIG. 18 shows a conventional detune mechanism, in which a WB coil is electrically connected to a shield, switches SW such as PIN diodes are inserted between them, and several portions of the WB coil are connected to the shield via the switches. Since the shield is grounded, the WB coil is grounded accordingly. With this mechanism, the resonance frequency of a resonance circuit changes to be set in a detuned state.

If this arrangement is directly applied to the coil structure of the present invention, since the shield is placed in the vessel, routing of interconnections for electrically connecting the WB coil to the shield is complicated, and the number of interconnections increases. Since these interconnections extend through the vessel and are connected to the shield, in particular, many parts or large parts are required to keep the airtightness of the vessel, resulting in higher part costs and a complicated structure. In addition, the probability of a decrease in degree of vacuum due to a failure and the like increases.

Figure 19:
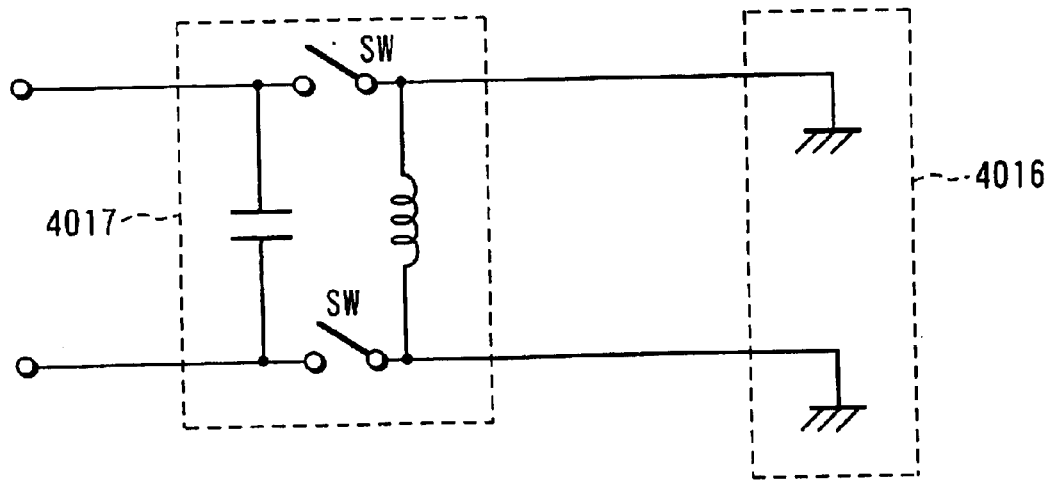
FIG. 19 is a circuit diagram showing a detune circuit according to Embodiment 4-2.

Under the circumstances, in this embodiment, as shown in FIG. 19, switches SW are interposed in series with a WB coil 4017 and opened in accordance with a command from an external control circuit. These switches are, for example, PIN diodes. By opening the switches SW, the resonance frequency of the WB coil 4017 is changed to implement the above detune function.

In this case, as is obvious from FIG. 19 as well, the WB coil 4017 need not be connected to a shield 4016 (ground). This completely eliminates the necessity of a wiring structure in which connection lines are made to extend through a sealed vessel 4012. This makes it possible to avoid an increase in the complexity of the vessel structure, a deterioration in reliability with respect to the maintenance of airtightness, an increase in part cost, and the like described above.

(Embodiment 4-3)

Figure 20:
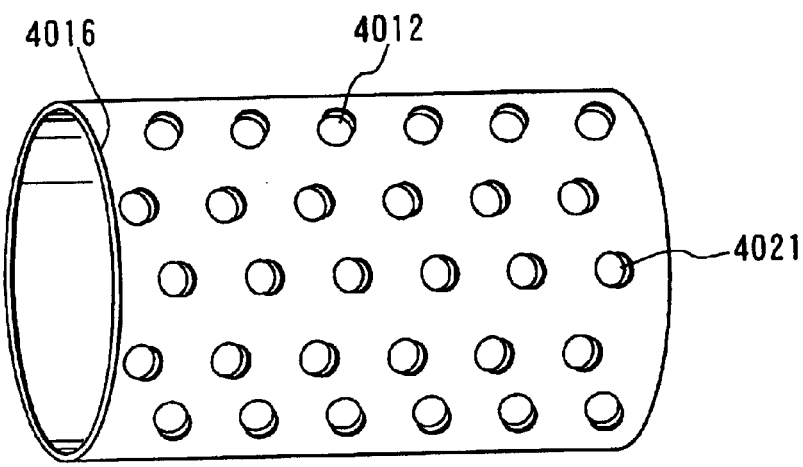
FIG. 20 is a perspective view of a shield according to embodiment 4-3.

Embodiment 4-3 will be described with reference to FIGS. 20 and 21. The coil structure of this embodiment is associated with a deaerating structure used when shield is bonded.

A shield 4016, e.g., the copper foil member, is bonded to, for example, the assembly inner circumferential surface of a gradient coil 4017 in a sealed vessel 4012 with a self-adhesive. Air bubbles are inevitably generated between the shield member and the coil inner surface in this bonding process. As the air pressure in the sealed vessel 4012 is decreased for the purpose of noise silencing, the air bubbles expand. As a result, the shield member may deform or peel off.

To prevent this, a gel-like adhesive can be used instead of the self-adhesive. This can reduce air bubbles.

In this embodiment, the shield 4016 is bonded with an adhesive, and holes and/or slits for deaeration of air bubbles are formed in the shield member as measures against the generation of air bubbles. FIG. 20 shows an example of the shield 4016 having a plurality of holes 4021. FIG. 21 shows an example of the shield 4016 having a plurality of slits 4022. Obviously, the holes 4021 and slits 4022 may be combined. Each hole and slit may take arbitrary shapes. The sizes of holes and slits in a portion of the shield at which a conductor exists is set to be small enough to be electrically negligible, whereas the sizes of holes and slits in a portion of the shield at which no conductor exists are set to be sufficiently large with importance being placed on deaeration of air bubbles.

As a consequence, when the sealed vessel 4012 is evacuated, air bubbles that are generated and exist between the shield 4016 and the inner surface of the gradient coil 4017 can be simultaneously removed via the holes 4021 or slits 4022. This makes it possible to prevent peeling or deformation of the shield which occurs when only an adhesive is used.

In order to achieve the object of this embodiment, the shield 4016 itself may be made of a fibrous or mesh conductive material.

(Embodiment 4-4)

Figure 22:
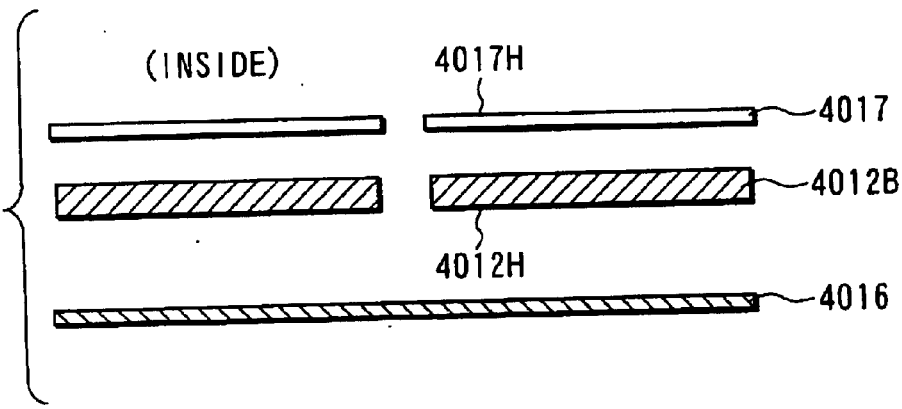
FIG. 22 is a sectional view showing alignment between a WB coil, the inner wall of a vessel, and a shield.
Figure 23:
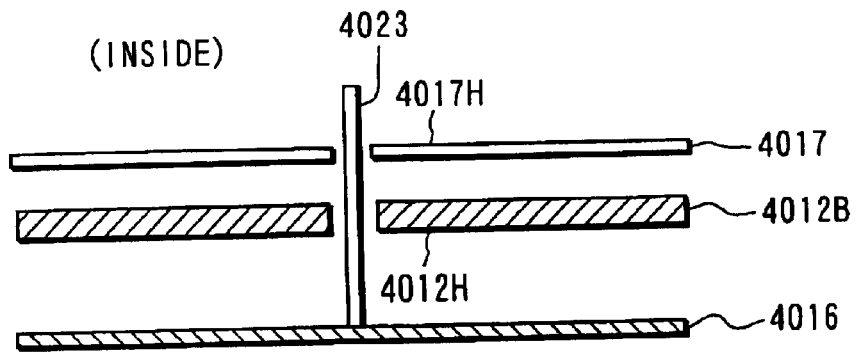
FIG. 23 is a sectional view showing another alignment between the WB coil, the inner wall of the vessel, and the shield.
Figure 24:
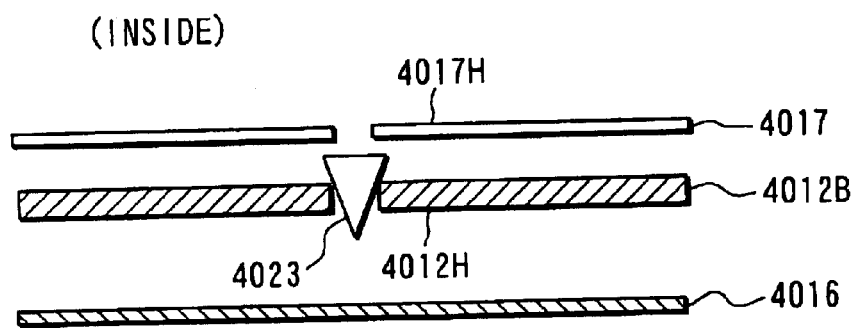
FIG. 24 is a sectional view showing still another alignment between the WB coil, the inner wall of the vessel, and the shield.

Embodiment 4-4 will be described with reference to FIGS. 22 and 23. This embodiment is associated with positioning of a shield and WB coil during mounting operation or maintenance. The resonance frequency of a shield is preferably matched to that of a WB coil. In addition, to ensure sensitivity homogeneity, the shield and WB coil are preferably arranged coaxially with a precision of 1 mm or less.

According to the coil structure in this embodiment, basically, a WB coil 4017 is placed outside a sealed vessel 4012, whereas a shield coil 4016 is placed inside the sealed vessel 4012. This basic arrangement makes it very difficult to position them in mounting operation or maintenance. For this reason, this embodiment uses an alignment adjusting means for facilitating such positioning.

Figure 21:
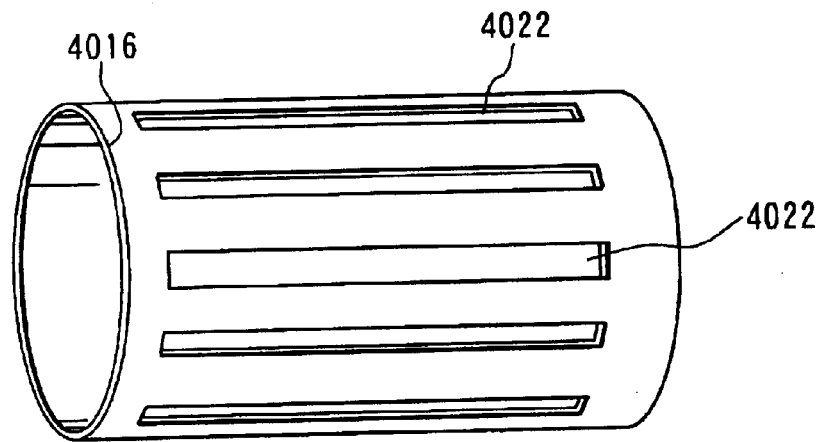
FIG. 21 is a perspective view of another shield according to Embodiment 4-3.

More specifically, as shown in FIG. 21, small holes 4017H and 4012H are formed in the WB coil 4017 and an inner circumferential inner wall 4012B of the vessel 4012. Before the air pressure in the vessel 4012 is decreased, a gage 4023 is inserted into the holes 4017H and 4012H to determine and adjust the position of the WB coil 4017 in the radial direction of the vessel while measuring the distance between the WB coil 4017 an the shield 4016, as shown in FIG. 23. The gage 4023 has a scale. After positioning (position adjustment) of the WB coil 4017, a plug 4024 is inserted into the hole 4012H of the inner circumferential inner wall 4012B, and the air pressure in the vessel 4012 is decreased to a desired value. At this time, since the plug 4024 is drawn into the vessel 4012, it does not come off.

This positioning (position adjustment) allows the shield 4016 and WB coil 4017 to be coaxially arranged with a precision of 1 mm or less, thus ensuring sensitivity homogeneity.

In the above embodiment, a gradient coil 4013 is placed in the vessel 4012 and supported thereon, and the vessel 4012 is supported on a static magnetic field magnet 4011. Instead of this structure, for example, the support structure disclosed in Jpn. Pat. Appln. KOKAI Publication No. 10-118043 (Jpn. Pat. Appln. No. 8-274609) may be used. More specifically, the gradient coil 4013 is placed in the vessel 4012 and supported by a support means (preferably, a support means with an elastic member being interposed) different from the static magnetic field magnet 4011 on the floor (including foundation portions such as beams installed on the floor). In this case, as is apparent, since the support means for the gradient coil 4013 extends through a side wall 4012C of the vessel 4012, this structure includes a member for holding the airtightness between the support means and the vessel 4012.

As a result, vibrations propagating from the gradient coil 4013 to the static magnetic field magnet 4011 by air-born propagation can be reduced more reliably, and vibration components transmitted from the gradient coil 4013 to the static magnetic field magnet 4011 via the structure (the support means for the two components and the floor) are further reduced because the different support means are used for the gradient coil 4013 and static magnetic field magnet 4011 and are spaced apart from each other on the floor. This separate support structures therefore realize a more reliable noise silencing effect. In addition, the effect produced by the above coil structure can also be obtained.

The following are modifications of the above basic arrangement. One modification is an arrangement in which the WB coil 4017 is placed in the vessel 4012. In this arrangement, the shield is set at zero potential to easily allow electrical connection to the WB coil. The other modification is an arrangement in which the inner circumferential wall member 4012B of the vessel 4012 is used as a winding frame for the WB coil 4017. As described above, the WB coil is preferably positioned on the innermost side of the gantry, and hence the use of the inner circumferential wall member as a coil winding frame in this manner is preferable.

(Embodiment 5-1)

Figure 26:
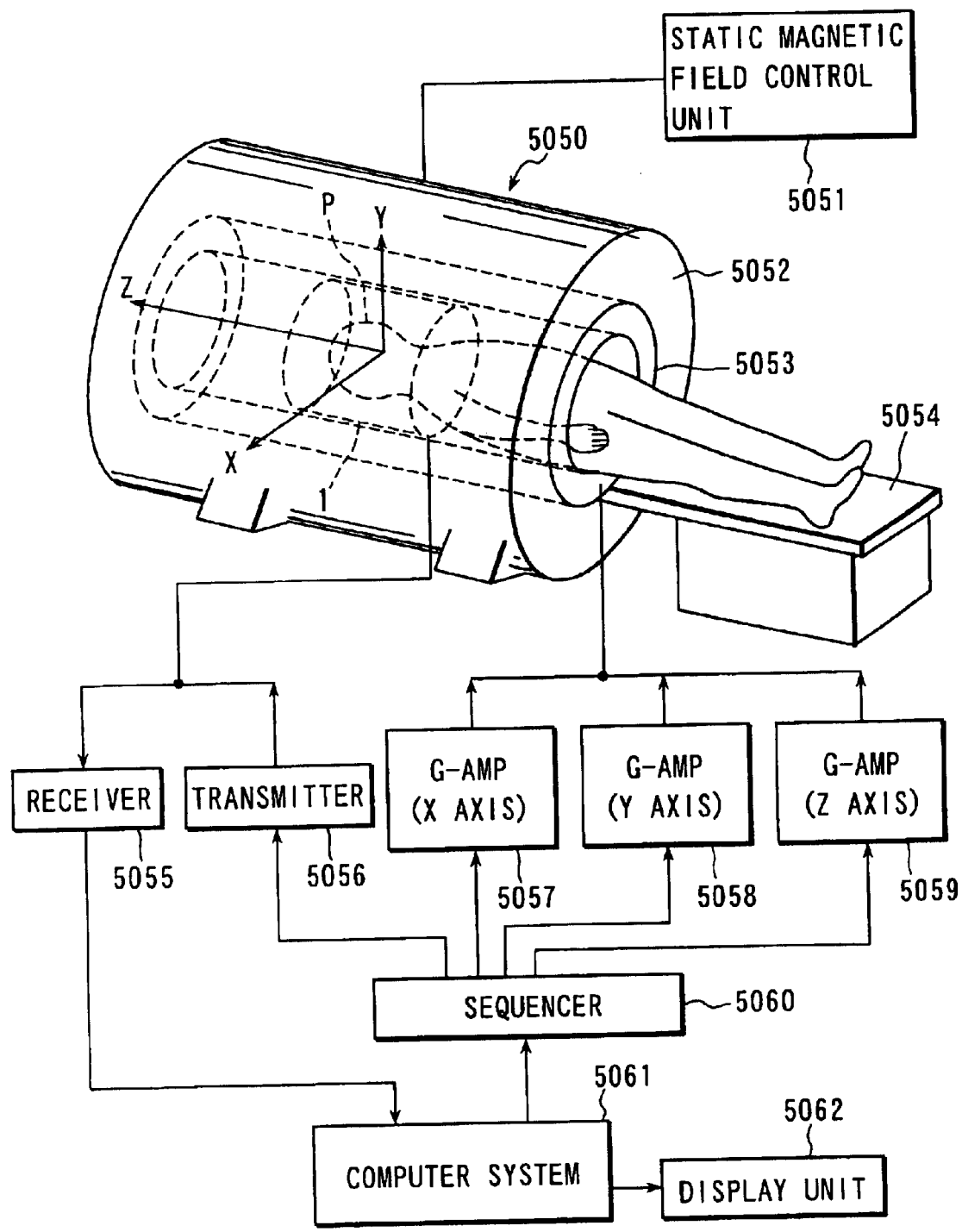
FIG. 26 is a view showing the arrangement of a magnetic resonance imaging apparatus according to Embodiment 5-1.

FIG. 26 is a block diagram showing the schematic arrangement of a magnetic resonance imaging apparatus according to Embodiment 5-1 of the present invention. A static magnetic field magnet 5052, X-axis/Y-axis/Z-axis gradient coil 5053, and RF coil 5001 are arranged in a gantry 5050. The static magnetic field magnet 5052 is formed by using a superconductive coil or normal conductive coil. The X-axis/Y-axis/Z-axis gradient coil 5053 is a coil for generating an X-axis gradient magnetic field Gx, Y-axis gradient magnetic field Gy, and Z-axis gradient magnetic field Gz. The RF coil 5001 is used to generate a high-frequency pulse as a selective excitation pulse for selecting a slice and detect a magnetic resonance signal (MR signal) generated by magnetic resonance. An object P to be examined, which is placed on the top of a bed 5054, is inserted into an imaging area (a spherical area in which an imaging magnetic field is formed; a diagnosis can be performed only in this area) in the gantry 5050.

The static magnetic field magnet 5052 is driven by a static magnetic field control unit 5051. The RF coil 5001 is driven by a transmitter 5056 in RF transmission, and is coupled to a receiver 5055 in detecting a magnetic resonance signal. The X-axis/Y-axis/Z-axis gradient coil 5053 is driven by an X-axis gradient magnetic field power supply 5057, Y-axis gradient magnetic field power supply 5058, and Z-axis gradient magnetic field power supply 5059.

The X-axis gradient magnetic field power supply 5057, Y-axis gradient magnetic field power supply 5058, Z-axis gradient magnetic field power supply 5059, and transmitter 5056 are driven by a sequencer 5060 to generate the X-axis gradient magnetic field Gx, Y-axis gradient magnetic field Gy, Z-axis gradient magnetic field Gz, and high-frequency (RF) pulse in accordance with a predetermined pulse sequence. In this case, the X-axis gradient magnetic field Gx, Y-axis gradient magnetic field Gy, and Z-axis gradient magnetic field Gz are mainly used as, for example, a phase encoding gradient magnetic field Ge, read gradient magnetic field Gr, and slicing gradient magnetic field Gs, respectively. A computer system 5061 drives/controls the sequencer 5060 and generates a tomographic image of the object by loading the magnetic resonance signal received by the receiver 5055 and performing predetermined signal processing for the signal. The computer system 5061 then displays the tomographic image on a display unit 5062.

Figure 27:
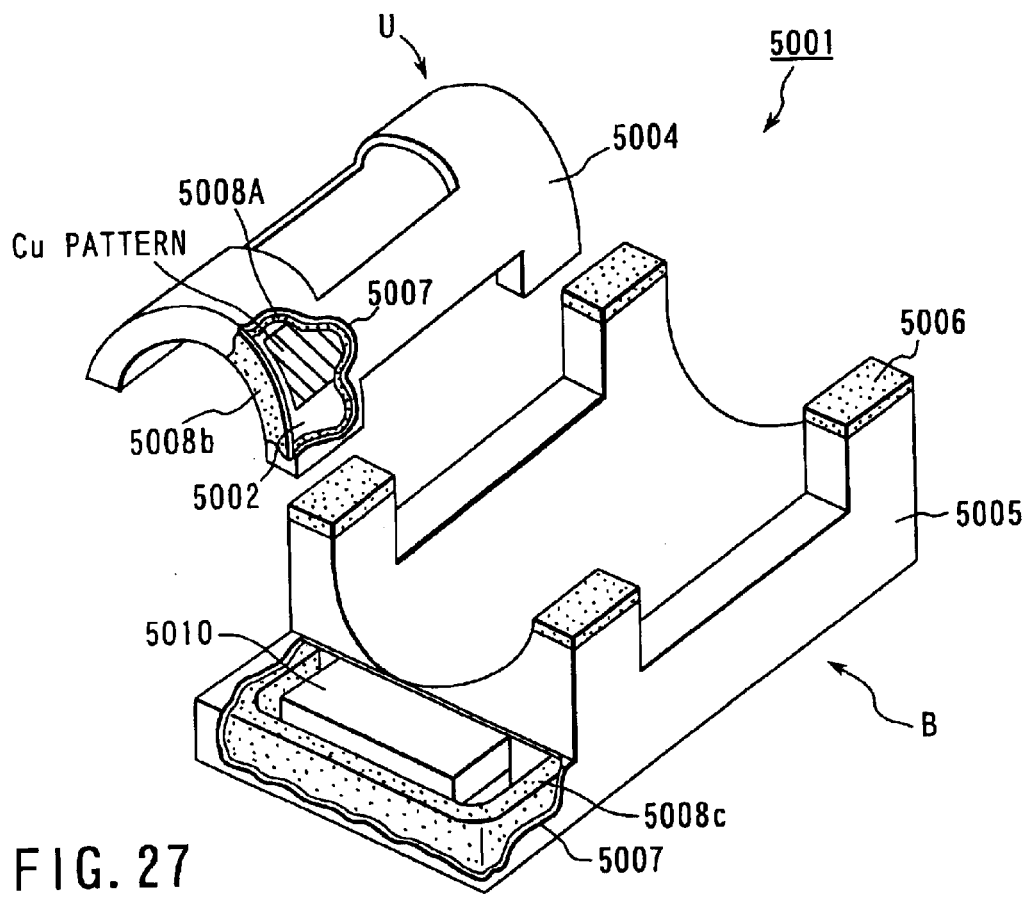
FIG. 27 is a perspective view showing the components of an RF coil in Embodiment 5-1.
Figure 28:
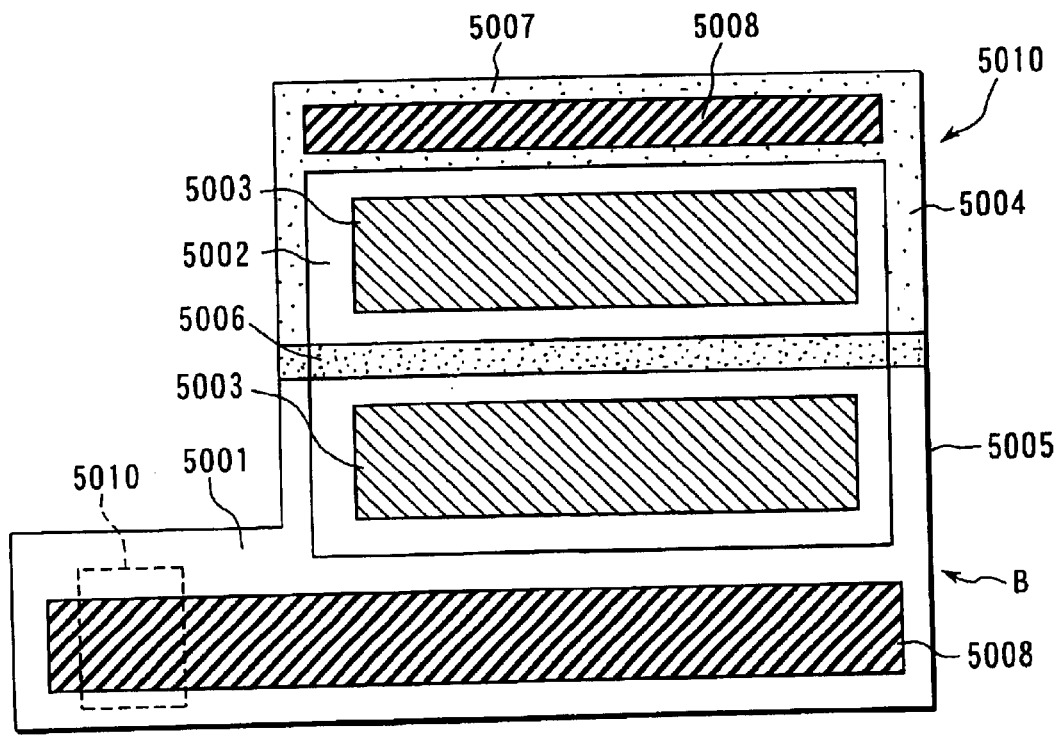
FIG. 28 is a cross-sectional view of the RF coil in Embodiment 5-1.

FIG. 27 shows the RF coil used in the magnetic resonance imaging apparatus according to Embodiment 5-1. FIG. 28 is a longitudinal sectional view of the RF coil. As is obvious from FIG. 27, the RF coil 5001 is roughly comprised of an upper structural member U and lower structural member B which can be separated from each other. These members are disposed in an object insertion space (bore) in the magnetic resonance imaging apparatus. When the RF coil is to be used, an imaging target region (a body part of the object, e.g., the head, or the whole body) is placed on the lower structural member B, and the upper structural member U is jointed to the lower structural member B. With this operation, the imaging target region is housed in the cylindrical space defined by the upper structural member U and lower structural member B. In this state, the RF-coil 5001 is driven by the transmitter 5056 to perform RF transmission and reception for magnetic resonance imaging.

The upper structural member U of the RF coil 5001 incorporates a spool 5002, conductive pattern 5003, vibration suppression member 5007, and sound absorption member 5008. These components are covered with a cover 5004. As is apparent from FIG. 28, the lower structural member B has a spool 5002, conductive pattern 5003, vibration suppression member 5007, and sound absorption member 5008 so as to oppose the upper structural member U. These components are covered with a cover 5005. The lower structural member B also has buffer members 5006 at the joints for the upper structural member U. An electric circuit unit 5010 including a capacitor forming a resonance circuit together with the RF receiving coil 5001 is placed at an end of the bottom portion of the lower structural member B.

A problem in the RF coil 5001 placed in the gradient magnetic field application area is that an eddy current is generated in the conductive pattern 5003. This problem becomes noticeable in fast imaging which accompanies an increase in gradient magnetic field strength and fast switching. When an eddy current flows in a static magnetic field, Lorents force is generated in the conductive pattern 5003, and the large vibrations are produced. The following measures are taken to reduce noise from the RF coil 5001 according to the present invention, assuming that the noise is mainly caused by the vibrations of the conductive pattern 5003. In some case, the conductive portion of the electric circuit unit 5010 vibrates due to the Lorents force as in the case of the conductive pattern 5003 to make noise. This embodiment takes measures against this noise as well.

(1) Sound Insulating Structure between Spool and Cover

Figure 29:
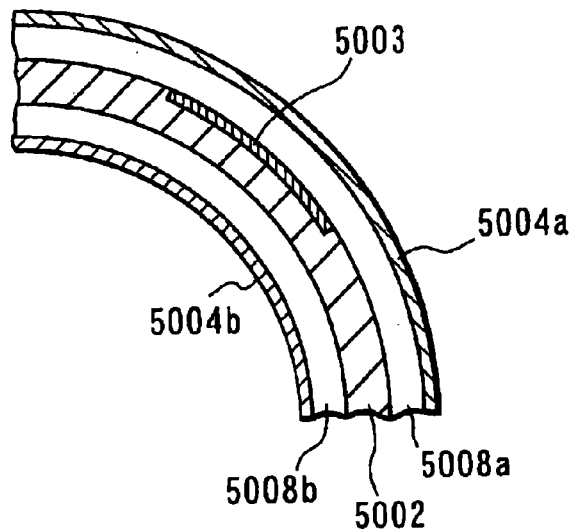
FIG. 29 is a partial sectional view of the RF coil in Embodiment 5-1.

FIG. 29 is a longitudinal sectional view showing part of a structure near the conductive pattern 5003 forming the RF coil 5001. The spool 5002 is, for example, an insulating winding frame made of fiber reinforced plastics (FRP). The conductive pattern 5003 formed by, for example, a copper wire (Cu) in the form of a thin plate is bonded to the outer surface of the spool 5002. As is obvious from FIGS. 27 and 28 as well, the spool 5002 and conductive pattern 5003 extend along the longitudinal direction of the cylinder.

As shown in FIG. 29, a sound insulating member 5008a is interposed between an outer cover 5004a and the spool 5002 including the conductive pattern 5003. In addition, a sound insulating member 5008b is interposed between the spool 5002 and an inner cover 5004b.

With this structure, even if the conductive pattern 5003 vibrates to make noise, the noise is absorbed by the sound insulating members 5008a and 5008b and does not leak out via the covers 5004a and 5004b. Therefore, proper sound insulation can be realized within the covers 5004a and 5004b. As a consequence, noise in the object insertion space can be reduced. Note that any material that can absorb sounds, e.g., a foamed material, can be used for the sound insulating members 5008a and 5008b.

(2) Vibration Suppressing Structure at Cover Joint

Figure 30:
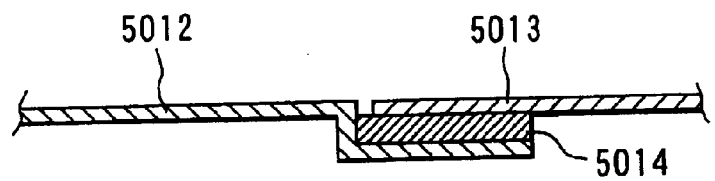
FIG. 30 is a sectional view of a joint portion of the cover of the RF coil in Embodiment 5-1.

FIG. 30 is a sectional view showing the structure of the joint between parts constituting a cover. The cover surface has a joint like the one shown in FIG. 30 (not shown in FIGS. 27 and 28) between a cover part 5012 and another cover part 5013. At this joint, the cover parts 5012 and 5013 are connected to each other via a buffer member (cushion member or vibration absorbing material) 5014. In addition, as shown in FIGS. 27 and 28, the buffer members 5006 are inserted in the joints between the cover 5004 of the upper structural member U and the cover 5005 of the lower structural member B.

With this structure, vibrations at the joints between the cover parts 5012 and 5013 can be suppressed by the buffer member 5014, and vibrations at the joints between the cover 5004 of the upper structural member U and the cover 5005 of the lower structural member B can be suppressed by the buffer members 5006. Therefore, noise (to be referred to as a chatter sound) caused by vibrations at these joints can be reduced. As a consequence, noise in the object insertion space can be reduced.

Figure 31:
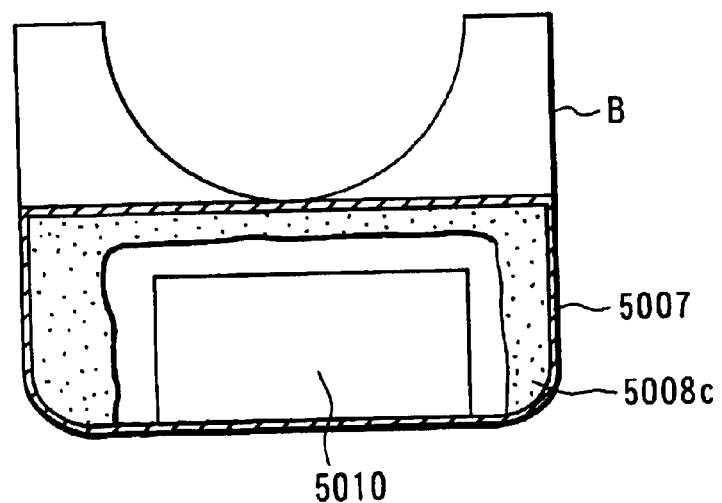
FIG. 31 is a view showing an antivibration structure for an electric part of the RF coil in Embodiment 5-1.

(3) Sound Insulating Structure in Overall Cover Sound insulating means in the cover are preferably provided at arbitrary proper portions in addition to the portion between the spool and the cover. For example, as shown in FIG. 31, a sound insulating member 5008c is placed in a space near the electric circuit unit 5010 or the like. Like the conductive pattern 5003, a conductive portion of the electric circuit unit 5010 may vibrate due to the Lorents force to make noise. The sound insulating member 5008c can properly reduce the noise in this case.

(4) Vibration Suppressing Structure in Overall Cover

If the vibration suppression member 5007 is provided for almost the entire wall surfaces in the covers 5004 and 5005 as shown in FIG. 28, vibrations that produce noise can be reliably reduced. This structure is therefore preferable. If local, direct vibration suppression and sound insulation measures against a vibration source such as the conductive pattern 5003 will suffice, vibration suppression means for the entire inner surface of the cover or a sound insulating means like that described in (3) may be withheld. In other words, the above four sound insulating/vibration suppressing structures may be used in combination with each other, as needed.

As described above, in Embodiment 5-1, assuming that noise from the RF coil 5001 is caused by the vibrations of the conductive pattern 5003, (1) the sound insulating structure between the spool and the cover, (2) the vibration suppressing structure at the joint of the cover, (3) the sound insulating structure in the overall cover, and (4) the vibration suppressing structure in the overall cover are used in combination with each other, as needed, as measures to reduce the vibrations.

The noise reducing effect by the silencing mechanism of, e.g., housing the gradient coil in the sealed vessel can be effectively exploited, and noise from the RF coil 5001 can be reduced, thereby greatly improving the silencing effect in the object insertion space.

(Embodiment 5-2)

Embodiment 5-2 is associated with a whole body RF coil. This RF coil is designed to be embedded in a wall surface in an object insertion space (e.g., a cylindrical space), and differs from that in Embodiment 1 in that it has no cover outside the central axis of the cylinder.

Figure 32:
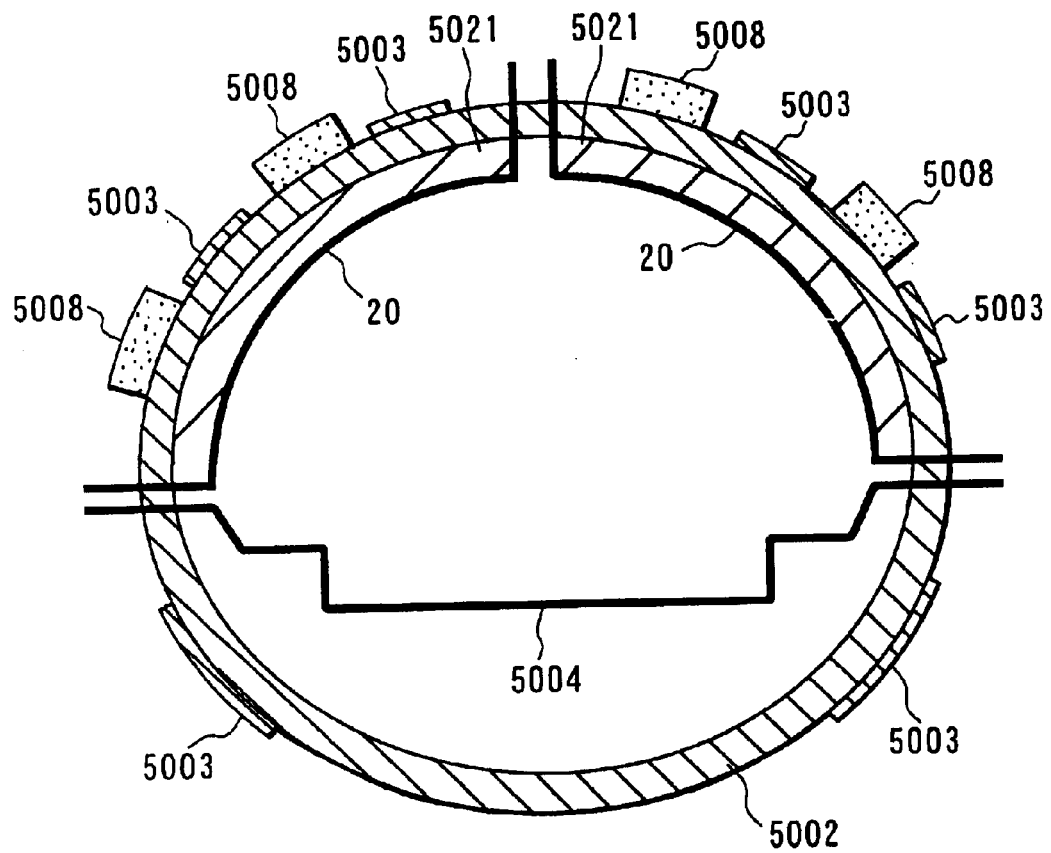
FIG. 32 is a cross-sectional view of an RF coil according to Embodiment 5-2.
Figure 33:
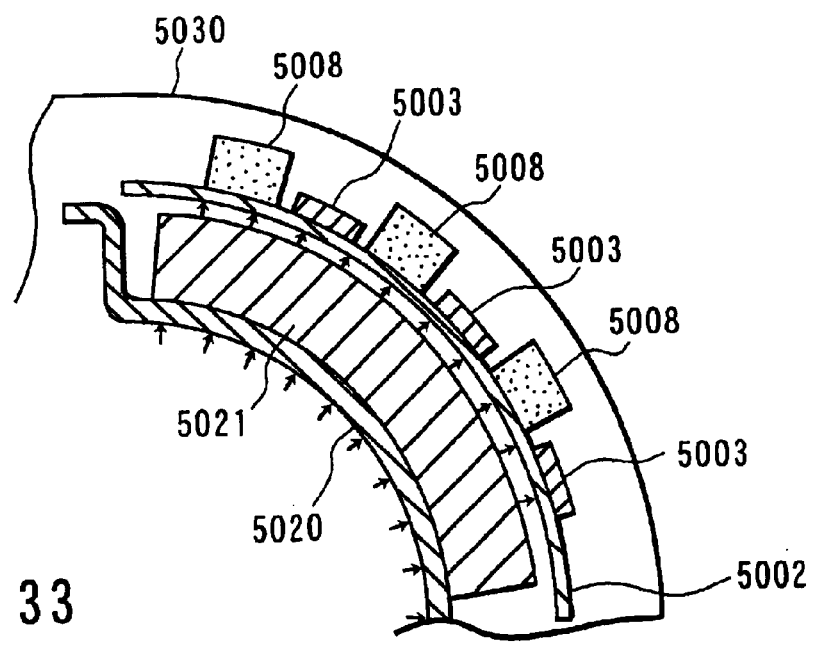
FIG. 33 is a partial sectional view of the RF coil according to Embodiment 5-2.

FIG. 32 is a longitudinal sectional view showing the overall structure of an RF coil according to Embodiment 5-2. FIG. 33 is an enlarged longitudinal sectional view of part of this coil. Referring to FIG. 32, a spool 5002 is an insulating winding frame made of fiber-reinforced plastics (FRP) as in Embodiment 5-1. A conductive pattern 5003 formed by a copper wire (Cu) in the form of a thin plate is bonded to the outer surface of the spool 5002. The spool 5002 and conductive pattern 5003 extend along the longitudinal direction of the cylinder. The spool 5002 is fixed to a wall surface in the object insertion space.

As shown in FIG. 33, a reference numeral 5021 denotes a buffer member (cushion member or vibration absorbing material); and 5020, an inner cover. The buffer member 5021 has a thickness slightly larger than the distance between the spool 5002 and the inner cover 5020 attached to a wall surface 5030 in the object insertion space (bore). With this structure, when the inner cover 5020 is to be attached to the wall surface 5030 in the object insertion space (bore), the buffer member 5021 is deformed and properly pressed against the surface of the spool 5002 owing to the force from the inner cover 5020. Even if the conductive pattern 5003 of the spool 5002 vibrates due to the Lorents force described above or the like, this buffer member 5021 absorbs the vibrations. Therefore, appropriate sound insulation is provided on the inner circumferential side of the inner cover 5020 and spool 5002. In addition, since a sound insulating member 5008 is provided on the outer circumferential side of the spool 5002, even if the conductive pattern 5003 vibrates to make noise, the noise is absorbed by the sound insulating member 5008, thereby further improving the sound insulating effect.

According to Embodiment 5-2 described above, as in Embodiment 5-1, the noise reducing effect by the silencing mechanism of, e.g., housing the gradient coil in the sealed vessel can be effectively exploited, and noise from an RF coil 5001 can be reduced, thereby greatly improving the silencing effect in the object insertion space. In addition, in Embodiment 5-2, as the contact area between the buffer member 5021 and the spool 5002 increases, the sound insulating effect improves. This embodiment is therefore suited for a relatively large RF coil such as a whole body RF coil.

(Embodiment 6)

Figure 34:
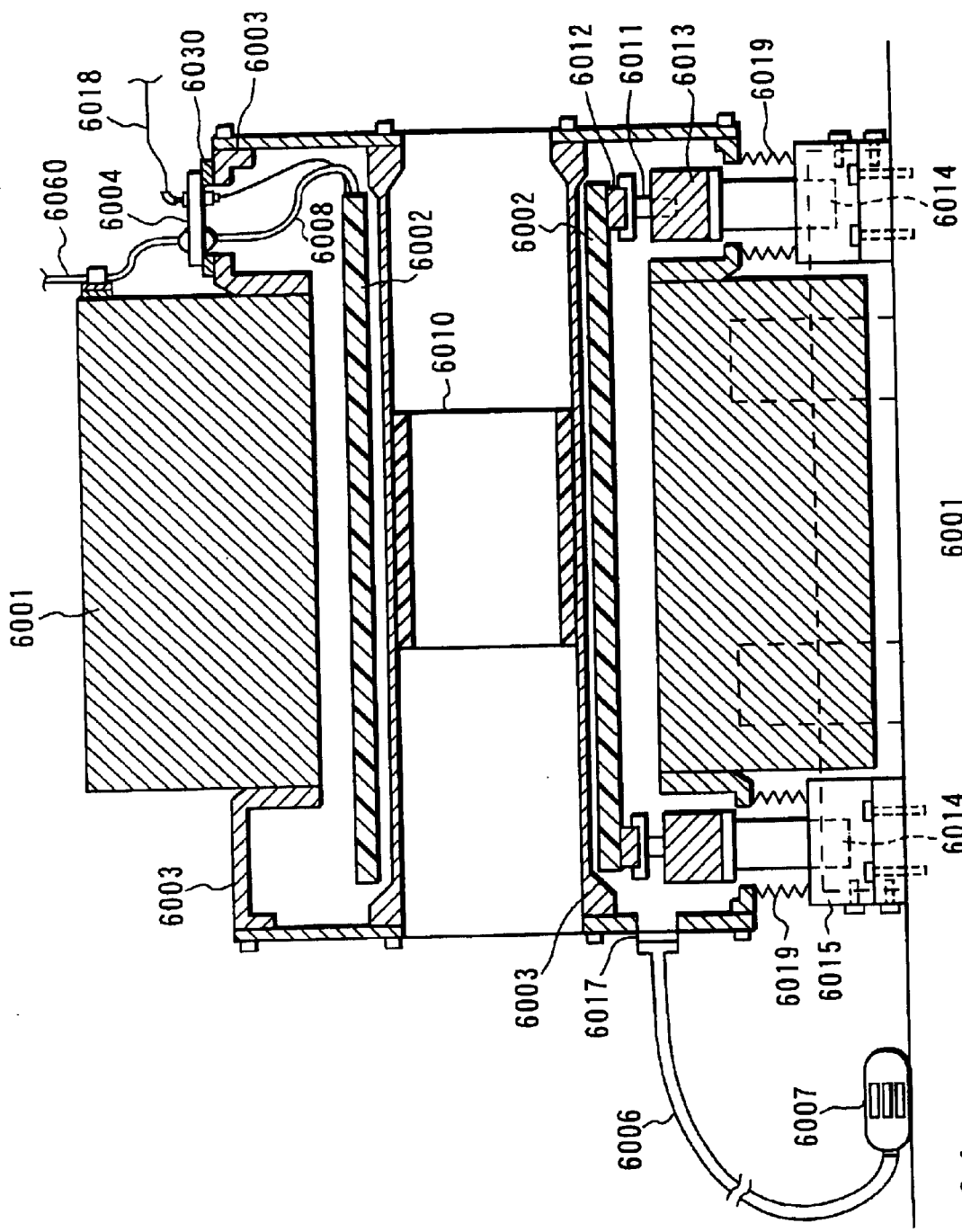
FIG. 34 is a longitudinal sectional view of a gantry in Embodiment 6.

FIG. 34 is a longitudinal cross-sectional view of the gantry of a magnetic resonance imaging apparatus according to Embodiment 6. Reference numeral 6001 denotes a cryostat of a superconductive magnet, in which a superconductive coil that is set in a superconductive state at an extremely low temperature is housed. This superconductive coil gives an imaging area a homogeneous static magnetic field. The static magnetic field strength required for normal MR imaging is about 0.1 to 1 tesla. The spatial homogeneity of a static magnetic field is required to be several 10 ppm or less. The imaging area has a spherical shape having a diameter of about 50 cm.

Reference numeral 6002 denotes a gradient coil housed in a sealed vessel 6003 including the inner cylinder of the cryostat 6001 as a component. The gradient coil 6002 serves to give a main magnetic field a linear gradient so as to determine an arbitrary imaging slice or add positional information to an RF signal from an object to be examined. In general, the gradient coil 6002 is constituted by three independent coil sets Gx, Gy, and Gz for generating gradient magnetic fields in the orthogonal x-, y-, and z-axis directions For example, the gradient coil 6002 of this embodiment is an ASGC (Actively Shield Gradient Coil). The actively shield gradient coil is comprised of a main coil for generating a gradient magnetic field and an active shield coil which is placed outside the main coil to generate a magnetic field in the opposite direction to the gradient magnetic field generated by the main coil so as to prevent it from leaking out of the gradient coil.

The gradient coil 6002 housed in the sealed vessel 6003 is connected to an external power supply via an inner cable 6008 in the sealed vessel 6003 and an outer cable 6060. The inner cable 6008 and outer cable 6060 are coupled to each other via a coupling plate 6004 attached to the sealed vessel 6003. Reference numeral 6030 denotes a mount plate for the sealed vessel 6003. The coupling plate 6004 is attached to the mount plate 6030.

The gradient coil 6002 is mounted on a column 6013 via an antivibration rubber member 6012 and position adjusting bolt 6011. The antivibration rubber member 6012 made of an elastic material may be an air damper or oil damper. The antivibration rubber member 6012 damps the solid vibrations of the gradient coil 6002. This can effectively prevent the solid vibrations from propagating to the column 6013 via the position adjusting bolt 6011. The position adjusting bolt 6011 serves to finely adjust the position of the gradient coil 6002. The column 6013 is mounted on a base 6015 via a shaft 6014.

A vacuum tube 6006 and vacuum pump 6007 are connected to the sealed vessel 6003 via an O-ring 6017. A vacuum is kept in the sealed vessel 6003 by suction operation of the vacuum pump 6007. The degree of vacuum may be high enough to prevent air-born propagation of vibration sounds via the gradient coil 6002. More specifically, a degree of vacuum of several hundred pascals will suffice. A sound insulating effect is expressed as follows. Let P1 be the degree of vacuum (pascal) of the sealed vessel 6003:

$$S=20\log_{10}(P1/1.01325\times 10^5) \text{ (decibel:dB)}$$

If the degree of vacuum in the sealed vessel 6003 is 1,000 pascals, a sound insulating effect of about 40 dB can be obtained.

A coupler and tube 60018 which cool the heat generated by the gradient coil 6002 with water are connected to the sealed vessel 6003. A metal (bellows) 6019 is placed at a position on the bottom portion of the sealed vessel 6003 which corresponds to the shaft 6014. This ensures a predetermined degree of vacuum and disassembly/assembly performance.

An RF coil 6010 is fixed inside the cylindrical gradient coil 6002. This RF coil 6010 is a whole body RF coil, which transmits a high-frequency (RF) magnetic field to the object, and receives a magnetic resonance (MR) signal from the object.

As described above, in the magnetic resonance imaging apparatus, the gradient coil 6002 is housed in the sealed vessel 6003, and the gradient coil 6002 is connected to the base 6015 via a vibration absorber (damper), thereby suppressing the propagation of solid vibrations.

Figures 35, 36:
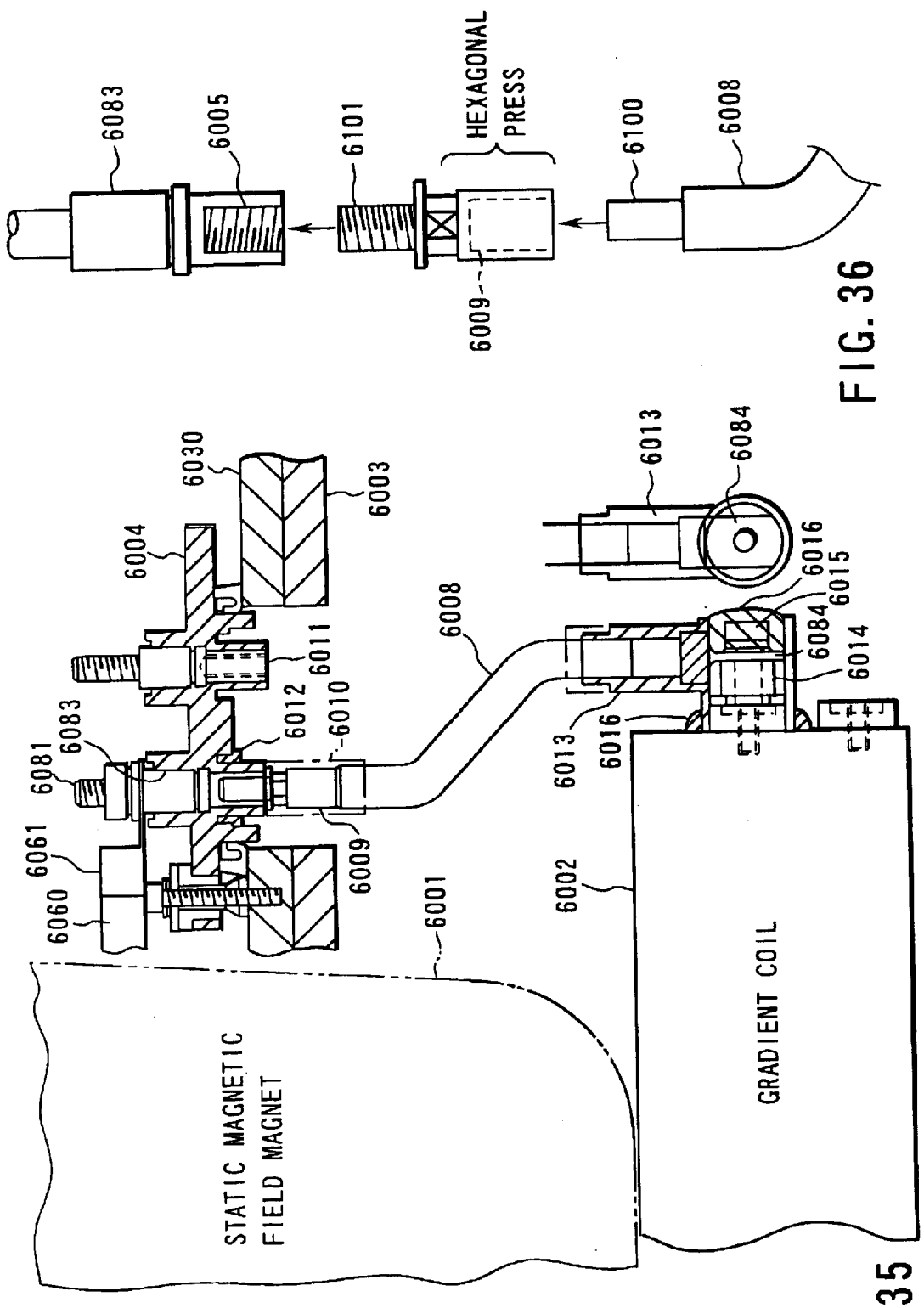
FIG. 35 is a sectional view of a cable coupling plate in FIG. 34.
FIG. 36 is a view showing the components of a cable terminal in FIG. 35.

FIG. 35 is a view showing the terminal connection of cables inside/outside the sealed vessel housing the gradient coil and the connection of a cable to the gradient coil in the sealed vessel.

A terminal 6061 of the cable 6060 extending from a power supply (not shown) is fastened to an axial conductive portion 6082 of the coupling plate 6004 with a screw. The conductive portion 6082 is connected to a relay conductive portion 6083 placed in the coupling plate 6004. As is obvious from FIG. 34, the relay conductive portion 6083 extends through the coupling plate 6004 from the upper surface to the lower surface and partly protrudes therefrom. A terminal 6009 of the cable 6008 is connected to this protruding portion. The other terminal 6084 of the cable 6009 is connected to a terminal of the gradient coil 6002.

With regard to the terminal connection structure of the cable 6008 connecting the gradient coil 6002 to the coupling plate 6004 in the sealed vessel 6003, the magnetic resonance imaging apparatus of this embodiment has the first and second characteristic features to be described below.

An arrangement associated with the connection of the cable 6008 to the coupling plate 6004 will be described first.

As shown in FIG. 36, one end of the cable 6008 is inserted in the cable terminal 6009 in the form of a socket. In this state, the cable terminal 6009 is compressed from six directions. As a result, the cable terminal 6009 deforms to have a hexagonal cross-section. By performing contact bonding of the cable terminal 6009 by compressing it into a hexagonal shape from six directions, the deformation of the cable terminal 6009 can be suppressed as compared with a case where contact bonding is performed from two directions as in general operation. A screw hole S is formed in the relay conductive portion 6083 mounted on the coupling plate 6004, and the cable terminal 6009 compressed in a hexagonal shape is directly screwed into the screw hole S. This can prevent the screw from loosening due to the vibrations of the cable 6008. As described above, as shown in FIG. 35, the cable 6060 placed outside the sealed vessel 6003 is electrically connected to the cable 6008 placed in the sealed vessel 6003.

After the terminal connection portion between the relay conductive portion 6083 and the cable terminal 6009 is insulated by covering it with a heat-shrinkable tube (thermosetting resin) 6010 so as to completely cover an exposed conductive portion, a silicone resin 6012 or the like is potted into a groove formed around the relay-conductive portion 6083 of the coupling plate 6004 in advance. With this process, proper, reliable insulation can be performed, which hardly causes a difference (manufacturing error) depending on the worker in the manufacturing process.

An arrangement associated with the connection of the cable 6008 to the gradient coil 6002 will be described next. First of all, the cable terminal 6084 connected to the cable 6008 by contact bonding is covered with an insulating member 6013 like the one shown in FIG. 35. This insulating member 6013 is made 6f a resin or the like. The cable terminal 6084 is exposed inside the cylindrical portion. This portion is fixed to a terminal portion of the gradient coil 6002 via a spacer 6014 with a screw 6015. In addition, silicone resin 6016 is potted in the contact portion between the insulating member 6013 and the gradient coil 6002. In addition, the silicone resin 6016 is potted in a cylindrical recess portion of the insulating member 6013 such that the screw 6015 is completely embedded in the resin. With this process, proper, reliable insulation can be performed, which hardly causes a difference (manufacturing error) depending on the worker in the manufacturing process as in the case of the connection of the cable terminal to the relay conductive portion 6083.

In addition, by selecting a highly curable material exhibiting a high adhesive property with respect to the insulating member 6013 for the silicon resin 6016, loosening of the screw 6015 due to vibrations and the like can be prevented.

As a coat for the cable 6008, a material exhibiting a high adhesive property with respect to a potting agent and high flexibility (e.g., silicone resin) is preferably selected. This improves the insulating property and reduces vibrations due to the Lorents force generated in the cable, thus improving the sound insulating effect.

According to this embodiment described above, the connecting portion between the relay conductive portion 6083 of the coupling plate 6004 and the terminal 6009 of the cable 6008 and the connecting portion of the cable 6008 to the gradient coil 6002 can be properly and reliably insulated without causing any operation error in the manufacturing process.

Note that the present invention may be applied to a magnetic resonance imaging apparatus having an apparatus arrangement in which a gradient coil is not housed in a sealed vessel or an apparatus arrangement in which no vibration absorbing unit is provided for a gradient coil. The static magnetic field generating scheme to be used is not limited to a scheme using a superconductive coil. In addition, obviously, the gradient coil to be used is not limited to an actively shield gradient coil.

(Seventh Embodiment)

The basic arrangement of a magnetic resonance imaging apparatus will be described first with reference to FIG. 37. The magnetic resonance imaging apparatus includes a gantry 14 having an measurement space in which an object subjected to image diagnosis is to be inserted/placed, a bed 18 disposed adjacent to the gantry 14, and a control processing section (computer system) for controlling the operations of the gantry 14 and bed 18 and processing MR signals. Typically, a substantially cylindrical measurement space extends through the inner central portion of the gantry 14. With regard to this cylindrical measurement space, the axial direction is defined as a Z direction, and an X direction (horizontal direction) and Y direction (vertical direction) perpendicular to the Z direction are defined.

The gantry 14 has a static field magnet 1 which receives a current supplied from a static field power supply 2 and generates a static field H0 in the measurement space. This static field magnet 1 is typically formed by a superconductive magnet. The static field magnet 1 has a substantially cylindrical shape as a whole. A gradient field coil 3 is placed in the bore of the static field magnet 1. The gradient field coil 3 is made up of three coils 3x, 3y, and 3z which independently receive currents supplied from a gradient field power supply 4 and generate X-, Y-, and z-axis gradient fields, respectively. The gradient field coil 3 is housed in a sealed vessel in which a vacuum or a similar state is maintained by a vacuum pump.

A high-frequency (RF coil) 7 is placed inside the gradient field coil 3. A transmitter 8T and receiver 8R are connected to the RF coil 7. The transmitter 8T supplies, to the RF coil 7, a current pulse that oscillates at a Larmor frequency to excite nuclear magnetic resonance (NMR) under the control of a sequencer 5. The receiver 8R receives an MR signal (high-frequency signal) via the RF coil 7, and performs various kinds of signal processes to form a corresponding digital signal.

The sequencer 5 is set under the control of a controller 6 for controlling the overall apparatus. An input device 13 is connected to the controller 6. The operator can select a desired pulse sequence from a plurality of kinds of pulse sequences in the spin echo method (SE) and echo-planar imaging method (EPI) through the input device 13. The controller 6 sets the selected pulse sequence in the sequencer 5. The sequencer 5 controls the application timings of gradient fields in the X-axis, Y-axis, and Z-axis directions, their strengths, the application timing of a high-frequency magnetic field, amplitude, duration, and the like in accordance with the set pulse sequence.

An arithmetic unit 10 inputs the MR signal (digital data) formed by the receiver 8R, and performs processes, e.g., arrangement of measured data in a two-dimensional Fourier space formed in the internal memory and Fourier transform for image reconstruction, to generate image data and spectrum data. A storage unit 11 stores computed image data. A display unit 12 displays an image.

An embodiment of the magnetic resonance imaging apparatus having the above basic arrangement will be described next.

Figure 38:
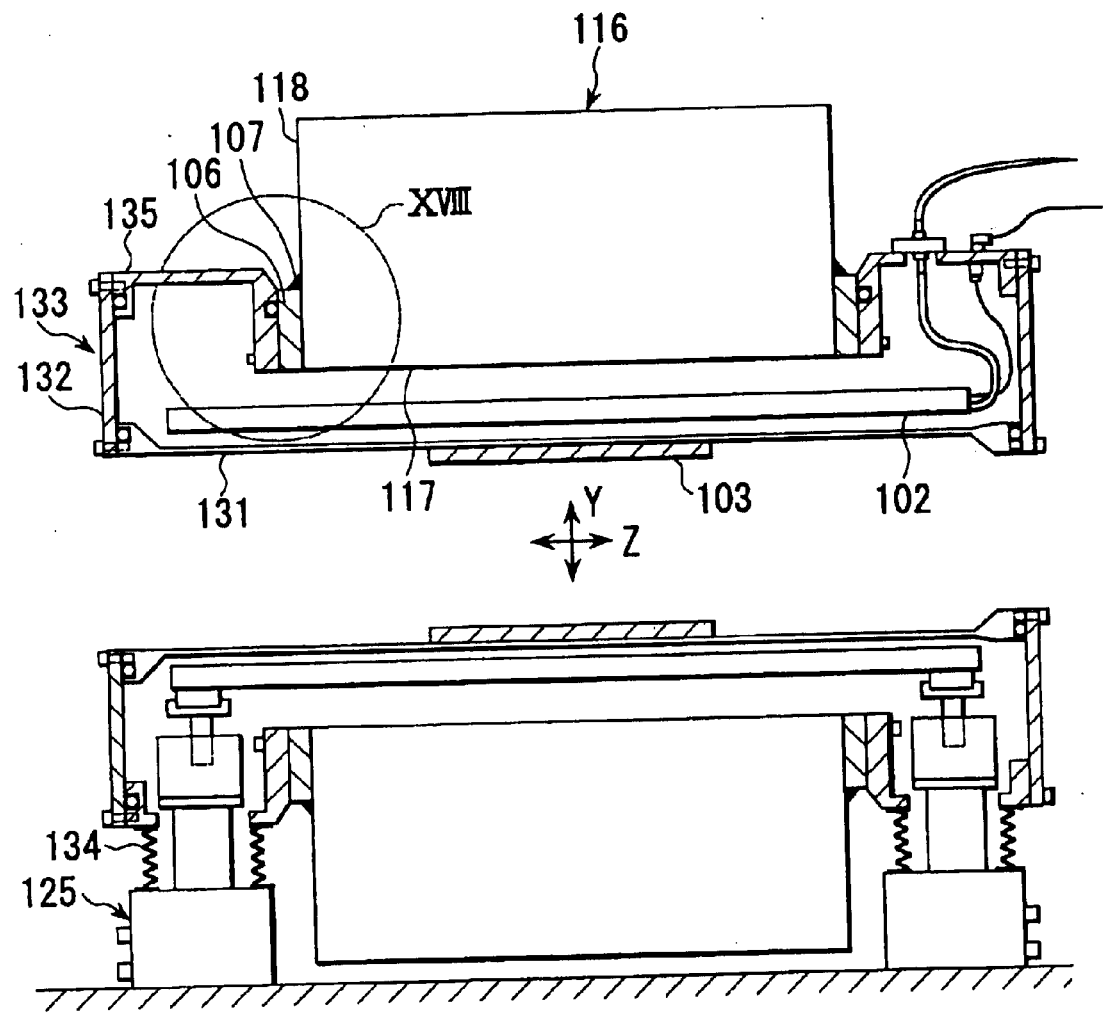
FIG. 38 is a longitudinal sectional view of a gantry according to the seventh embodiment.

FIG. 38 is a longitudinal sectional view of the gantry of the magnetic resonance imaging apparatus according to the seventh embodiment. A gradient field coil 102 may be of a non-shield type or active shield type. The gradient field coil 102 has x, y, and z coils as its windings. These x, y, and z coils are housed in a cylindrical bobbin.

The gradient field coil 102 having a substantially cylindrical shape is supported on a heavy, concrete gantry base 125 placed on the floor. The gradient field coil 102 is housed in a sealed vessel 133. The sealed vessel 133 has a liner 131 having a substantially cylindrical shape and forming the inner wall of the vessel, and a vacuum cover 132. The back surface of the sealed vessel 133 is closed with an inner wall 117 of a cryostat 116 for setting a static field magnet (superconductive coil in this case) in a cryogenic environment. A side wall 118 of the cryostat 116 is joined to the vacuum cover 132 with a joint plate 135. The sealed vessel 133 is coupled to the gantry base 125 via a vacuum bellows 134 to keep the sealed vessel 133 airtight.

The air in the sealed vessel 133 is exhausted by a vacuum pump to keep a vacuum or a similar state in the sealed vessel 133. This prevents air-born propagation of noise originating from the gradient field coil 102.

An RF coil 103 is placed on the inner surface of the liner 131. A high-frequency magnetic field is applied to an object via the RF coil 103, and an MR signal from the object is received.

In this arrangement, vacuum leakage tends to occur in the connection portion between the side wall 118 of the cryostat 116 and the joint plate 135. To prevent this vacuum leakage, an O-ring 108 for vacuum sealing is clamped between the side wall 118 of the cryostat 116 and the joint plate 135. However, the surface precision of the side wall 118 of the cryostat 116 is not very high. For this reason, the contact precision between the side wall 118 of the cryostat 116 and the O-ring 108 is not very high, and hence the sealing performance of the O-ring 108 is not sufficient.

Figure 39:
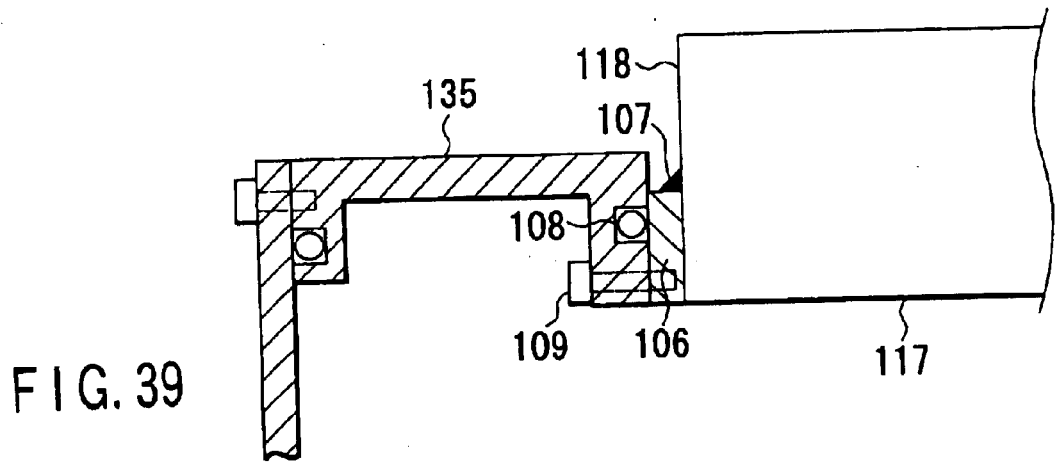
FIG. 39 is an enlarged view of the portion encircled by the dashed line in FIG. 38.

In contrast to this, according to this embodiment, as shown in FIG. 39, an annular flange 106 is welded (reference numeral 107) to the side wall 118 of the cryostat 116, and the joint plate 135 of the sealed vessel 133 is fixed to the flange 106 with a bolt 109 via the O-ring 108. The flange 106 can be formed with high precision by shaving or the like. Since the flange 106 can be brought into contact with the O-ring 108 properly, the sealing performance of the O-ring 108 can be maximized. In addition, since the side wall 118 of the cryostat 116 is connected to the flange 106 by welding, the connection portion therebetween can be kept airtight. This makes it possible to maintain a substantially vacuum state in the sealed vessel 133 and properly prevent air-born propagation of vibrations and noise.

(Eighth Embodiment)

FIG. 40A shows an outer appearance of the sealed vessel of a gradient field coil according to the eighth embodiment. To take a measure against noise, the gradient field coil is housed in a sealed vessel 201 held in a substantially vacuum state. In this arrangement, therefore, in the prior art, to check the position of the gradient field coil, the sealed vessel 201 must be partly disassembled.

In contrast to this, according to this embodiment, a pair of left and right circular holes are formed in each side wall 207 of the sealed vessel 201. Windows 202 made of a glass or fiber reinforced plastic material that transmits visible light are fitted in the holes. An operator can easily make a visual check on the position of the gradient field coil in the sealed vessel 201 from the outside via the windows 202.

As shown in FIG. 40B, a gradient field coil 204 has scale marks 206 each indicating the position of the coil. The scale mark 206 can be visually checked via the window 202. The operator can objectively grasp the position of the gradient field coil 204 relative to a static field magnet 205 while seeing the scale mark 206.

As shown in FIG. 40C, leg portions 203 of the sealed vessel 201 have bases 212. Supports 213 supporting the gradient field coil 204 are fitted in holes vertically formed in the bases 212 to be vertically movable. Threads are formed on the outer surfaces of the supports 213. Screws 215 are threadably engaged with the threads at crossing axes. When a dial 214 on the distal end portion of each screw 215 is rotated, the support 213 vertically moves, together with the gradient field coil 204, in the sealed vessel 201. This makes it possible to adjust the position of the gradient field coil 204 relative to the static field magnet 205.

In this manner, the gradient field coil can be visually checked from the outside without disassembling the vessel, and position adjustment can be performed. This can reduce the chances of degrading airtightness. Therefore, the vessel can be kept airtight, and a sound insulating effect for air-borne propagation of vibrations and noise can be enhanced.

Figure 40D:
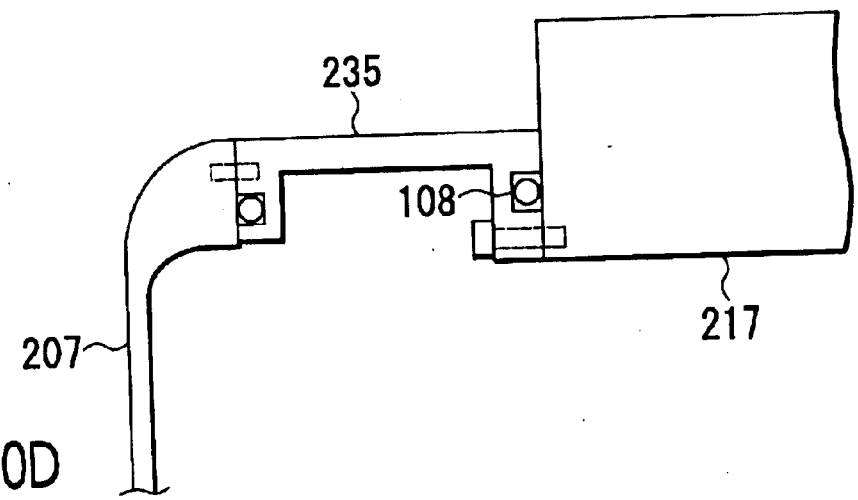
FIG. 40D is a magnified view of a part of the eighth embodiment.

Further, as shown in FIG. 40D, the side walls 207 of the sealed vessel 201 are jointed to the cryostat 217 with the joint plates 235. Corners where the joint plates 235 are jointed to the side walls 207 are rounded off. Corners where the joint plates 235 are jointed to the liner of the vessel 201 are rounded off. Therefore, the vessel 201 can have a sufficient strength to atmospheric pressure.

(Ninth Embodiment)

Figure 41:
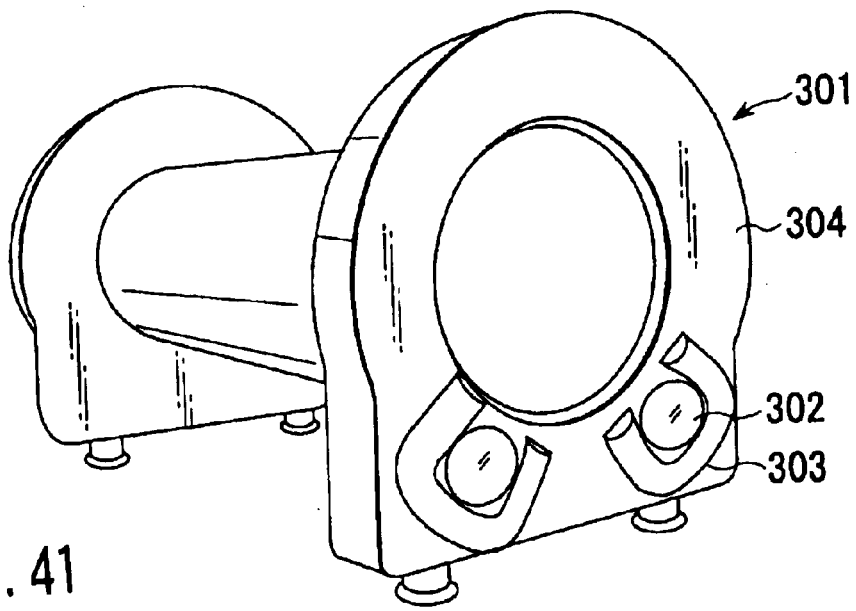
FIG. 41 is a perspective view of a sealed vessel according to the ninth embodiment.

FIG. 41 shows an outer appearance of the sealed vessel of a gradient field coil according to the ninth embodiment. The gradient field coil is housed in a sealed vessel 301. To prevent air-born propagation of noise originating from the gradient field coil 102, the air in the sealed vessel 301 is exhausted by a vacuum pump to keep a vacuum or a similar state in the sealed vessel 301. For this reason, the sealed vessel 133 receives an atmospheric pressure. The strength of the sealed vessel 133 is therefore important. In the eighth embodiment described above, the windows 302 are attached to the side walls 207 of the sealed vessel 201. In the ninth embodiment, to increase the strength of the portion of each window 302, a portion of a side wall 304 which surrounds the window 302 is formed into a convex portion 303 having a round shape like a half pipe, thereby reinforcing the portion around the window 302.

With this reinforcement, the degree of vacuum (internal pressure) in the sealed vessel 301 can be sufficiently increased, and hence a sound insulating effect for air-borne propagation of vibrations and noise can be enhanced.

Figure 42:
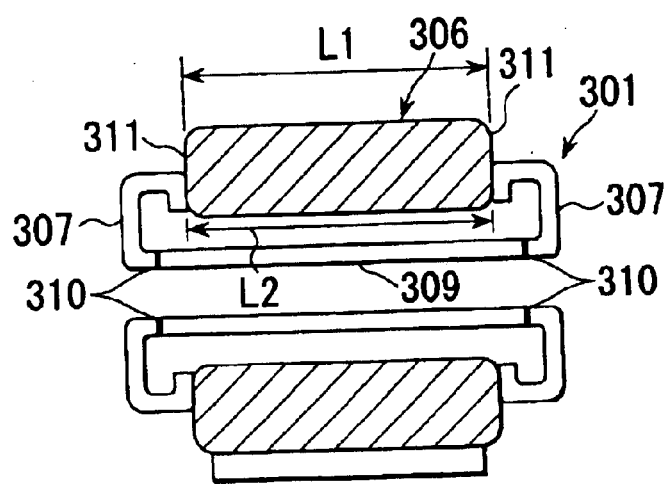
FIG. 42 is a cross-sectional view showing how the sealed vessel in FIG. 41 is joined to a static field magnet vessel.

As shown in FIG. 42, the sealed vessel 301 has a liner 309 having a substantially cylindrical shape and forming the inner wall of the vessel and a vacuum cover 307. The back surface of the sealed vessel 301 is closed with the inner wall of a cryostat 306 for setting a static field magnet (superconductive coil in this case) in a cryogenic environment. A side wall 311 of the cryostat 306 is joined to the vacuum cover 307.

In an actual manufacturing process, a length L1 of the cryostat 306 may not match with a length L2 of an opening portion of the sealed vessel 301 in which the cryostat 306 is to be fitted. In this case, the airtightness of the sealed vessel 301 deteriorates, and vacuum leakage occurs. To solve this problem, in this embodiment, an annular packing 310 is clamped between the liner 309 of the sealed vessel 301 and the vacuum cover 307. If, therefore, the length L1 of the cryostat 306 does not match with the length L2 of the opening portion of the sealed vessel 301 in which the cryostat 306 is to be fitted, the liner 309 of the sealed vessel 301 is joined to the vacuum cover 307 via the packing 310 having a proper width. This makes it possible to easily match the length L1 of the cryostat 306 with the length L2 of the opening portion of the sealed vessel 301 in which the cryostat 306 is to be fitted.

The packing 310 improves the joining precision between the sealed vessel 301 and the cryostat 306 to improve the airtightness of the sealed vessel 301. This enhances the sound insulating effect for air-borne propagation of vibrations and noise.

(10th Embodiment)

The gradient field coil is not only a source of vibrations and noise in a magnetic gantry. For example, a heat exchanger using a superconductive coil as a static field magnet produces such vibrations and noise. FIGS. 43 and 44 are sectional views of a heat exchanger according to this embodiment. A superconductive coil 401 is housed in a cryostat 404. The cryostat 404 is configured to surround a liquid nitrogen bath housing the superconductive coil 401 together with liquid nitrogen with a plurality of heat radiation shields 402, 405, and 406.

This cryostat 404 has a heat exchanger 407 for absorbing heat from the shield 402 and dissipating it outside. The heat exchanger 407 is comprised of a cylinder 408 having a bottom portion in contact with the shield 402, a cold head 411 which is cooled by helium gas He and is used to cover the cylinder 408, a displacer 409 which reciprocates like a piston between the bottom portion and the cold head 411 inside the cylinder 408 with the pressure of helium gas He, and a vacuum bellows 410.

When the displacer 409 is located on the bottom portion, the displacer 409 absorbs heat from the shield 402. When the displacer 409 is located at the top portion, the displacer 409 transfers heat to the cold head 411. By repeating this operation, heat can be dissipated from the shield 402.

As described above, since the displacer 409 reciprocates like a piston inside the cylinder 408, vibrations are produced. The vibrations mechanically propagate to the shields 402, 405, and 406. This produces noise.

To absorb the vibrations, a dynamic vibration absorber 414 is mounted on the cold head 411. An elastic member, e.g., a spring 412, of the dynamic vibration absorber 414 is connected onto the cold head 411 such that the expanding direction of the spring 412 is substantially parallel to the direction in which the displacer 409 reciprocates like a piston. A weight 413 is connected to the spring 412. As the displacer 409 reciprocates like a piston, the weight 413 moves vertically. With this operation, the vibrations of the cold head 411, originating from the displacer 409, are absorbed by the dynamic vibration absorber 414. As a consequence, noise is reduced.

The displacer 409 moves like a piston at the frequency of commercial power. The elasticity of the spring 412 and the mass of the weight 413 are set such that the dynamic vibration absorber 414 resonates with vibrations originating from the displacer 409 moving like a piston at this frequency. This makes it possible to effective absorb the vibrations.

Vibrations can also be reduced by the following arrangement. As shown in FIG. 45, two cylinders 408-1 and 408-2, two displacers 409-1 and 409-2, and two cold heads 411-1 and 411-2, i.e., two heat exchangers, are prepared, and the two heat exchangers are arranged such that the piston motion axes oppose each other, and the displacers 409-1 and 409-2 are made to move like a piston in opposite phases.

(11th Embodiment)

FIG. 46 is a longitudinal sectional view of the gantry of a magnetic resonance imaging apparatus according to the 11th embodiment. A gradient field coil 502 includes $\underline{x}$, $\underline{y}$, and $\underline{z}$ coils as its windings. These $\underline{x}$, $\underline{y}$, and $\underline{z}$ coils are housed in a cylindrical bobbin. This substantially cylindrical gradient field coil 502 is supported on a heavy, concrete gantry base 525 installed on the floor. The gradient field coil 502 is housed in a sealed vessel 533. The sealed vessel 533 includes a liner 531 having a substantially cylindrical shape and forming the inner wall of the vessel and a vacuum cover 532. The back surface of the sealed vessel 533 is closed with an inner wall 517 of a cryostat 516 for setting a static field magnet (superconductive coil in this case) in a cryogenic environment. A side wall 518 of the cryostat 516 is joined to the vacuum cover 532 with a joint plate 535. The sealed vessel 533 is coupled to the gantry base 525 with a vacuum bellows 534 to keep the airtightness of the sealed vessel 533.

The vibrations of the gradient field coil 502 mechanically propagate to the sealed vessel 533. The frequency of the vibrations of the gradient field coil 502 is equal to the alternating frequency of a gradient field in a pulse sequence. weights 541, 542, 543, and 544 are discretely mounted on the liner 531 and vacuum cover 532 such that the liner 531 and vacuum cover 532 of the sealed vessel 533 do not resonate with the vibrations of the gradient field coil 502, i.e., the natural frequencies of the liner 531 and vacuum cover 532 differ from the vibration frequency of the gradient field coil 502.

The weight 544 mounted on the vacuum cover 532 is, for example, a nonmagnetic metal piece. The annular gel-like substances 541, 542, and 543 are mounted along the inner wall of the liner 531. The substances 541, 542, and 543 are mounted outside an RF coil 503 to prevent a decrease in the Q value of the RF coil 503.

According to this structure, the liner 531 and vacuum cover 532 of the sealed vessel 533 do not resonate with the vibrations of the gradient field coil 502. Hence, noise is reduced.

Instead of or in addition to mounting the weights on the liner 531 and vacuum cover 532, the thicknesses of the liner 531 and vacuum cover 532 may be partly decreased. It is an important point of this embodiment that the masses of the liner 531 and vacuum cover 532 are partly increased/decreased to shift their natural frequencies. In addition to shifting the natural frequencies, beams or struts may be used to reinforce the structure.

(12th Embodiment)

FIG. 47 is a longitudinal sectional view of the gantry of a magnetic resonance imaging apparatus according to the 12th embodiment. A gradient field coil 602 includes $\underline{x}$, $\underline{y}$, and $\underline{z}$ coils as its windings. These $\underline{x}$, $\underline{y}$, and $\underline{z}$ coils are housed in a cylindrical bobbin. This substantially cylindrical gradient field coil 602 is supported on a heavy, concrete gantry base 625 installed on the floor. The gradient field coil 602 is housed in a sealed vessel 633. The sealed vessel 633 includes a liner 631 having a substantially cylindrical shape, a vacuum cover 532 having a substantially annular, plate-like shape, and a back casing 634 having a substantially cylindrical shape. A cryostat 616 for setting a static field magnet (superconductive coil in this case) in a cryogenic environment is placed outside the back casing 634 of the sealed vessel 633. An RF coil 635 is mounted on the inner surface of the liner 631. A high-frequency magnetic field is applied to an object via the RF coil 635, and an MR signal is received from the object.

It is an important point of this embodiment that the sealed vessel 633 housing the gradient field coil 602 does not use the inner wall of the cryostat 616. In other words, the sealed vessel 633 and cryostat 616 are formed as completely discrete components. If the inner wall of the cryostat 616 is used for the sealed vessel 633 housing the gradient field coil 602, vacuum leakage tends to occur at the joint portion due to poor surface precision, dimensional errors, and the like of the cryostat 616. In this embodiment, however, the cryostat 616 is not joined to the sealed vessel 633. That is, the sealed vessel 633 is manufactured singly. Therefore, high airtightness can be attained regardless of poor surface precision, dimensional errors, and the like of the cryostat 616.

(13th Embodiment)

The 13th embodiment is configured to prevent type B waves and induced electrons from being produced when metal parts in the gantry rub against each other, and can be applied to fastening of all metal parts constituting the gantry of a magnetic resonance apparatus which physically vibrates or in which vibrations propagate.

The gantry is comprised of many metal parts, which are fastened to each other by mainly using metal screws. If, for example, as shown in FIG. 48A, when a copper tuner plate 724 is to be mounted on a metal gantry frame 724, a metal screw 723 and metal insert 722 are generally used in the prior art. Many capacitors are arranged in the gantry. When these capacitors are to be mounted on a tuner plate and the connector of an RF coil tuner is to be fastened to the tuner plate, many metal screws are used. As described above, in the gantry, when parts are to be fixed, metal screws are used at most portions. As shown in FIG. 48B, when these metal screws rub against the metal parts or metal parts rub against each other due to the above intense vibrations, so-called type B waves are produced. Such type B waves are picked up by the RF coil, and image artifacts may be produced. This has hardly posed a problem until recently. Recently, however, as higher voltages have been used to attain increases in the speed and strength of a gradient field, type B waves tend to increase in intensity. At present, image artifacts due to increased type B wave noise have become too large to be neglected. In addition to type B waves, electrons induced by contact between, for example, a connector and a tuner plate and vibrations directly enter a signal line to produce image artifacts, posing a problem.

It is an object of this embodiment to prevent the occurrence of type B waves and inducted electrons that cause noise.

As is known, a gantry is a magnetic apparatus mainly constituted by a static field magnet, gradient field coil, and RF coil, and includes many metal parts. These metal parts are mounted on many portions. These mounting portions can be roughly classified into two types. As shown in FIGS. 49 and 50, mounting portions of one type are portions where parts are physically fixed and must be electrically connected to each other, represented by a portion where copper plates constituting an RF coil are attached to each other, a portion where the RF coil copper plates 709 and 710 and a capacitor 711 are attached to each other, a portion where the RF coil copper plate 710 and a lead copper plate 703 are attached to each other, a portion where the lead copper plate 703 and an RF coil tuner copper plate 704 are attached to each other, a portion where the RF coil tuner copper plate 704 and a connector 706 are attached to each other, and a portion where the RF coil tuner copper plate 704 and a capacitor 715 are attached to each other. Mount portions of the other type are portions where it is a main object to physically fix parts to each other, but they need not be electrically connected to each other.

It is most preferable that parts be mounted on the former portions by using solder 705. In this case, since no parts rub against to each other, neither type B wave nor induced electrons are produced. However, solder cannot be used at some portions because of weak fastening force. Screws are used on such portions.

Figure 51:
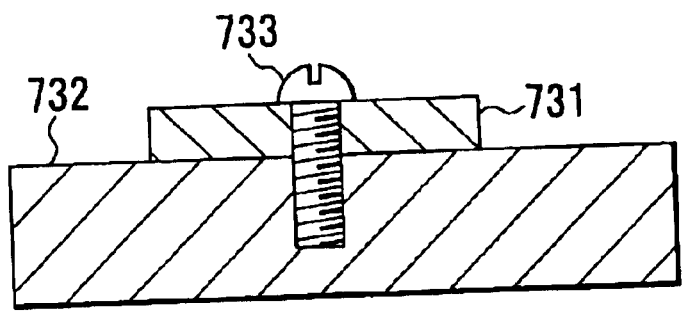
FIG. 51 is a view showing another example of how metal parts are connected to each other in the 13th embodiment.

FIG. 51 shows an example of how metal parts 731 and 732 are attached to each other by using a resin screw 733. In the prior art, since a metal screw is used, and the metal screw rubs against the metal parts 731 and 732, type B waves and induced electrons are inevitably produced. In this embodiment, however, the resin screw 733 is used, and hence generation of such waves and electrons can be prevented.

Figure 52:
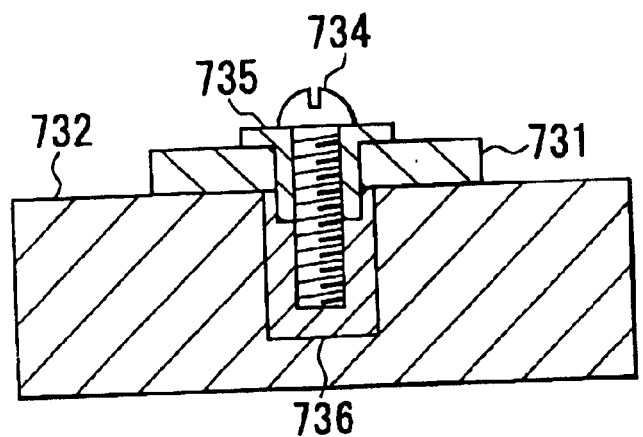
FIG. 52 is a view showing an example of how metal parts are insulated/connected from/to each other in the 13th embodiment.

FIG. 52 shows another example of how the metal parts 731 and 732 are attached to each other by using a metal screw 734. A substantially cylindrical resin spacer 735 is used to prevent direct contact between the metal screw 734 and metal part 731. In addition, a resin tap 736 is used to prevent contact between the metal screw 734 and the metal part 732. In this case, although the metal screw 734 is used, type B waves and induced electrons can be prevented by insulating the metal screw 734 from the metal parts 731 and 732 with the resin members 735 and 736.

Obviously, either of the methods shown in FIGS. 51 and 52 or a combination thereof can be used. It is expected that type B waves and inducted electrons will be suppressed by applying the mounting methods shown in FIGS. 51 and 52 to some portions in the gantry instead of all the corresponding portions.

Figure 53:
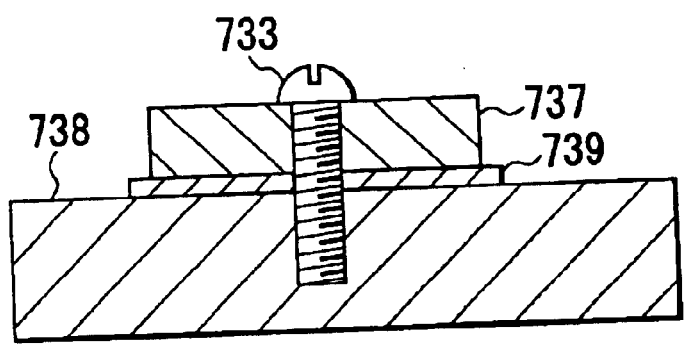
FIG. 53 is a view showing another example of how metal parts are insulated/connected from/to each other the 13th embodiment.

At the portions of the latter type, i.e., the portions where it is the main object to physically fix parts to each other, but there is no need to electrically connected them, metal parts 737 and 738 are attached to each other with the resin screw 733 as shown in, for example, FIG. 53. In this case, inserting an insulating sheet 739 between the metal parts 737 and 738 can prevent type B waves and inducted electrons generated due to friction between the metal parts 737 and 738 as well as type B waves and inducted electrons generated due to friction between the metal screw and the metal parts as in the prior art.

Figure 54:
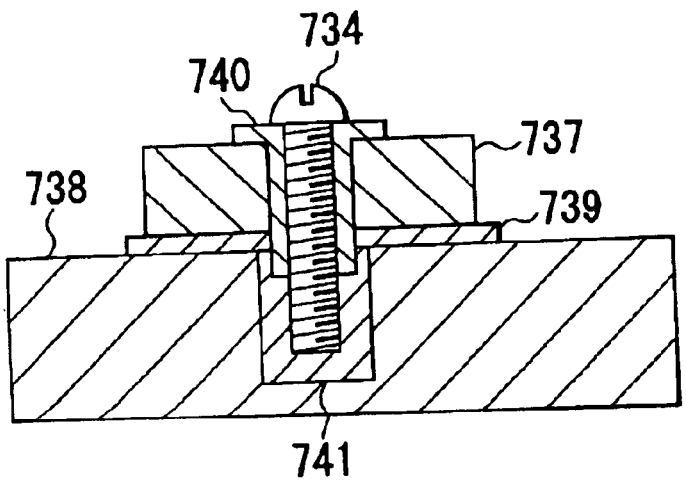
FIG. 54 is a view showing still another example of how metal parts are insulated/connected from/to each other the 13th embodiment.

FIG. 54 shows a case wherein the metal parts 737 and 738 are attached to each other by using the metal screw 734. A substantially cylindrical resin spacer 740 is used to prevent contact between the metal screw 734 and the metal part 738. In addition, a resin tap 741 is used to prevent contact between the metal screw 734 and the metal part 738. In this case, although the metal screw 734 is used, the type B waves and inducted electrons can be prevented by insulating the metal screw 734 from the metal parts 737 and 738 with the resin members 740 and 741.

Obviously, either of the methods shown in FIGS. 53 and 54 or a combination thereof can be used. It is expected that the type B waves and inducted electrons will be suppressed by applying the mounting methods shown in FIGS. 53 and 54 to some portions in the gantry instead of all the corresponding portions.

In addition, the type B waves and inducted electrons generated due to friction between metal screws and metal parts as in the prior art can be prevented by applying the mounting method shown in FIG. 53 or 54 to portions where metal parts are attached to resin parts such as a coil bobbin as well as portions where metal parts are attached to each other.

(14th Embodiment)

The 14th embodiment is related to an improvement in an RF shield placed around an RF coil. The RF shield is typically formed by a copper cylinder to magnetically isolate the RF coil from the outside and shield the RF coil against external electromagnetic noise. An eddy current is produced in this copper cylinder due to high-speed switching of a gradient field, distorting the gradient field. To decrease the time constant of this eddy current, many slits are formed in the copper cylinder.

In addition, capacitors are connected between copper plates across the slits to transmit a magnetic field having a relatively low frequency (up to about 100 kHz), e.g., a gradient field, and block a magnetic field having a high frequency of several MHz to several ten MHz, e.g., excitation pulses, i.e., increase a low-frequency impedance and decrease a high-frequency impedance. As another conventional RF shield, an RF shield having capacitances formed on its upper and lower surfaces is also available, which is formed by sticking a plurality of copper plates on the upper and lower surfaces of a dielectric substrate with gaps (slits).

A high-speed imaging method such as echo planar imaging (EPI) is required to image, for example, the heart. A very high response speed of a gradient field is indispensable for this operation. For this reason, many slits must be formed in very small increments (at very small intervals). If, however, many slits are formed, the capacitance decreases with a reduction in the area of each copper plate. This makes high-frequency short circuits in the respective slits imperfect. As a consequence, the shield function is made imperfect.

This embodiment is configured to achieve both an increase in the number of slits and prevention of a decrease in capacitance.

Figure 55:
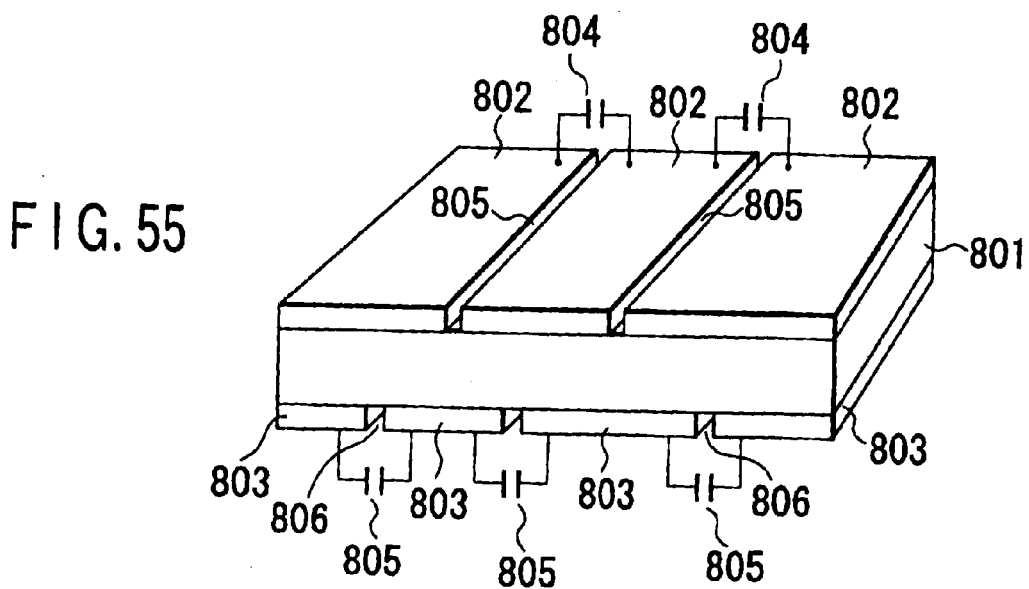
FIG. 55 is a perspective view of an RF shield according to the 14th embodiment.

FIG. 55 is a partial perspective view of an RF shield according to this embodiment. A plurality of copper plates 802 are stuck on the upper surface of a dielectric substrate 801 with predetermined gaps (slits) 805. Likewise, a plurality of copper plates 803 are formed on the lower surface of the dielectric substrate 801 with predetermined gaps (slits) 806. A capacitance is formed between the copper plates 802 and 803 opposing through the dielectric substrate 801.

In addition, capacitors 804 are formed between the adjacent copper plates 802 on the upper surface of the dielectric substrate 801. Likewise, capacitors 805 are formed between the adjacent copper plates 803 on the lower surface of the dielectric substrate 801.

In this arrangement, the total capacitance of the capacitors 804 on the upper surface, the capacitors 805 on the lower surface, and the capacitance between the copper plates 802 on the upper surface and the copper plates 803 on the lower surface is ensured as a capacitance large enough to make high-frequency short circuits perfect.

(15th Embodiment)

Figure 56:
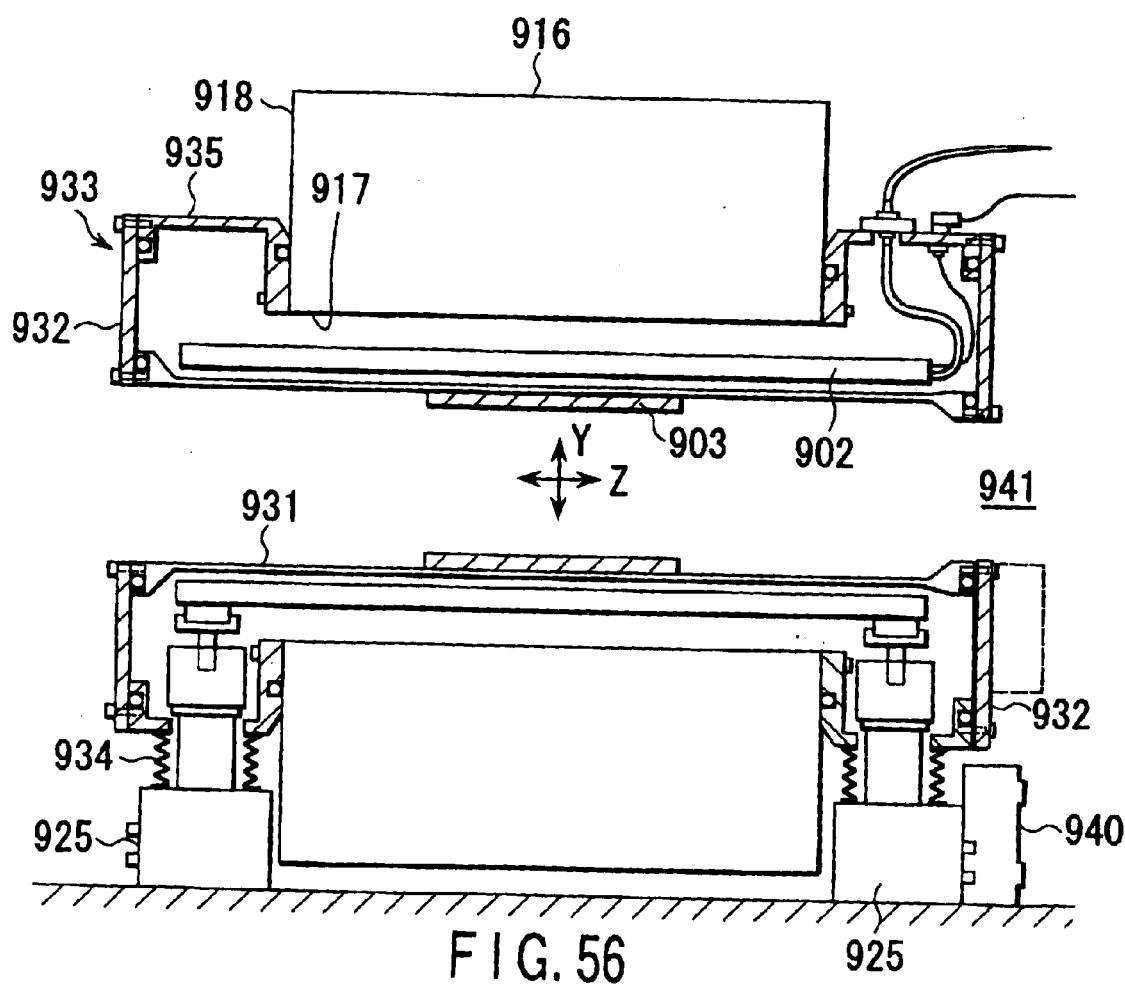
FIG. 56 is a longitudinal sectional view of the gantry of a magnetic resonance imaging apparatus according to the 15th embodiment.

FIG. 56 is a longitudinal sectional view of the gantry of a magnetic resonance imaging apparatus according to the 15th embodiment. A gradient field coil 902 includes x, y, and z coils as its windings. These x, y, and z coils are housed in a cylindrical bobbin. This substantially cylindrical gradient field coil 902 is supported on a heavy, concrete gantry base 925 installed on the floor. The gradient field coil 902 is housed in a sealed vessel 933. The sealed vessel 933 includes a liner 931 having a substantially cylindrical shape and forming the inner wall of the vessel and a vacuum cover 932. The back surface of the sealed vessel 933 is closed with an inner wall 917 of a cryostat 916 for setting a static field magnet (superconductive coil in this case) in a cryogenic environment. A side wall 918 of the cryostat 916 is joined to the vacuum cover 932 with a joint plate 935. The sealed vessel 933 is joined to the gantry base 925 with a vacuum bellows 934 to keep the sealed vessel 933 airtight.

An RF coil 903 is placed on the inner surface of the liner 931. A transmitter and receiver are connected to the RF coil 903. The transmitter supplies a high-frequency current pulse corresponding to a Larmor frequency to the RF coil 903 to excite nuclear magnetization in the object with a high-frequency magnetic field. The transmitter is typically comprised of an oscillating section, phase selecting section, frequency converting section, amplitude modulating section, and high-frequency power amplifying section. The receiver is comprised of a preamplifying section, intermediate frequency converting section, phase detecting section, low-frequency amplifying section, low-pass filter, and A/D converter to receive an MR signal from the object via the RF coil 903.

The transmitter and receiver are housed in an RF unit 940. The RF unit 940 is installed in a place near the RF coil 903 to achieve reduction in power loss and noise by shortening the cable required. In the prior art, as indicated by the dotted line in FIG. 41, the RF unit is mounted on the vacuum cover 932 near an edge portion of an opening portion 941. In this place, however, the leakage magnetic field from the gradient field coil 902 exhibits the highest strength. The RF unit 940 includes many conductive parts, and eddy currents are produced in these conductive parts due to the leakage magnetic field from the gradient field coil 902. As a consequence, the conductive parts vibrate due to the Lorents force. The vibrations propagate to the sealed vessel 933 to cause noise.

It is an object of this embodiment to reduce noise originating from the RF unit 940.

The RF unit 940 is not mounted on the vacuum cover 932 near the edge portion of the opening portion 941 but is installed in a place physically spaced apart from the sealed vessel 933, i.e., a place located outside the RF coil 903 at a position near a position directly below the opening portion 941 in the radial direction of the cylindrical gantry with reference to the central axis (Z-axis). More specifically, the RF unit 940 is installed on the heavy, concrete gantry base 925 or another dedicated base.

In this installation place, the RF unit 940 is affected less by the leakage magnetic field from the RF coil 903 than in the conventional installation place. For this reason, the vibrations of the conductive parts in the RF unit 940 are reduced. In addition, since the RF coil 903 is physically spaced apart from the sealed vessel 933 and is mounted on the heavy, concrete gantry base 925, fine vibrations of the RF coil 903 hardly propagate to the sealed vessel 933.

Noise originating from the RF unit 940 can therefore be reduced.

(16th Embodiment)

As described above, the gradient field is housed in the sealed vessel which is evacuated by the vacuum pump to prevent noise. As the degree of vacuum (pressure) in a sealed vessel increases (decreases), the noise insulating effect increases. To increase the degree of vacuum in the sealed vessel, the vacuum pump is continuously operated during scanning operation in the prior art. This continuous operation shortens the service life of the vacuum pump. If the vacuum pump with decreased capability is used, the degree of vacuum in the sealed vessel cannot be increased, resulting in a deterioration in noise insulating effect.

This embodiment is configured to keep a noise insulating effect as long as possible by reducing the load on the vacuum pump.

Figure 57:
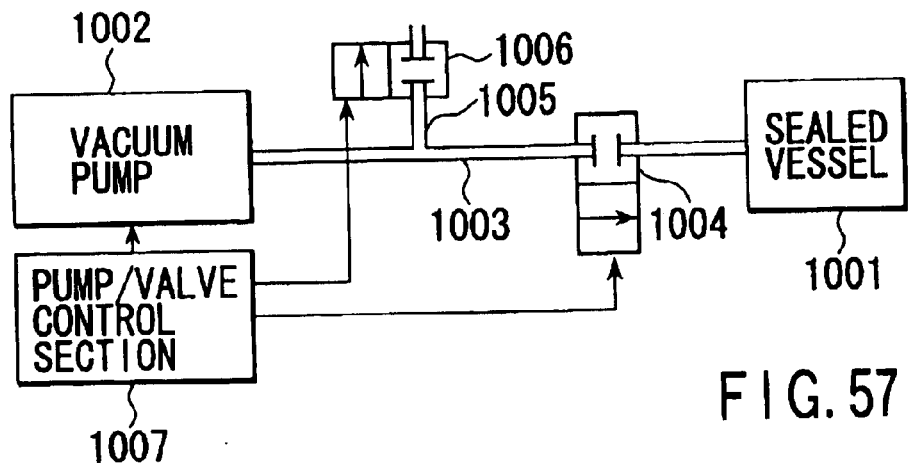
FIG. 57 is a system diagram of a vacuum pump for a sealed vessel according to the 16th embodiment.

FIG. 57 shows a vacuum pump and piping system according to this embodiment. A sealed vessel 1001 is connected to a vacuum pump 1002 via a main tube 1003. A solenoid valve 1004 is placed midway along the main tube 1003. A branch tube 1005 is coupled to the main tube 1003. The distal end of the branch tube 1005 is open to the atmosphere via a solenoid valve 1006.

Figure 58:
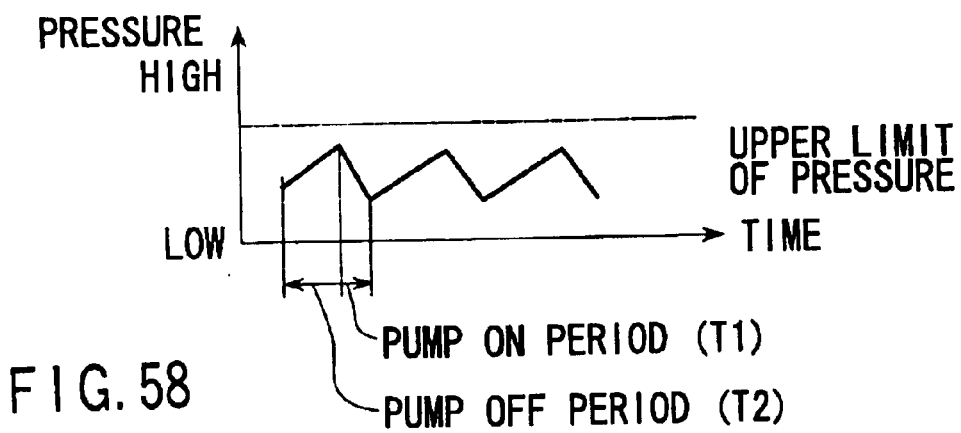
FIG. 58 is a graph showing changes in pressure in the sealed vessel in the 16th embodiment.

The vacuum pump 1002 is driven and the solenoid valves 1004 and 1006 are opened/closed under the control of a pump/valve control section 1020. The vacuum pump 1002 is alternately driven (ON) and stopped (OFF) under the control of the pump/valve control section 1020, as shown in FIG. 58. The duration of an ON period T1 and the duration of an OFF period T2 are set in advance such that the pressure in the sealed vessel 1001 does not exceed a predetermined upper limit. The duration of the ON period T1 and the duration of the OFF period T2 can be arbitrarily adjusted.

Intermittently driving the vacuum pump 1002 in this manner, instead of continuously driving it, can reduce the frequency of maintenance for oil, an oil filter, and the like as compared with a case wherein the vacuum pump 1002 is continuously driven.

Figure 59:
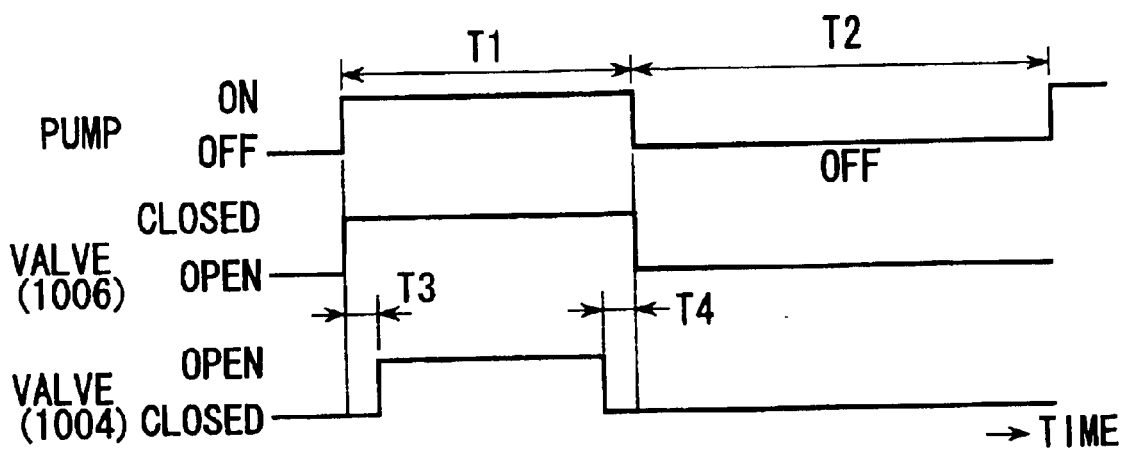
FIG. 59 is a timing chart of ON/OFF operation of the vacuum pump and the opening/closing of valves in the 16th embodiment.

As shown in FIG. 59, the opening/closing of the solenoid valves 1004 and 1006 is interlocked with the intermittent driving of the vacuum pump 1002 by the pump/valve control section 1020.

First of all, the solenoid valve 1006 of the branch tube 1005 is opened/closed in synchronism with the intermittent driving of the vacuum pump 1002. That is, the solenoid valve 1006 is closed in synchronism with switching of the vacuum pump 1002 from the OFF state to the ON state, and vice versa.

To reduce the load on the vacuum pump 1002, the solenoid valve 1004 of the main tube 1003 is opened with a delay of a time T3 with respect to the switching timing of the vacuum pump 1002 at which it is switched from the OFF state to the ON state, and is closed a time T4 earlier than the switching timing of the vacuum pump 1002 at which it is switched from the ON state to the OFF state. These time differences T3 and T4 are set to arbitrary times from several sec to several min.

Since the solenoid valve 1004 is opened with the delay of the time T3 from the OFF-to-ON switching timing of the vacuum pump 1002, lubrication in the vacuum pump 1002 can be completed in a relatively short period of time (pre-vacuum period), i.e., the time T3, after the vacuum pump 1002 is started. This is because the object to be evacuated is a small-volume portion extending from the inlet of the pump to the solenoid valve 1004. When the time T3 has elapsed after the start of the pump, the solenoid valve 1004 of the main tube 1003 is opened to start evacuating operation (main vacuum) for a target having a large total volume of the volume of the portion extending from the solenoid valve 1004 to the sealed vessel 1001 and the volume of the sealed vessel 1001. At this time, lubrication in the vacuum pump 1002 has already been completed, and hence the operation can smoothly shift to the main vacuum operation. The load on the vacuum pump 1002 can therefore be reduced.

When a predetermined time (T1 to T4) has elapsed after the vacuum pump 1002 is started, i.e., at a timing the time T4 earlier than the timing at which the vacuum pump 1002 is turned off, the solenoid valve 1004 of the main tube 1003 is closed. This indicates that the sealed vessel 1001 is isolated from the vacuum pump 1002 when the pressure in the sealed vessel 1001 sufficiently decreases. This makes it possible to prevent an abrupt increase in the pressure in the sealed vessel 1001 upon stopping of the vacuum pump 1002.

(17th Embodiment)

FIG. 60 shows the arrangement of the main part of a magnetic resonance imaging apparatus according to the 17th embodiment. A gantry 1101 incorporates a static field magnet 1102 for generating a static field H0, a gradient field coil 1103 for receiving a current from a gradient field power supply (G-amp) 1105, an RF coil 1104, and a plurality of shim coils 1116 which receive currents from a shim coil power supply (Shim-amp) 1107 and generate magnetic fields for correcting static field inhomogeneity.

To achieve noise insulation, the gradient field coil 1103 is housed in a sealed vessel 1115 in which a vacuum or similar state is maintained by a vacuum pump 1111. A plurality of vacuum sensors (vacuum gages) 1112 are discretely arranged in the sealed vessel 1115 to measure an internal pressure. The data representing the degree of vacuum measured by the vacuum sensor 1112 is stored in a storage section 1113. Driving state data from the vacuum pump 1111 is stored in the storage section 1113, together with this degree-of-vacuum data. The driving state data indicates the driving time of the vacuum pump 1111.

A maintenance information generating section 1114 generates maintenance information of the sealed vessel 1115 and vacuum pump 1111 on the basis of the degree-of-vacuum data and driving state data stored in the storage section 1113, as needed. The maintenance information generating section 1114 generates maintenance information that prompts maintenance of the vacuum pump 1111 and sealed vessel 1115 when it is determined from the degree-of-vacuum data that the degree of vacuum (pressure) in the sealed vessel 1115 does not decrease below a predetermined pressure corresponding to, for example, a noise level of 99 dB in the imaging area. The maintenance information generating section 1114 also generates maintenance information that prompts maintenance of the vacuum pump 1111 when the cumulative driving time calculated from the driving state data exceeds a predetermined value. Each maintenance information is, for example, a message that prompts maintenance of the sealed vessel 1115 or vacuum pump 1111, and is displayed on a display 1110.

A receiver 1108 acquires an MR signal (high-frequency signal) via the RF coil 1104, performs pre-processes such as detection and A/D conversion for the signal, and outputs the resultant signal to a processor 1109. The processor 1109 processes the acquired MR data to generate an image and spectrum. The image and spectrum are sent to the display 1110 to be displayed.

The processor 1109 has the function of correcting the phase of the MR data acquired by the receiver 1108 and performing frequency shift on the basis of degree-of-vacuum data as well as the main function of generating images and spectra. As the degree of vacuum varies, the strength H0 of the static field varies. As the strength H0 of the static field varies, for example, a resonance frequency f0 of a proton varies in the static field on which no gradient field is superimposed. The processor 1109 holds data representing the relationship between the degree of vacuum measured in advance and the resonance frequency f0, and specifies the resonance frequency (corrected resonance frequency) f0 corresponding to the degree-of-vacuum data by referring to the relationship data. In MRS (MR spectroscopy), the phase of the MR data acquired by the receiver 1108 is corrected and frequency shift is performed on the basis of this corrected resonance frequency f0. The processor 1109 then generates a spectrum on the basis of this corrected data. In practice, data is repeatedly acquired, and phase correction and frequency shift are performed for each data to generates a plurality of spectra. These spectra are then added together. In EPI (Echo Planar Imaging), an EPI image is generated on the basis of acquired data, and the EPI image is shifted in the phase encoding direction (the shifting of the EPI image largely generates in the phase-encoding direction, and generates in the read-out direction in a small). In practice, data is repeatedly acquired, and an EPI image is generated for each data. Each image is then shifted in the phase encoding direction, and the resultant EPI images are added/subtracted. In the case of a phase image as well, a phase shift amount is calculated on the basis of the corrected resonance frequency f0, and the phase image is corrected on the basis of the phase shift amount.

As described above, according to this embodiment, maintenance information can be generated, as needed. In addition, phase and frequency correction can be made in accordance with variations in degree of vacuum.

(18th Embodiment)

FIG. 61 shows the arrangement of the main part of a magnetic resonance imaging apparatus according to the 18th embodiment. A gantry 1201 incorporates a static field magnet 1202 for generating a static field H0, a gradient field coil 1203 for receiving a current from a gradient field power supply (G-amp) 1205, an RF coil 1204 connected to a transmitter/receiver (RF-amp) 1208, and a plurality of shim coils 1216 which receive currents from a shim coil power supply (Shim-amp) 1207 and generate magnetic fields for correcting static field inhomogeneity.

To achieve noise insulation, the gradient field coil 1203 is housed in a sealed vessel 1215 in which a vacuum or similar state is maintained by a vacuum pump 1211. A plurality of vacuum sensors (vacuum gages) 1212 are discretely arranged in the sealed vessel 1215 to measure an internal pressure. On the basis of the degree-of-vacuum data measured by the vacuum sensor 1212, a real-time manager 1210 outputs an instruction, e.g., an instruction to wait for the execution of a pulse sequence to a sequence controller 1209 for controlling the gradient field power supply 1205, transmitter/receiver 1208, and shim coil power supply 1207 in accordance with the pulse sequence. The real-time manager 1210 also controls the operation of the vacuum pump 1211 on the basis of the measured degree-of-vacuum data. Note that a system manager 1213 is used to control the overall system in accordance with an instruction input by an operator through a console 1214.

Real-time control of the real-time manager 1210 will be described first. The real-time manager 1210 executes the following functions.

(1) The vacuum pump 1211 is started before scanning operation. The real-time manager 1210 does not output a scan start command to the sequence controller 1209 until the degree of vacuum in the sealed vessel 1215 (pressure in the sealed vessel) decreases below a predetermined value. That is, the real-time manager 1210 outputs a scan start command to the sequence controller 1209 only when the degree of vacuum exceeds the predetermined value.

(2) In executing a pulse sequence sensitive to magnetic field variations, e.g., MRS or EPI, the real-time manager 1210 continuously drives the vacuum pump 1211 during scanning operation.

(3) When the degree of vacuum exceeds the predetermined value during scanning operation, the real-time manager 1210 outputs a command to stop the scanning operation to the sequence controller 1209.

(4) When the degree of vacuum decreases below the predetermined value, the real-time manager 1210 drives the vacuum pump 1211 before scanning operation, and does not output a scan start command to the sequence controller 1209 until the degree of vacuum reaches a predetermined value.

(5) The real-time manager 1210 selectively uses a driving pattern for the vacuum pump 1211 in accordance with imaging conditions (e.g., the type of pulse sequence, an average number, and dynamic imaging). In executing, for example,.a pulse sequence in the spin echo method or the like, which is not very sensitive to magnetic field variations, the real-time manager 1210 intermittently drives the vacuum pump 1211, as shown in FIG. 62A. For example, the real-time manager 1210 drives the vacuum pump 1211 for a period $\Delta T1$, and stops it for a period $\Delta t1$. The vacuum pump 1211 is alternately driven/stopped repeatedly in this manner. In executing a pulse sequence which is relatively sensitive to magnetic field variations, as shown in FIG. 62B, the real-time manager 1210 sets a driving period $\Delta T2$ and stop period $\Delta t2$ of the pump 1211 to be shorter than $\Delta T1$ and $\Delta t1$, thus reducing the width of magnetic field variations. In executing a pulse sequence which is very sensitive to magnetic field variations, e.g., MRS or EPI, the real-time manager 1210 continuously drives the vacuum pump 1211 as shown in FIG. 62C in the same manner as in (2). In addition, in executing a pulse sequence which is very sensitive to magnetic field variations, e.g., MRS or EPI, the real-time manager 1210 may stop the pump 1211 and set the atmospheric pressure in the sealed vessel instead of continuously driving the pump 1211. In this case, although a noise reducing effect cannot be expected, at least magnetic field variations can be eliminated. To properly reconstruct images even at the atmospheric pressure, the real-time manager 1210 holds image quality parameter (magnetic field inhomogeneity, center frequency, and phase shift) information corresponding to the atmospheric pressure in advance, and the transmitter/receiver 1208 adjusts the shim coil current, the center frequency and phase of a high-frequency current pulse in the transmitter/receiver 1208, and the reference frequency and phase of a reception system in accordance with these parameters.

(6) The real-time manager 1210 drives/stops the pump 1211 in accordance with the comparison result between the measured degree of vacuum and the predetermined value. More specifically, when the measured degree of vacuum exceeds an upper limit, the real-time manager 1210 drives the pump 1211. When the measured degree of vacuum is below a lower limit, the real-time manager 1210 stops the pump 1211. This makes it possible to suppress variations in degree of vacuum between the upper limit value and the lower limit value. The upper and lower limit values can be changed in accordance with imaging conditions as in the case of (5).

(7) If the degree of vacuum does not decrease below the predetermined value even after the pump 1211 is continuously driven, a warning is generated by sound or image display.

The real-time manager 1210 also has the function of performing the following corrections in accordance with the degree of vacuum. (1) Magnetic field inhomogeneity changes depending on the degree of vacuum. The relationship between the degree of vacuum and magnetic field inhomogeneity is measured and held in the real-time manager 1210 in advance. The real-time manager 1210 specifies magnetic field inhomogeneity in accordance with the degree of vacuum by referring to this relationship, and adjusts the shim coil current to be supplied to the shim coil power supply 1207 in accordance with the specified magnetic field inhomogeneity. This makes it possible to quickly correct magnetic field inhomogeneity. In practice, the relationship between the degree of vacuum and magnetic field inhomogeneity is discretely measured, and magnetic field inhomogeneity can be obtained by linear interpolation from the discrete value. (2) As the degree of vacuum varies, the strength of the static field varies. As a result, a resonance frequency B0 of a proton varies in the static field on which no gradient field is superimposed. The real-time manager 1210 adjusts the center frequency and phase of a high-frequency current pulse in the transmission system of the transmitter/receiver 1208 in accordance with the resonance frequency B0 corresponding to this degree of vacuum. In addition, the real-time manager 1210 adjusts the reference frequency and phase of the reception system.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging apparatus comprising:
   a static magnetic field generator for generating a static magnetic field in an imaging space;
   a gradient magnetic field generator for generating a gradient magnetic field in said imaging space,
   a partition wall for defining said imaging space,
   a seal forming a vacuum space around said gradient magnetic field generator in cooperation with said static magnetic field generator and said partition wall,
   a first antivibration member interposed between said static magnetic field generator and said gradient magnetic field generator for suppressing propagation of vibration; and
   a second antivibration member also providing sealing for holding a vacuum state in said vacuum space and located at at least one of regions including (a) that between said static magnetic field generator and said seal, and (b) that between said seal and said partition wall, for suppressing propagation of vibration.

2. A magnetic resonance imaging apparatus according to claim 1, characterized in that said first antivibration members are discretely arranged below said gradient coils.

3. A magnetic resonance imaging apparatus according to claim 1, characterized in that said first antivibration members are arranged below said gradient coil on front and rear sides.

4. A magnetic resonance imaging apparatus according to claim 1, characterized in that said sealed vessel includes a liner, an outer wall also serving as an inner wall of said static magnetic field magnet, and covers covering a gap between said liner and said outer wall.

5. A magnetic resonance imaging apparatus according to claim 4, characterized in that said second antivibration member is placed between said liner and said cover.

6. A magnetic resonance imaging apparatus according to claim 5, characterized in that second antivibration member has a substantially annular shape having a diameter substantially equal to an inner diameter of said cover or said liner.

7. A magnetic resonance imaging apparatus according to claim 1, characterized in that said second antivibration member has a substantially L-shaped cross-section.

8. A magnetic resonance imaging apparatus according to claim 1, characterized in that said cover is jointed to said static magnetic field magnet via third antivibration members.

9. A magnetic resonance imaging apparatus according to claim 8, characterized in that said third antivibration member is made of a rubber-based material.

10. A magnetic resonance imaging apparatus according to claim 1, characterized in that said cover is joined to said static magnetic field magnet with bolts, third antivibration members are inserted between said cover and said static magnetic field magnet, and fourth antivibration members are inserted between said cover and heads of the bolts.

11. A magnetic resonance imaging apparatus according to claim 1, characterized in that said third and fourth antivibration members are made of a rubber-based material.

12. A magnetic resonance imaging apparatus according to claim 1, characterized in that said first and second antivibration members are made of a rubber-based material.

* * * * *